(12) United States Patent
Zhou et al.

(10) Patent No.: US 12,588,403 B2
(45) Date of Patent: Mar. 24, 2026

(54) REDOX DOPING METHOD FOR HIGH-PERFORMANCE Sn PEROVSKITE SOLAR CELLS

(71) Applicants: The Hong Kong University of Science and Technology, Hong Kong (CN); Jilin University, Changchun City (CN)

(72) Inventors: Yuanyuan Zhou, Hong Kong (CN); Ning Wang, Changchun City (CN)

(73) Assignees: The Hong Kong University of Science and Technology, Hong Kong (CN); Jilin University, Changchun City (CN)

( * ) Notice: Subject to any disclaimer, the term of this patent is extended or adjusted under 35 U.S.C. 154(b) by 0 days.

(21) Appl. No.: 18/891,016

(22) Filed: Sep. 20, 2024

(65) Prior Publication Data

US 2025/0107423 A1     Mar. 27, 2025

Related U.S. Application Data

(60) Provisional application No. 63/585,224, filed on Sep. 26, 2023.

(51) Int. Cl.
*H10K 71/30*          (2023.01)
*C07F 19/00*          (2006.01)
(Continued)

(52) U.S. Cl.
CPC ........... *H10K 71/30* (2023.02); *C07F 19/005* (2013.01); *H10K 30/30* (2023.02); *H10K 30/40* (2023.02);
(Continued)

(58) Field of Classification Search
None
See application file for complete search history.

(56) References Cited

U.S. PATENT DOCUMENTS 9,896,462 B1     2/2018  Ma et al.
2020/0328077 A1*  10/2020  Bush ..................... B65G 53/16

FOREIGN PATENT DOCUMENTS

CN          107887466 A      4/2018
CN          112614947 B   *  4/2022   ............. H10K 71/15
(Continued)

OTHER PUBLICATIONS

Wang et al., J. Mater. Chem. C., 2021, 9, 12079-12085. (Year: 2021).*

(Continued)

*Primary Examiner* — Eli S Mekhlin
(74) *Attorney, Agent, or Firm* — S&F/WEHRW

(57)          ABSTRACT

Europium doped tin perovskites useful in the fabrication of optoelectronic devices exhibiting improved stability and high-power conversion efficiencies and perovskite precursor solutions used to prepare the europium doped tin perovskite, wherein the europium doped tin perovskite can be represented by Formula 1:

$$(A^+)(Sn^{2+})(X^-)_3 \cdot m[(Eu^{2+})(Y^-)_2] \qquad 1$$

wherein m is 0.001-0.05;
$X^-$ for each instance is independently $F^-$, $Cl^-$, $Br^-$, or $I^-$;
$Y^-$ for each instance is independently $F^-$, $Cl^-$, $Br^-$, or $I^-$; and
$A^+$ is $Cs^+$, $Rb^+$, $CH_3NH_3^+$, $CH_3CH_2NH_3^+$, $H(C{=}NH_2)NH_2^+$, $Me(C{=}NH_2)NH_2^+$, or a mixture thereof.

15 Claims, 52 Drawing Sheets

A

⌐Y⌐ Formamidine
◉ Europium
○ Tin
◈ Iodine

(51) Int. Cl.

| | | |
|---|---|---|
| *H10K 30/30* | (2023.01) | |
| *H10K 30/40* | (2023.01) | |
| *H10K 30/50* | (2023.01) | |
| *H10K 71/15* | (2023.01) | |
| *H10K 85/50* | (2023.01) | |

(52) U.S. Cl.

CPC ............. *H10K 30/50* (2023.02); *H10K 71/15* (2023.02); *H10K 85/50* (2023.02)

(56) References Cited

FOREIGN PATENT DOCUMENTS

| | | |
|---|---|---|
| CN | 116239305 A | 6/2023 |
| WO | WO-2022192711 A1 * | 9/2022 ............. H10K 85/50 |

OTHER PUBLICATIONS

Wan et al., Science Bulletin, 2020, S2095-9273 (20)30663-0, Journal Pre-proof. (Year: 2020).*

English language machine translation of CN-112614947-B. (Year: 2025).*

Xue Ma et al., Europium redox doping to suppress Sn-I defect pairs in Sn perovskite photovoltaics, Device 2, 100294, Jun. 21, 2024.

Sebastian F. Hoefler et al., Progress on lead-free metal halide perovskites for photovoltaic applications: a review, Monatsh Chem (2017) 148, pp. 795-826.

\* cited by examiner

A
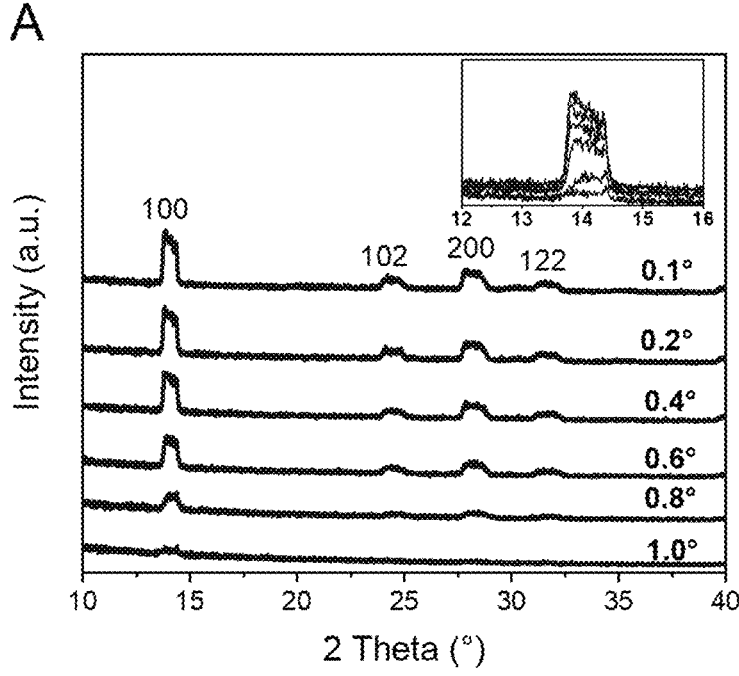
B
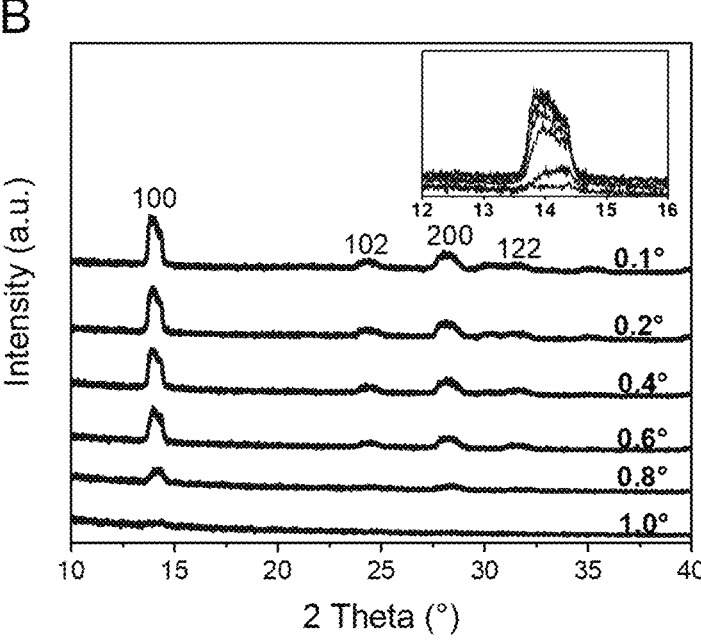
FIG. 1

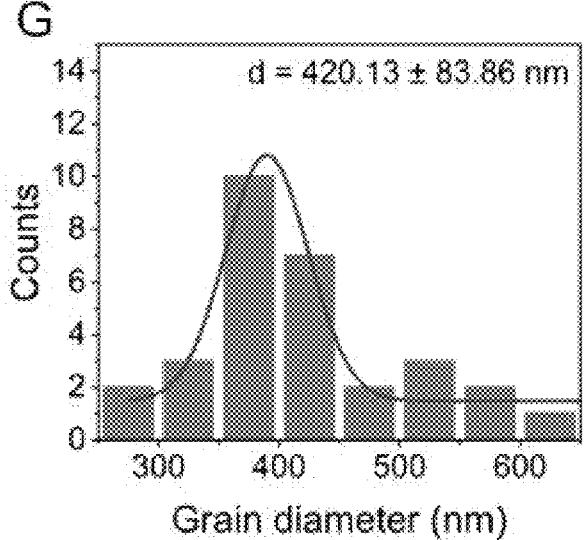
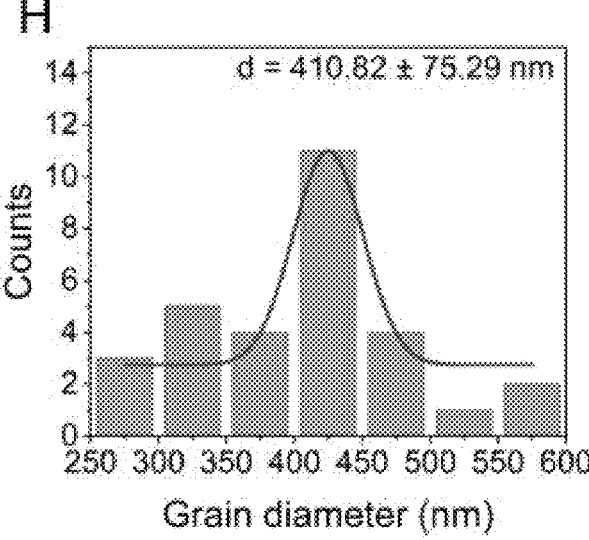
FIG. 1 (Continued)

A
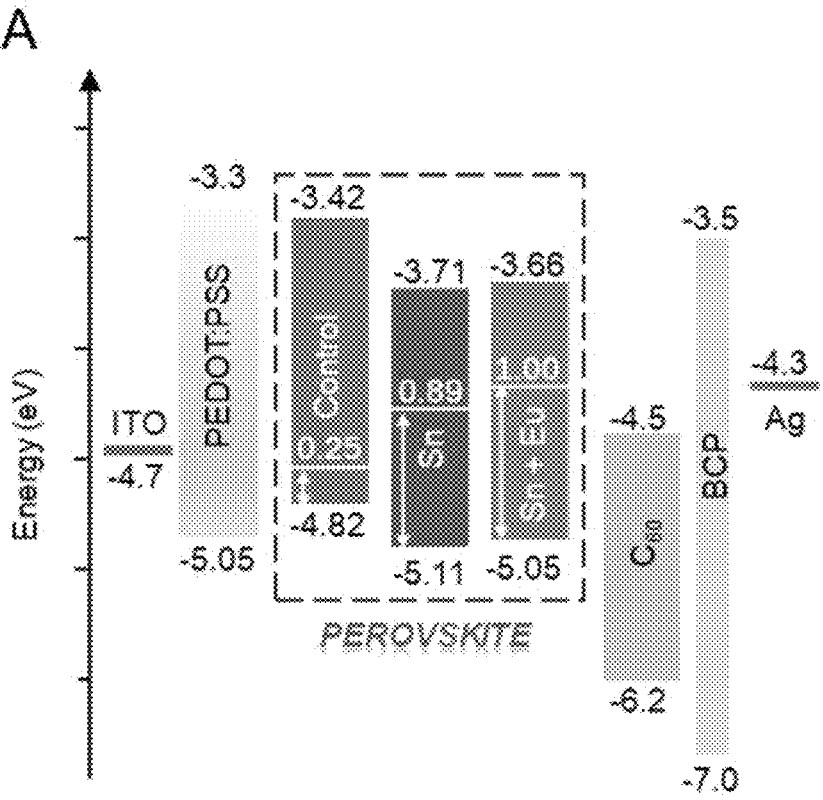
B
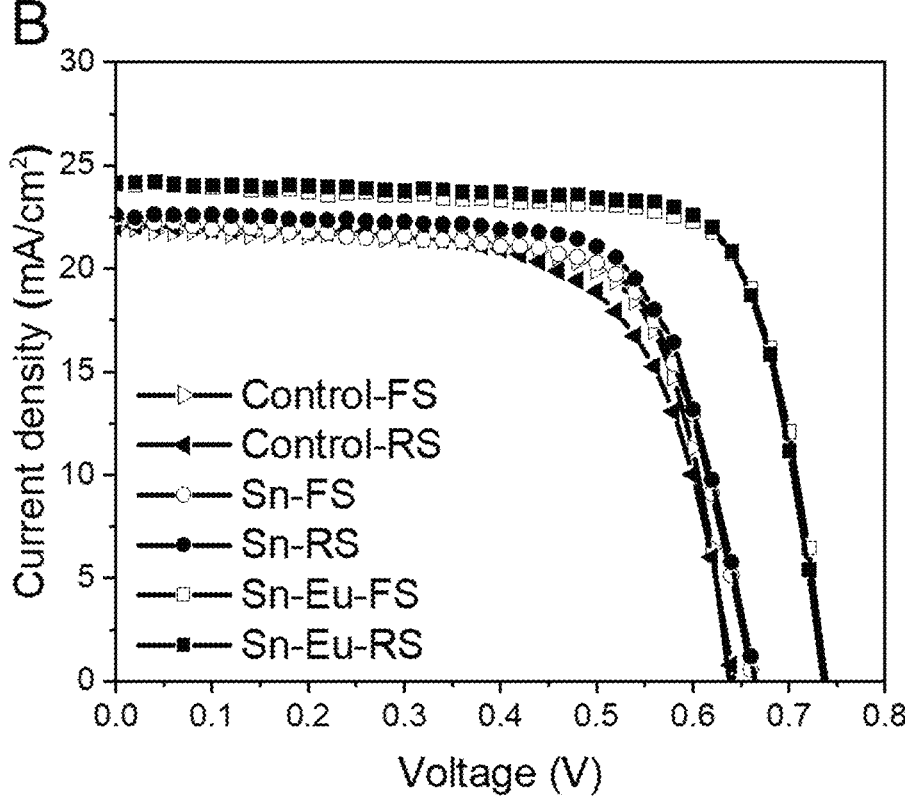
FIG. 5 (Continued)

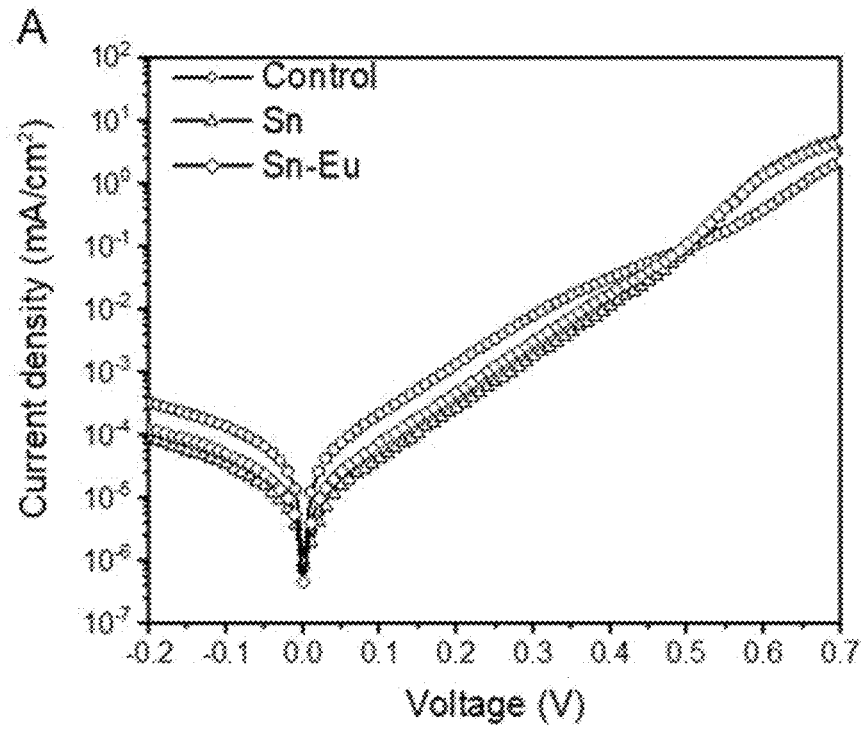
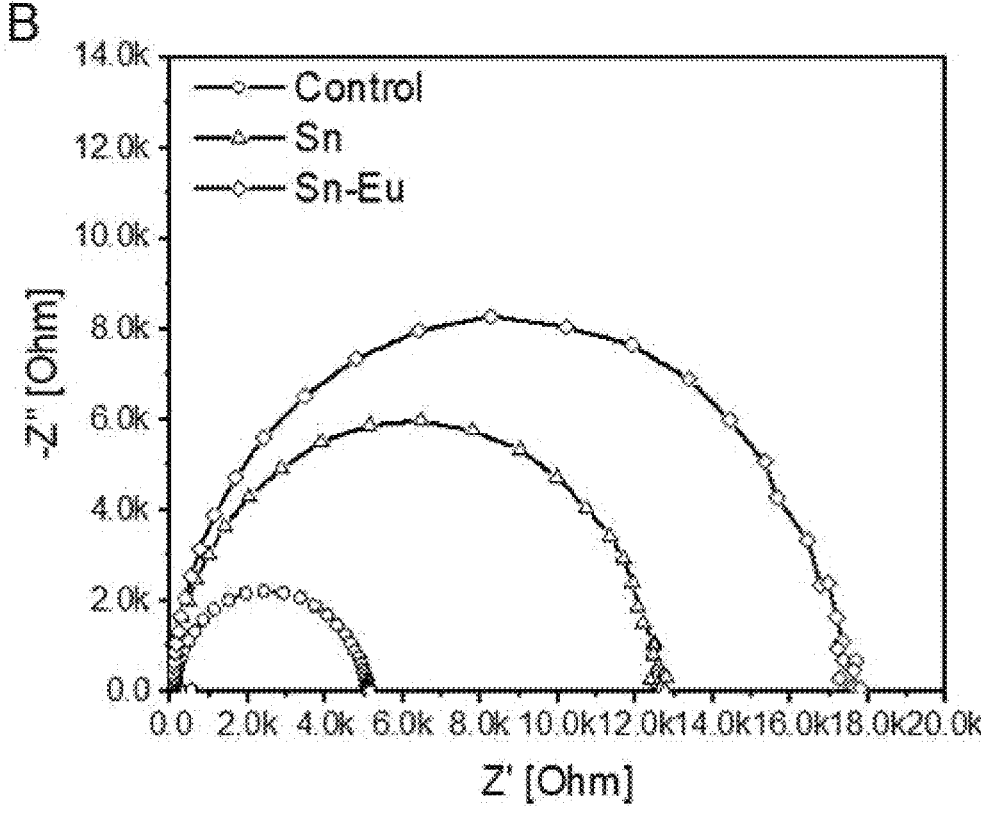
FIG. 6 c

D
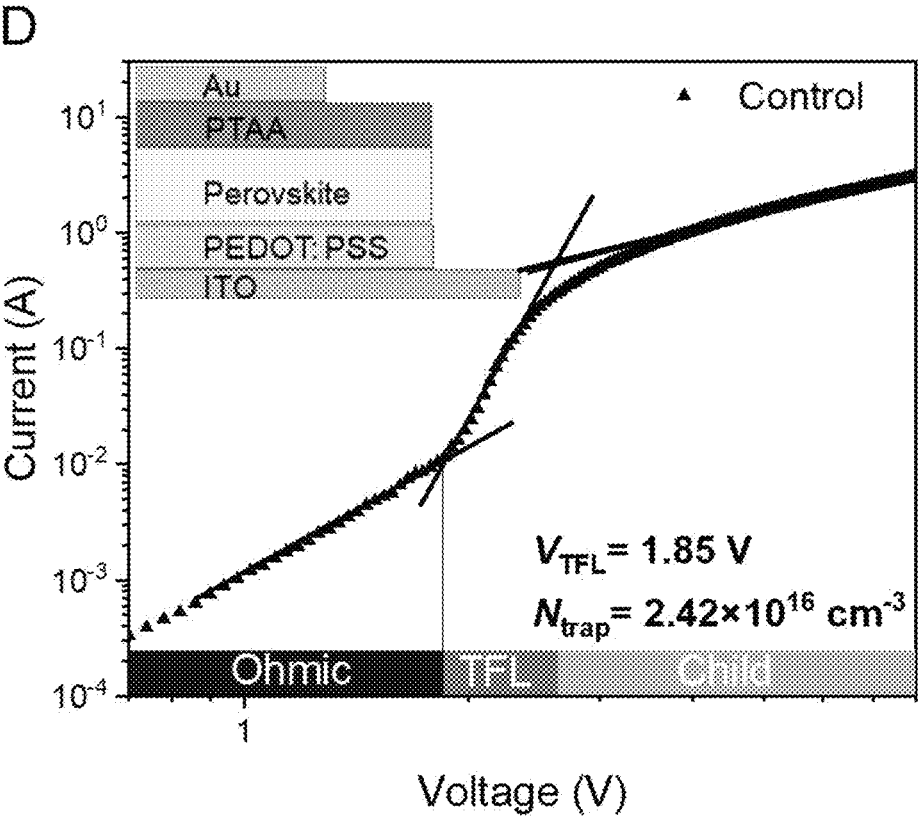
E
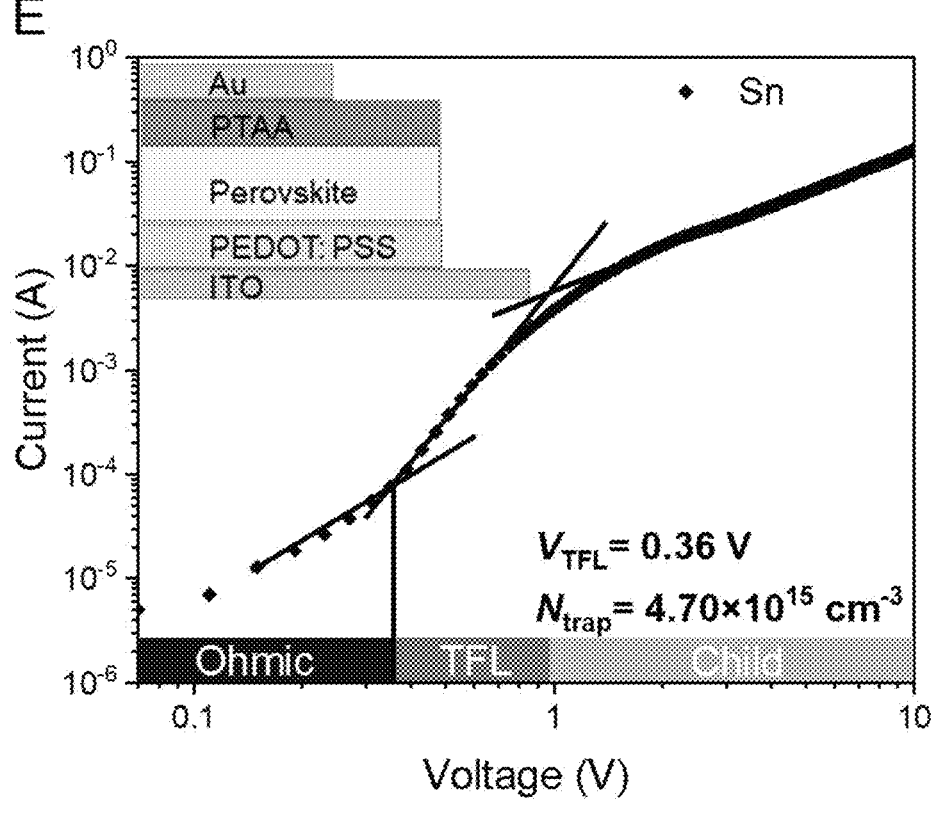
FIG. 6 (Continued)

C
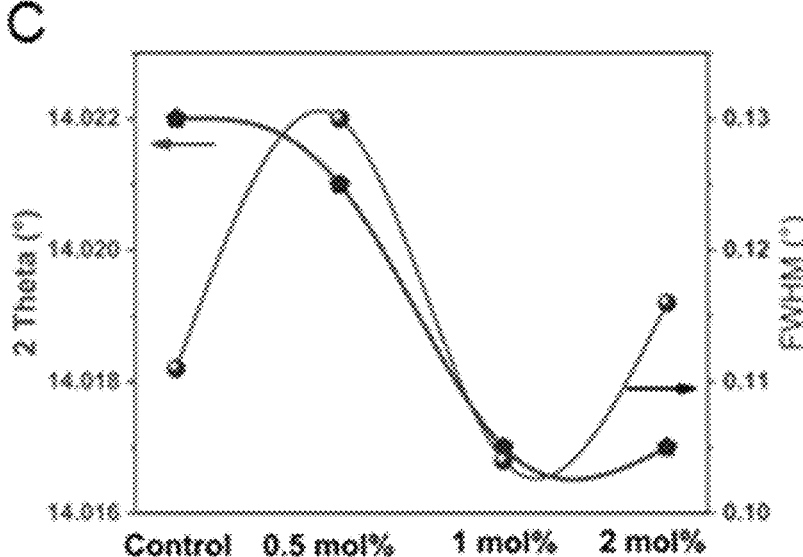
D
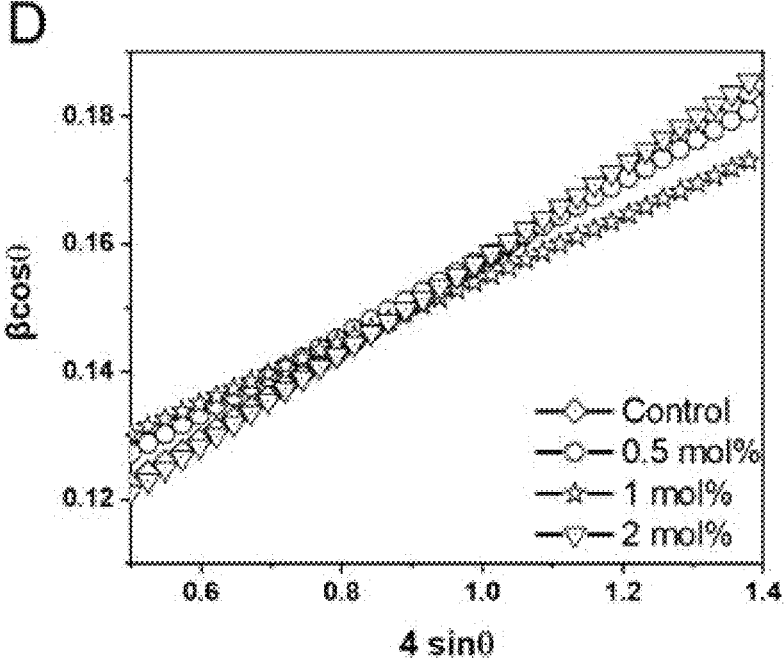
FIG. 7 (Continued)

E

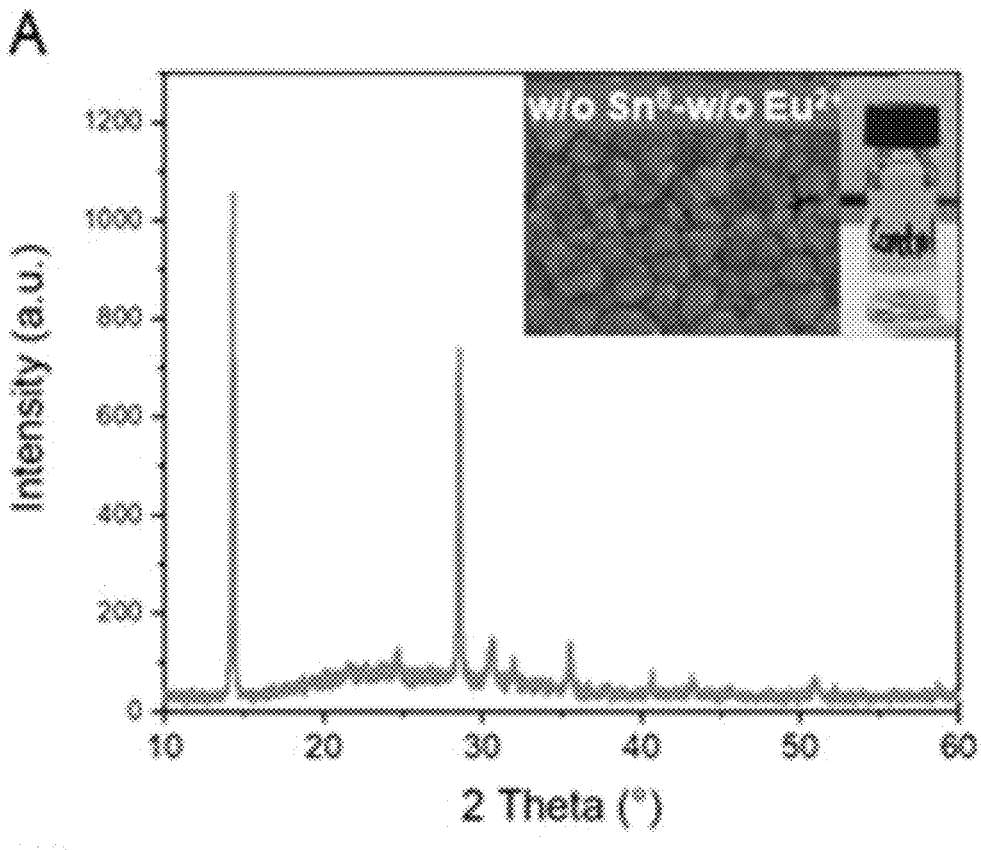
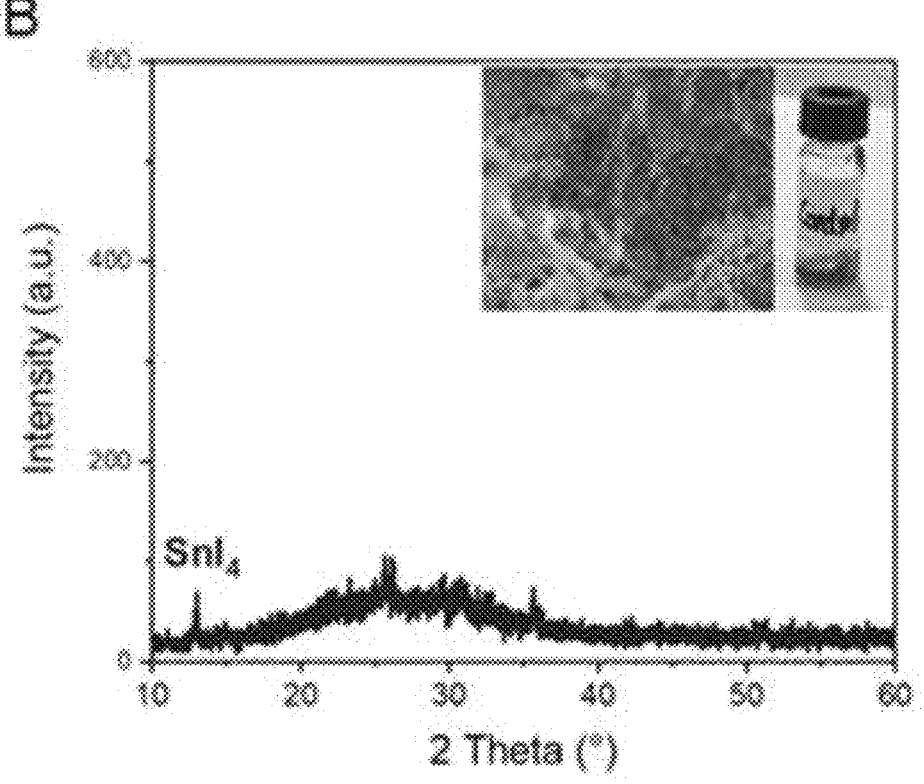
FIG. 10

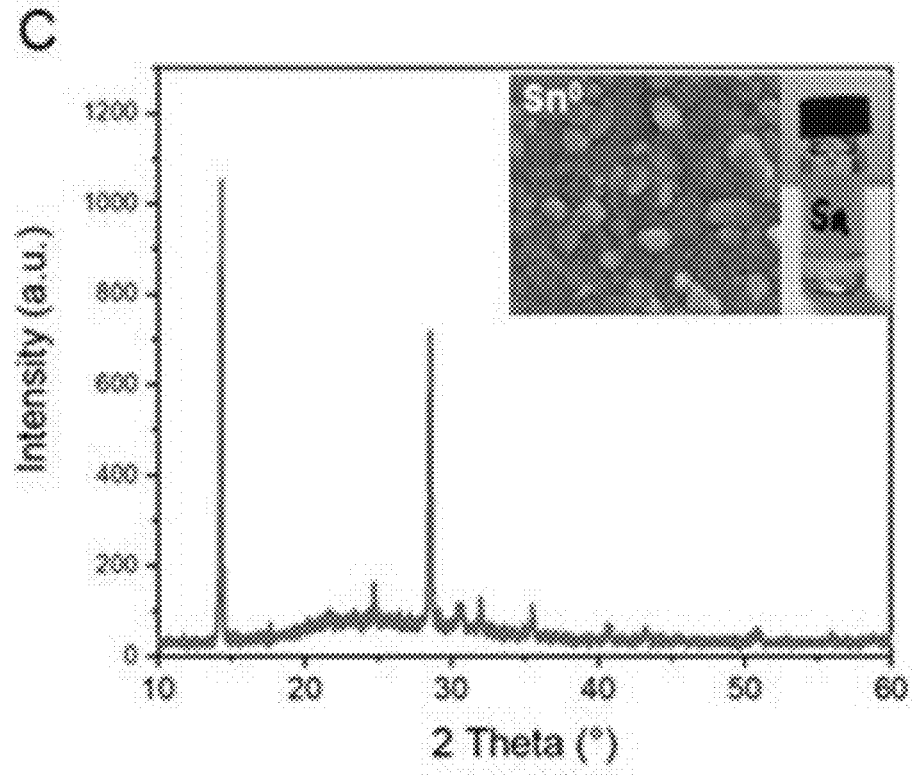
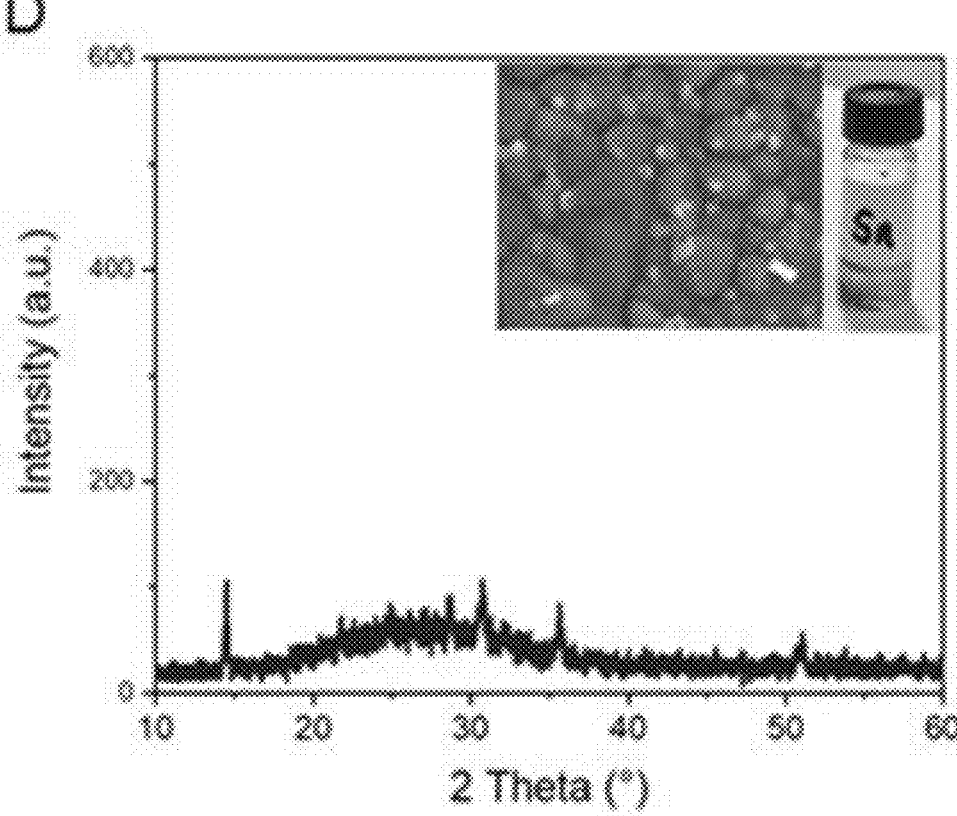
FIG. 10 (Continued)

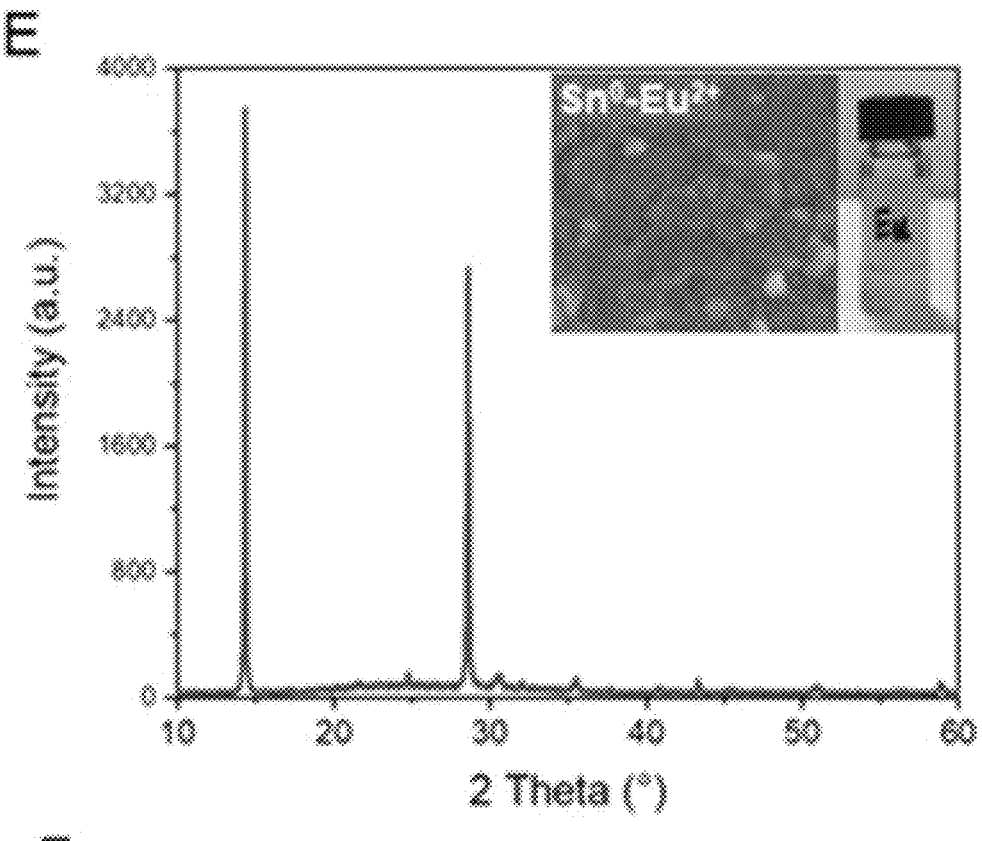
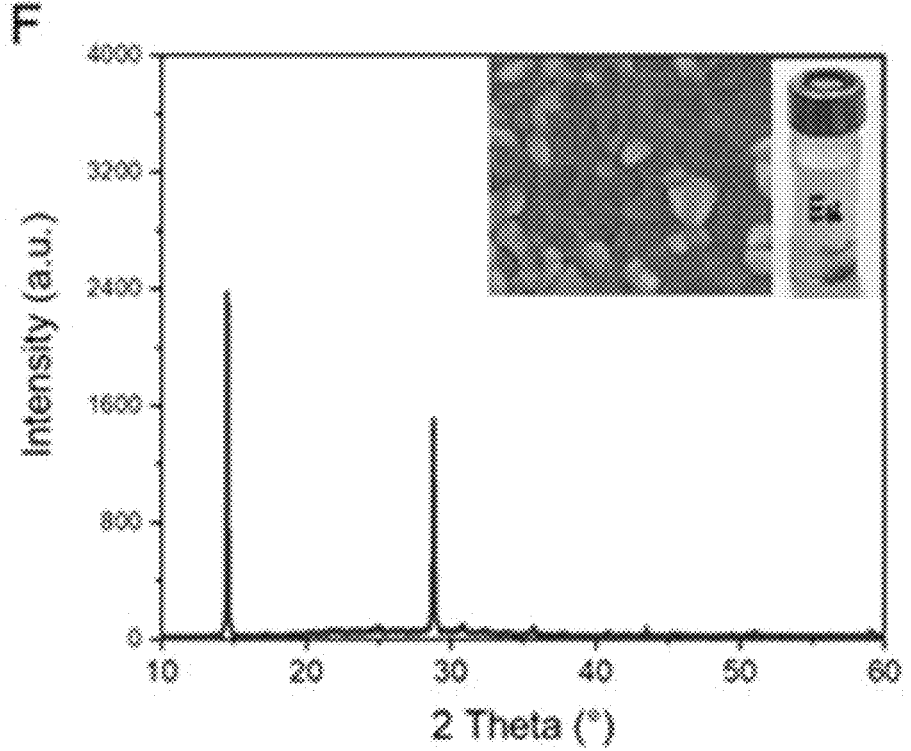
FIG. 10 (Continued)

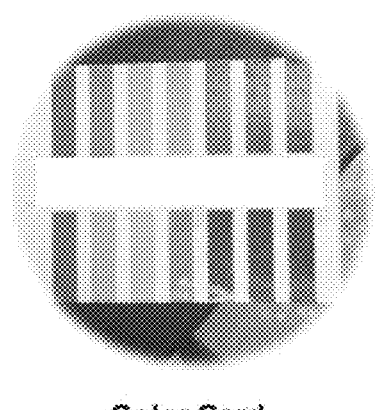
Color Card
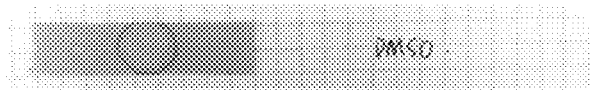
DMSO: PH value: 7-8    Neutral environment
Sn⁰-FASnI₃: PH value: 3    Acid environment
Sn⁰-Eu²⁺-FASnI₃: PH value: 2-3    Acid environment
FIG. 12
A
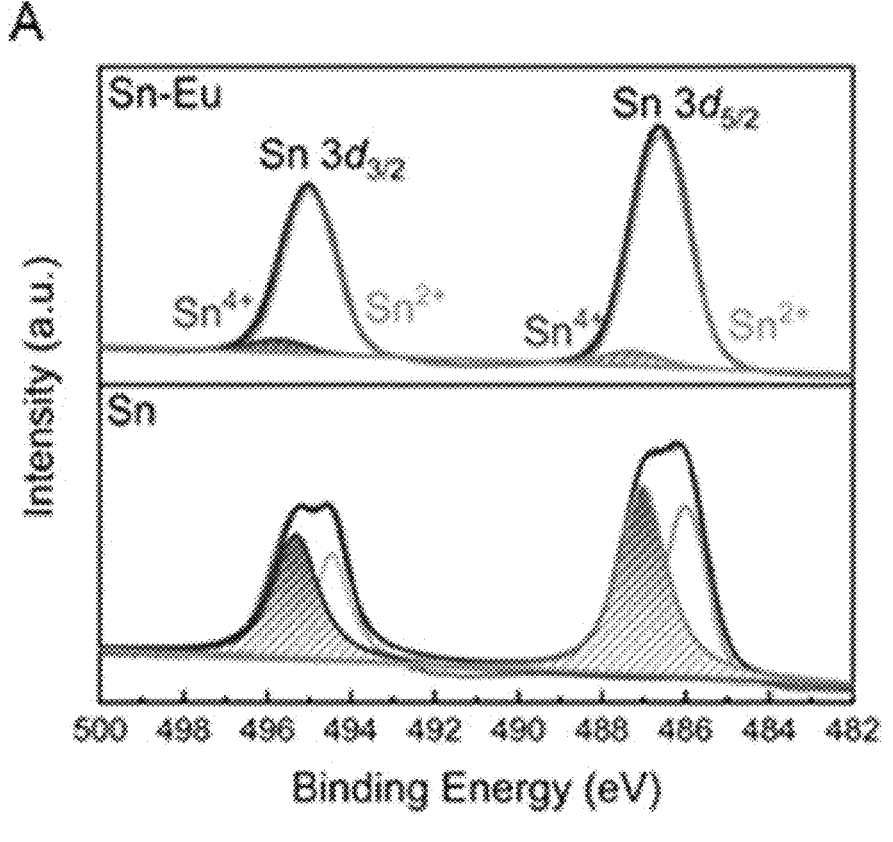
FIG. 13

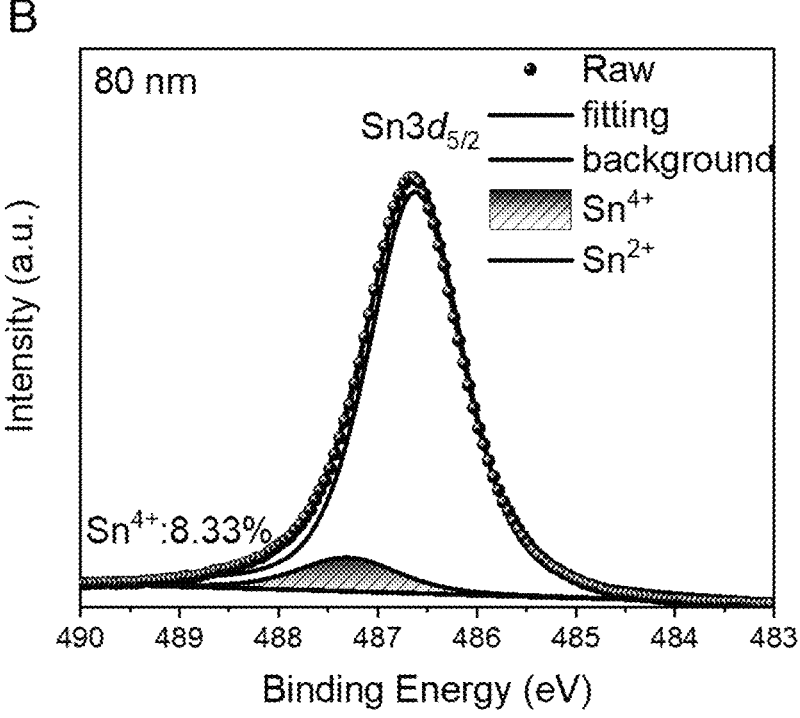
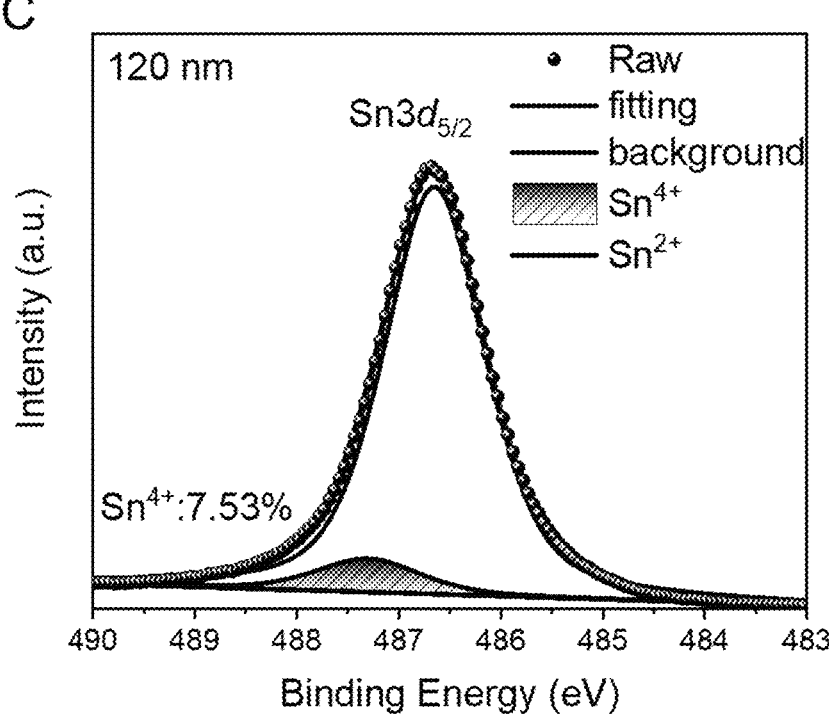
FIG. 16 (Continued)

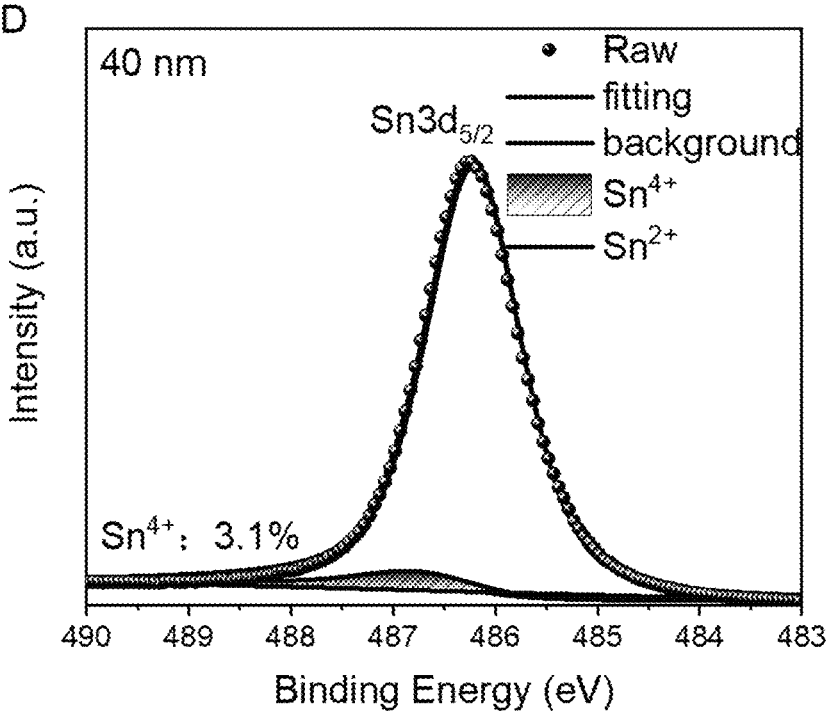
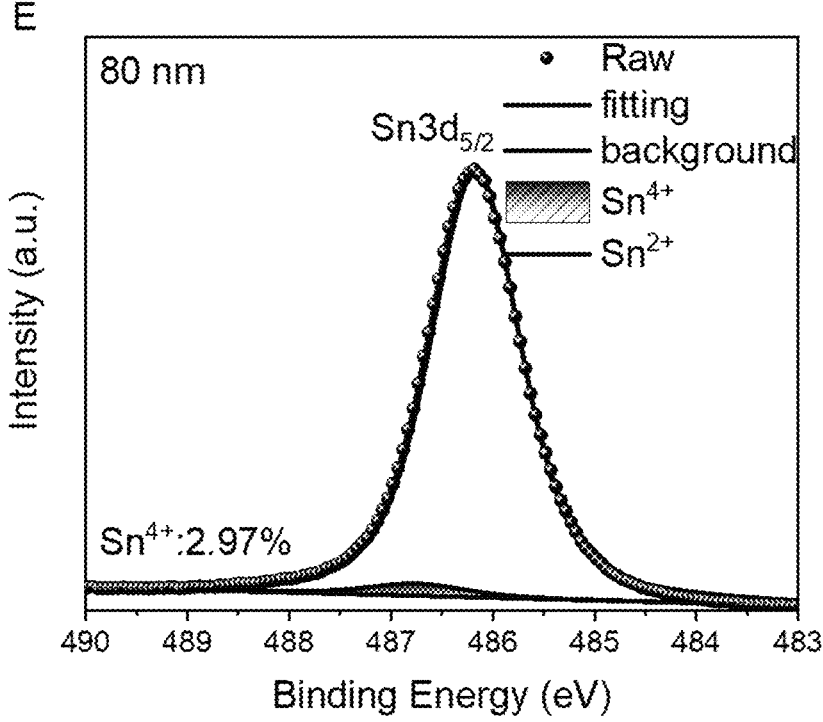
FIG. 16 (Continued)

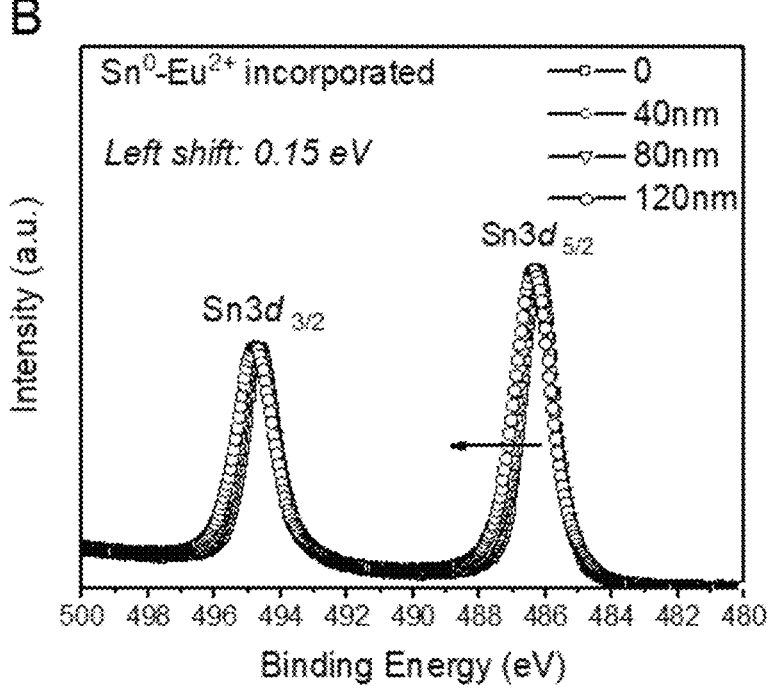
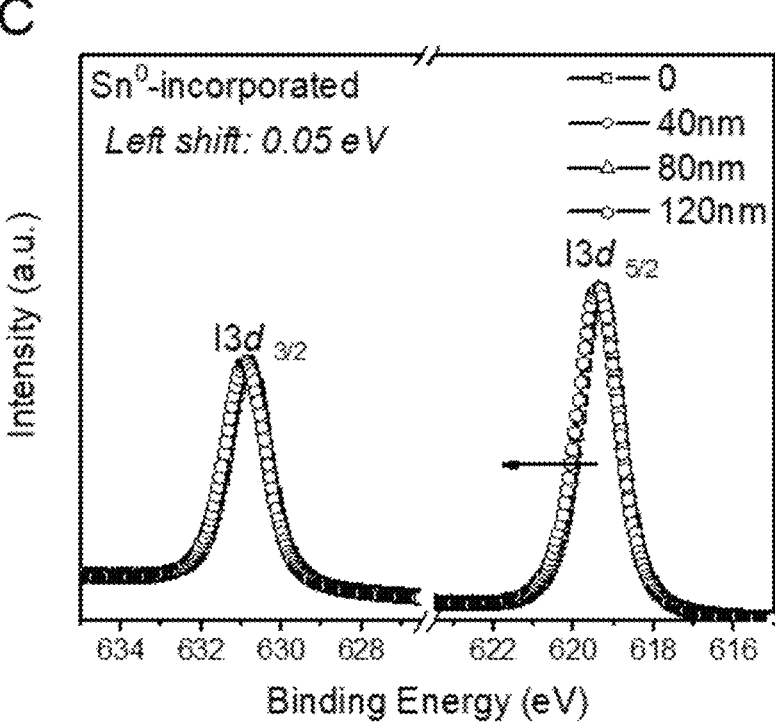
FIG. 17 (Continued)

D

A
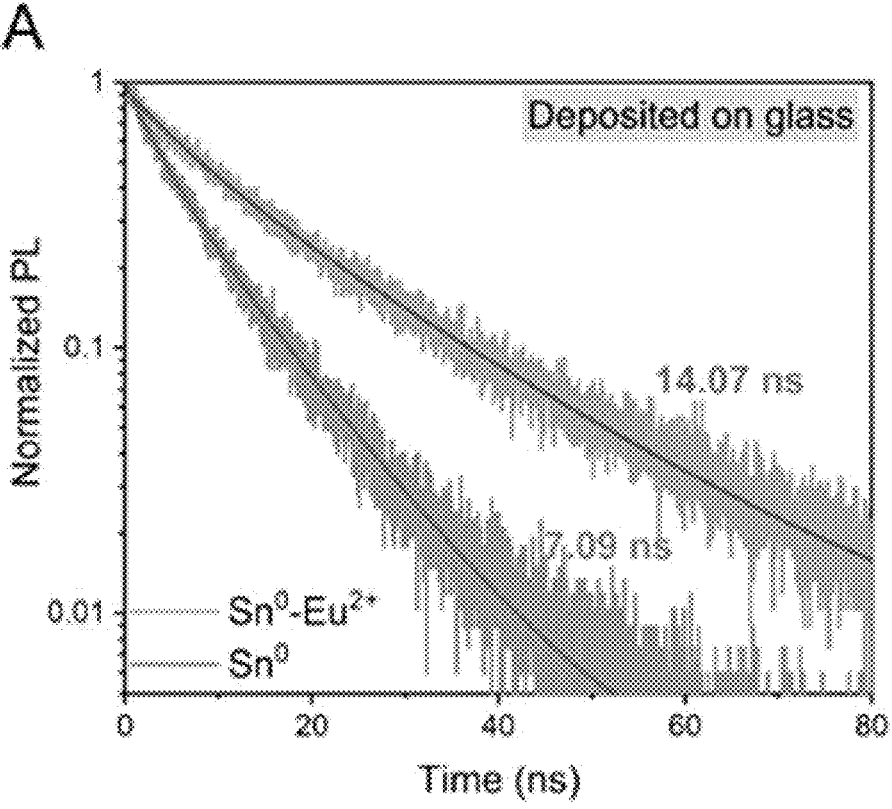
B
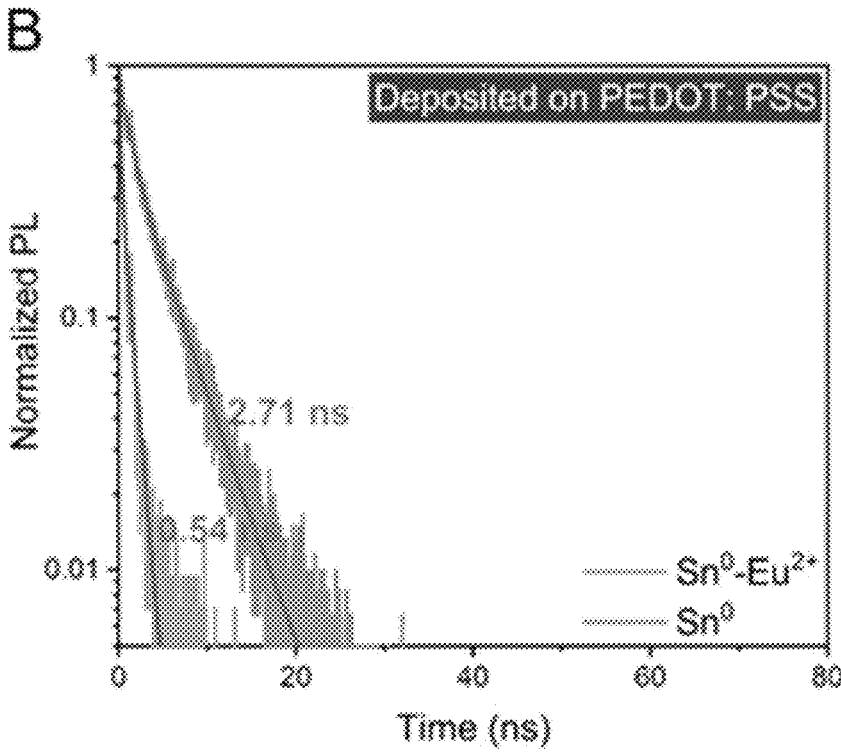
FIG. 18

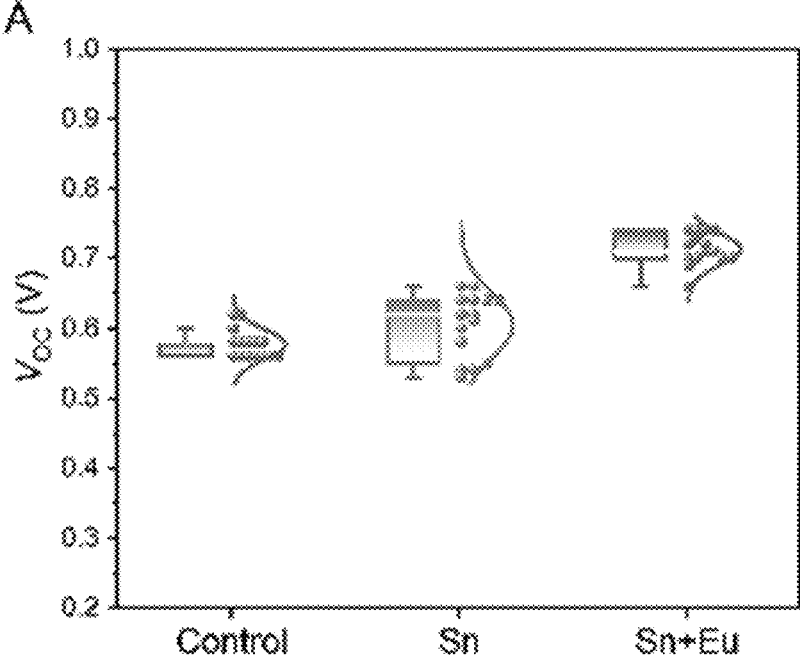
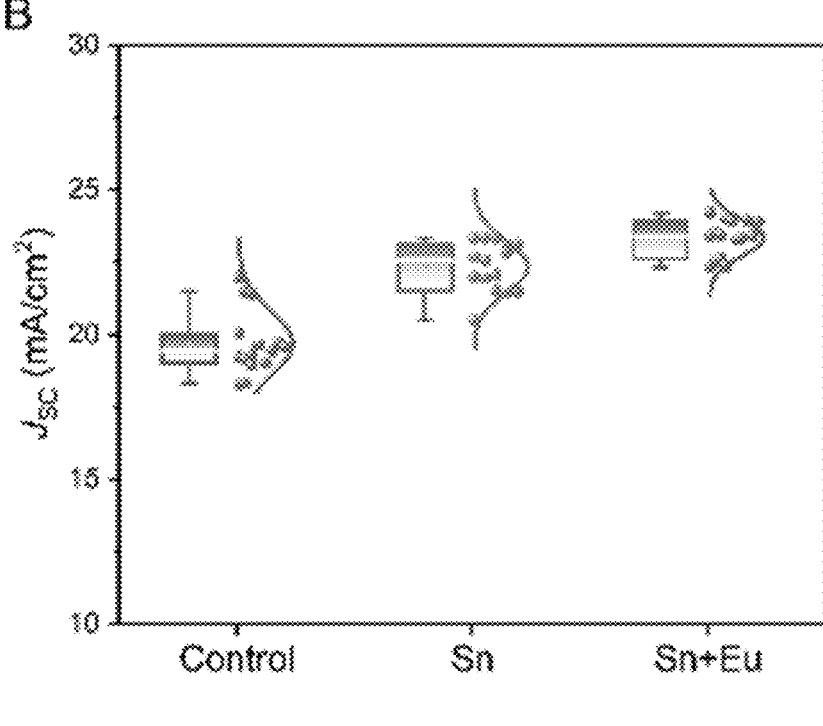
FIG. 20

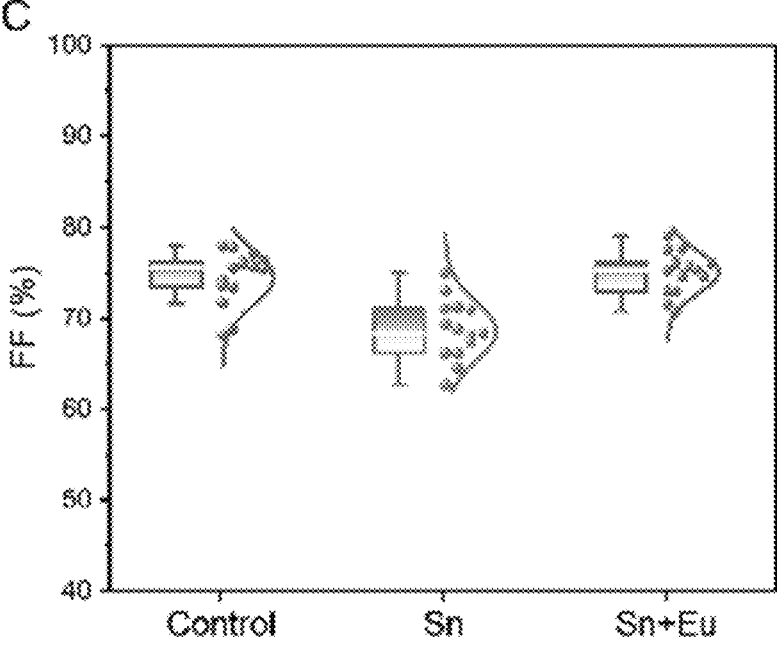
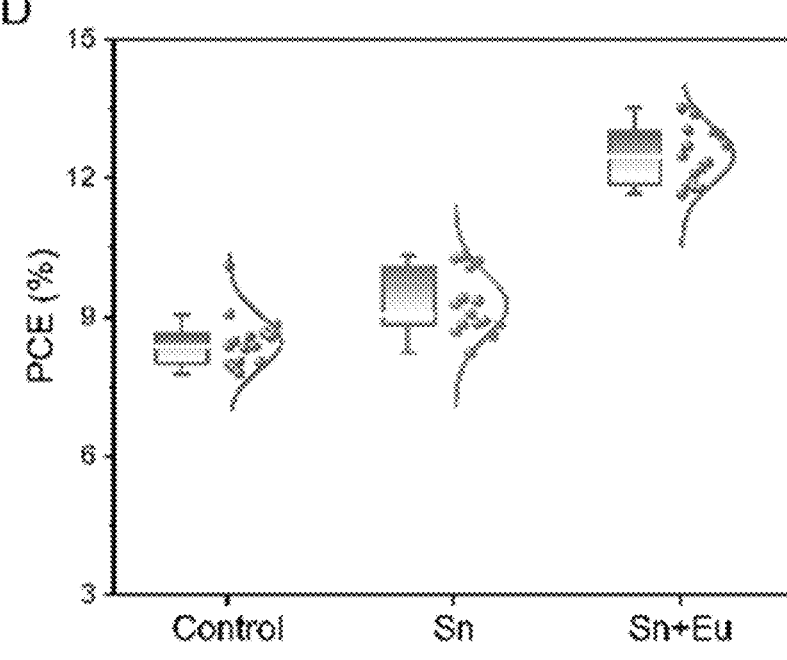
FIG. 20 (Continued)

| | a (Å) | b (Å) | c (Å) | α (°) | β (°) | γ (°) | V (Å³) |
|---|---|---|---|---|---|---|---|
| Control | 12.46778 | 8.48186 | 8.66444 | 90.0000 | 90.0000 | 90.0000 | 916.2642 |
| Eu | 12.32648 | 8.73680 | 8.56823 | 90.0591 | 91.3720 | 86.5846 | 920.8437 |

| | Sn1 | Sn2 | Sn3 | Sn4 | Eu |
|---|---|---|---|---|---|
| Control | -0.835874 e⁻ | -0.835874 e⁻ | -0.835874 e⁻ | -0.835874 e⁻ | — |
| Eu | -0.719455 e⁻ | -0.71709 e⁻ | -0.75086 e⁻ | -0.757739e⁻ | -1.658889 e⁻ |

| Electron Transfer Reaction | $E^0$ (V) | $\Delta G^0$ (eV) |
|---|---|---|
| $Sn^{4+}+2e^-\rightarrow Sn^{2+}$ | 0.15 | $-2.895\times10^4$ |
| $Sn^{2+}+2e^-\rightarrow Sn$ | -0.13 | $2.509\times10^4$ |
| $Eu^{3+}+e^-\rightarrow Eu^{2+}$ | -0.35 | $3.378\times10^4$ |
| $I_2+2e^-\rightarrow 2I^-$ | 0.54 | $1.042\times10^5$ |
| $Sn+Sn^{4+}\rightarrow 2Sn^{2+}$ | 0.28 | $5.404\times10^4$ |
| $2Eu^{2+}+Sn^{4+}\rightarrow 2Eu^{3+}+Sn^{2+}$ | 0.50 | $-9.65\times10^4$ |
| $2Eu^{2+}+I_2\rightarrow 2Eu^{3+}+2I^-$ | 0.89 | $-1.771\times10^5$ |
| $Sn+2Eu^{3+}\rightarrow Sn^{2+}+2Eu^{2+}$ | -0.22 | $4.246\times10^4$ |

FIG. 27

| Sample | $\tau_1$ (ns) | $Rel_1$ (%) | $\tau_2$ (ns) | $Rel_2$ (%) | $\tau$ (ns) |
|---|---|---|---|---|---|
| Sn / Glass | 6.32 | 32.37 | 19.63 | 61.25 | 14.07 |
| Sn-Eu / Glass | 3.58 | 40.54 | 9.71 | 58.11 | 7.09 |
| Sn / $C_{60}$ | 0.21 | 61.36 | 1.03 | 40.51 | 0.54 |
| Sn-Eu / $C_{60}$ | 1.22 | 40.98 | 4.24 | 52.19 | 2.71 |

REDOX DOPING METHOD FOR HIGH-PERFORMANCE Sn PEROVSKITE SOLAR CELLS

CROSS-REFERENCE TO RELATED APPLICATIONS

The present application claims priority from U.S. Provisional Patent Application No. 63/585,224, filed on Sep. 26, 2023, which is hereby incorporated by reference in its entirety.

STATEMENT REGARDING PRIOR DISCLOSURES BY THE INVENTORS OR JOINT INVENTORS UNDER 37 CFR 1.77 (b) (6)

Part of the present invention was disclosed in a paper published in Xue Ma, et al., Europium redox doping to suppress Sn—I defect pairs in Sn perovskite photovoltaics, *Device*, volume 2, Issue 6, 100294, available online 28 Feb. 2024. This paper is a grace period inventor-originated disclosure disclosed within one year before the filing date of this application and falls within the exceptions defined under 35 USC § 102(b)(1). This paper is hereby incorporated by reference in its entirety.

TECHNICAL FIELD

This disclosure relates to europium doped tin perovskites and optoelectronic devices comprising the same, and perovskite precursor solutions useful in the preparation of the europium doped tin perovskites.

BACKGROUND

Metal halide perovskite solar cells (PSCs) are considered a disruptive photovoltaic technology owing to the rapid rise of their power conversion efficiencies (PCEs). However, high-performance PSCs are often based on metal halide perovskites with the lead (Pb) as the core metal cation, while Pb is known detrimentally to the environment and human beings. Given restrictions for using Pb in commercial optoelectronic devices, application in PSCs is limited. In order to mitigate the Pb-toxicity issue of PSCs while preserving the desirable device performance, one important method is to replace Pb cations with less toxic metal cations, in particular tin (Sn) which exhibits a similar electron configuration. Sn-PSCs have demonstrated high potential with a maximum PCE of 14.81% reported. In addition, Sn perovskites with lower bandgaps are more ideal for sunlight absorption as compared to Pb perovskites. Nevertheless, Sn cations in perovskites can readily undergo oxidation from $Sn^{2+}$ to $Sn^{4+}$, which is coupled with the formation of Sn vacancies ($V_{Sn}$) to maintain the local charge neutrality among the crystalline lattice. The uncontrolled increase of $V_{Sn}$ in perovskites can severely reduce the structural stability and bring about negative effects on the optoelectronic properties. Addressing the Sn oxidation issue has thus been of significance for pursuing highly stable and efficient Sn PSCs.

Efforts have primarily focused on incorporating various functional molecules into Sn perovskite processing, leading to increased oxidation tolerance of the resultant perovskite films via surface and interface passivation. However, obstacles of charge extraction/transfer are generally encountered at the perovskite layer and its interfaces due to the insulative properties of the passivation molecules. Alternatively, metal ion doping has been applied to improve the performance and stability of Sn PSC devices. The general rational of metal ion doping is to introduce a suitable amount of isovalent or aliovalent metal cations into the perovskite lattice to modify the electronic and optical properties. The interstitial doping of alkali metal cations such as lithium ($Li^+$), sodium ($Na^+$), potassium ($K^+$), or rubidium ($Rb^+$) has been widely employed to suppress ion migration in perovskite materials, thereby enhancing the performance and stability of perovskite optoelectronic devices. However, these doping processes can distort the perovskite lattice, leading to lattice microstrain, which can compromise the stability of the crystal. Therefore, the choice of an appropriate ion is crucial to mitigate these side effects while maximizing the suppression of ion migration, thereby promoting the performance and operational stability of PSCs.

There thus exists a need for improved Sn PSCs that address or overcome at least some of the challenges described above.

SUMMARY

In this work, we applied an optimized amount of europium diiodide ($EuI_2$) to serve as the metal ion dopants, which can greatly suppress the concentration of $Sn^{4+}$ and under-coordinated $I^-$ in Sn perovskites. We investigated the mechanisms underlying this effective approach. We found the precursor solution of Sn perovskites in dimethyl sulfoxide (DMSO) solvent is acidic. The redox reactions between $Eu^{2+}$ and $Sn^{4+}$, iodine ($I^0$) are more energetically favored in such acidic mediator. These reactions can reduce the concentration of Sn—I defect pairs in Sn perovskites. By combining density functional theory (DFT) calculations and experimental approaches, the $Eu^{2+}$ cation was confirmed to migrate into the perovskite lattice, which enables not only the change of the local structure in Sn—I frameworks to create a reduced energy barrier for the redox process, but also the stabilization of organic cation components to enhance the thermal stability of the Sn perovskite lattice. As a result, Sn PSCs deliver a high PCE up to 13.66%, along with an open-circuit voltage ($V_{OC}$) of 0.72 V, a short-circuit current density ($J_{SC}$) of 24.21 mA/cm² and a fill factor (FF) of 78.34%.

In a first aspect, provided herein is a perovskite comprising $Sn^{2+}$ and $Eu^{2+}$.

In certain embodiments, the perovskite further comprises one or more $A^+$ selected from the group consisting of $Cs^+$, $Rb^+$, $CH_3NH_3^+$, $CH_3CH_2NH_3^+$, $NH_2CH=NH_2^+$, and $NH_2C(Me)=NH_2^+$.

In certain embodiments, the perovskite further comprises $NH_2CH=NH_2^+$.

In certain embodiments, $Eu^{2+}$ and $Sn^{2+}$ are present in the perovskite at a molar ratio of 0.01:99.99 to 5:95, respectively.

In certain embodiments, $Eu^{2+}$ and $Sn^{2+}$ are present in the perovskite at a molar ratio of 0.5:99.5 to 2:98, respectively.

In certain embodiments, the perovskite further comprises $NH_2CH=NH_2^+$, and $Eu^{2+}$ and $Sn^{2+}$ are present in the perovskite at molar ratio of 0.5:99.5 to 2:98, respectively.

In certain embodiments, the perovskite has Formula 1:

$$(A^+)(Sn^{2+})(X^-)_3 \cdot m[(Eu^{2+})(Y^-)_2] \qquad 1$$

wherein m is 0.001-0.05;

$X^-$ for each instance is independently $F^-$, $Cl^-$, $Br^-$, or $I^-$;

$Y^-$ for each instance is independently $F^-$, $Cl^-$, $Br^-$, or $I^-$; and $A^+$ is $Cs^+$, $Rb^+$, $CH_3NH_3^+$, $CH_3CH_2NH_3^+$, $H(C=NH_2)NH_2^+$, $Me(C=NH_2)NH_2^+$, or a mixture thereof.

3

In certain embodiments, $A^+$ is $H(C=NH_2)NH_2^+$.

In certain embodiments, m is 0.005-0.02.

In certain embodiments, $A^+$ is $H(C=NH_2)NH_2^+$ and m is about 0.01.

In certain embodiments, each of $X^-$ and $Y^-$ is I.

In certain embodiments, the perovskite has Formula 2:

$$(H(C=NH_2)NH_2^+)(Sn^{2+})(I^-)_3 \cdot m[(Eu^{2+})(I^-)_2] \qquad 2$$

wherein m is about 0.010101.

In a second aspect, provided herein is a perovskite precursor solution comprising one or more tin salts, $EuY_2$, AZ, optionally tin powder, and a solvent, wherein the one or more tin salts is represented by the formula $SnX_2$, A is $Cs^+$, $Rb^+$, $CH_3NH_3^+$, $CH_3CH_2NH_3^+$, $H(C=NH_2)NH_2^+$, $Me(C=NH_2)NH_2^+$, or a mixture thereof, X for each instance is independently $F^-$, $Cl^-$, $Br^-$, $I^-$, or a mixture thereof, Y for each instance is independently $F^-$, $Cl^-$, $Br^-$, $I^-$, or a mixture thereof, Z is $F^-$, $Cl^-$, $Br^-$, or $I^-$, and the solvent comprises dimethyl formamide (DMF), dimethyl sulfoxide (DMSO), or a mixture thereof.

In certain embodiments, the one or more tin salts comprises $SnF_2$, $SnCl_2$, and $SnI_2$.

In certain embodiments, AZ is $H(C=NH_2)NH_2I$.

In certain embodiments, Y is $I^-$.

In certain embodiments, the perovskite precursor solution further comprises ethanediamine dihydroiodide.

In certain embodiments, the perovskite precursor solution comprises tin powder, $SnF_2$, $SnCl_2$, $SnI_2$, $EuI_2$, $H(C=NH_2)NH_2I$, and DMSO.

In a third aspect, provided herein is an electronic device comprising:

a substrate layer;

a transparent conductive layer disposed on a surface of the substrate layer, a hole-transport layer disposed on the surface of the transparent conductive layer;

a perovskite layer comprising the perovskite described herein disposed on a surface of the hole-transport layer;

an electron-transport layer disposed on the surface of the perovskite functional layer; and a metal electrode disposed on the surface of the electron-transport layer.

In certain embodiments, the electronic device has a power conversion efficiency (PCE) of 12-13.66%.

In certain embodiments, the perovskite has Formula 2:

$$(H(C=NH_2)NH_2^+)(Sn^{2+})(I^-)_3 \cdot m[(Eu^{2+})(I^-)_2] \qquad 2$$

wherein m is about 0.010101 and the electronic device is more stable than an electronic device comprising a perovskite of Formula 3:

$$(H(C=NH_2)NH_2^+)(Sn^{2+})(I^-)_3 \qquad 3$$

BRIEF DESCRIPTION OF THE DRAWINGS

The present invention is illustrated by the accompanying drawings of various embodiments and the detailed description given below. The drawings should not be taken to limit the invention to the specific embodiments but are for explanation and understanding. The detailed description and drawings are merely illustrative of the invention rather than limiting, the scope of the invention being defined by the appended claims and equivalents thereof. The drawings are not to scale. The foregoing aspects and other attendant advantages of the present invention will become more readily appreciated by the detailed description taken in conjunction with the accompanying drawings.

4

Figure 1:
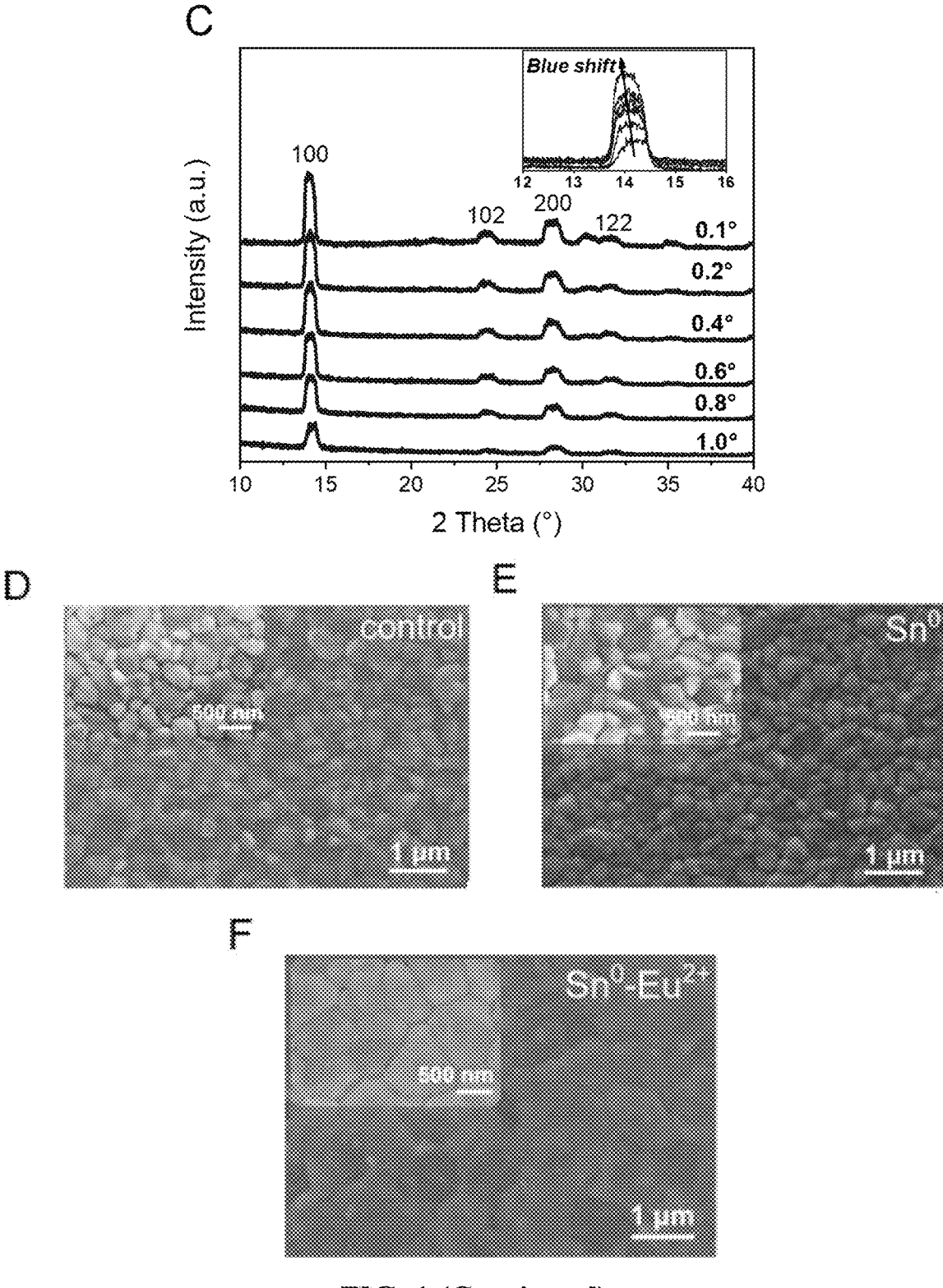
Figure 1:
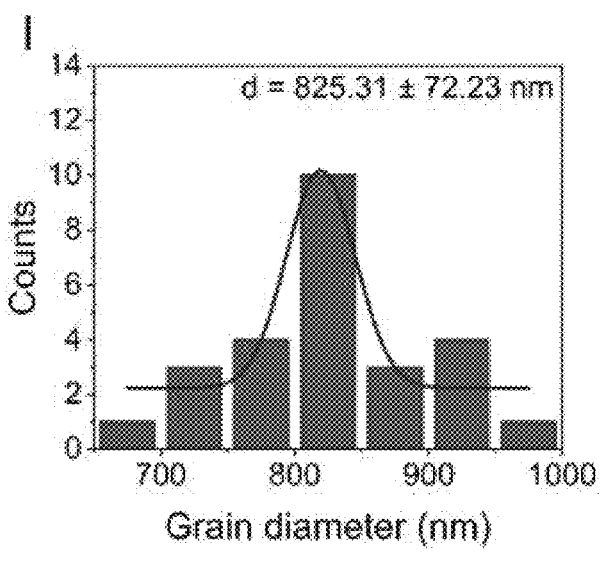

FIG. 1. Crystal structure and grain distribution for perovskite films (A-C) Depth-dependent grazing incident X-ray diffraction (GIXRD) patterns of control, $Sn^0$-incorporated and $Sn^0$—$Eu^{2+}$ incorporated $FASnI_3$ perovskite films. (D-F) SEM images of control, $Sn^0$-incorporated, and $Sn^0$—$Eu^{2+}$ incorporated $FASnI_3$ perovskite films deposited on PEDOT: PSS-coated ITO substrates. The scale bar represents 1 μm. (G-I) The grain-size-distribution histograms from corresponding SEM images for the control, $Sn^0$-incorporated and $Sn^0$—$Eu^{2+}$ incorporated samples, respectively.

Figure 2:
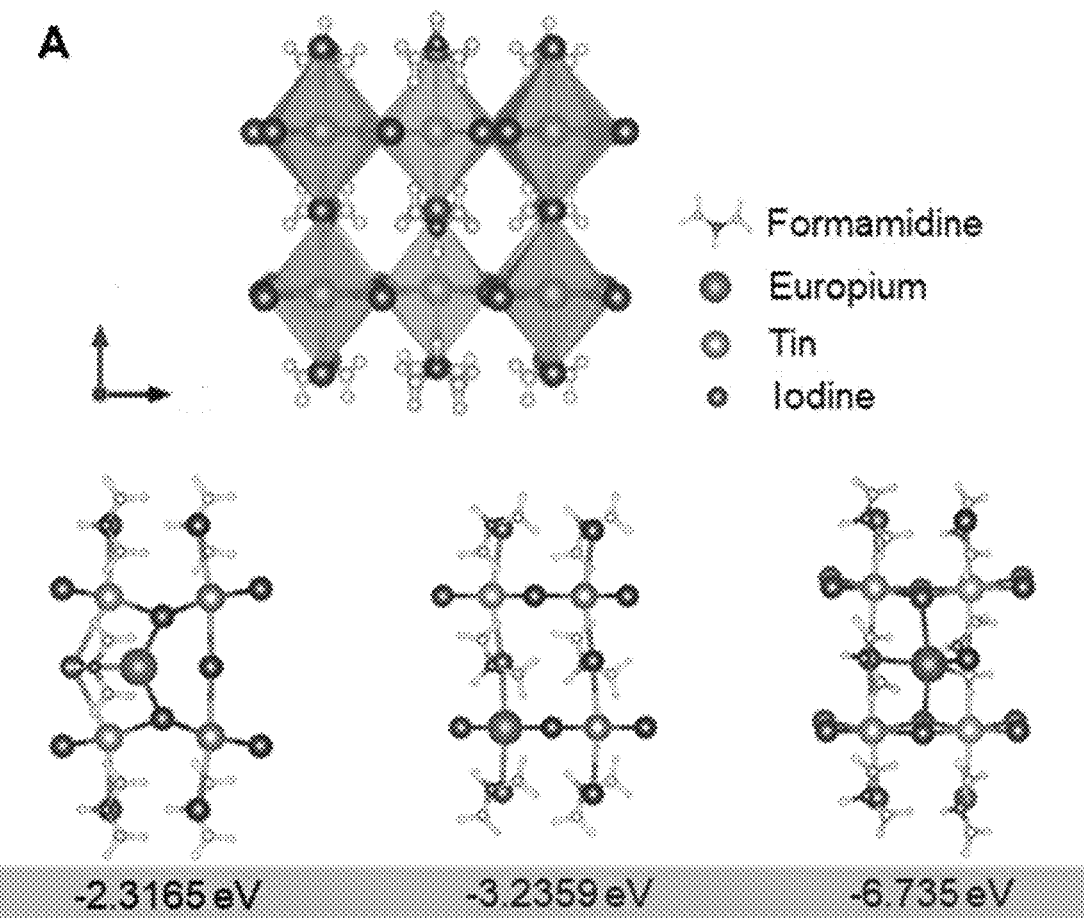
Figure 2:
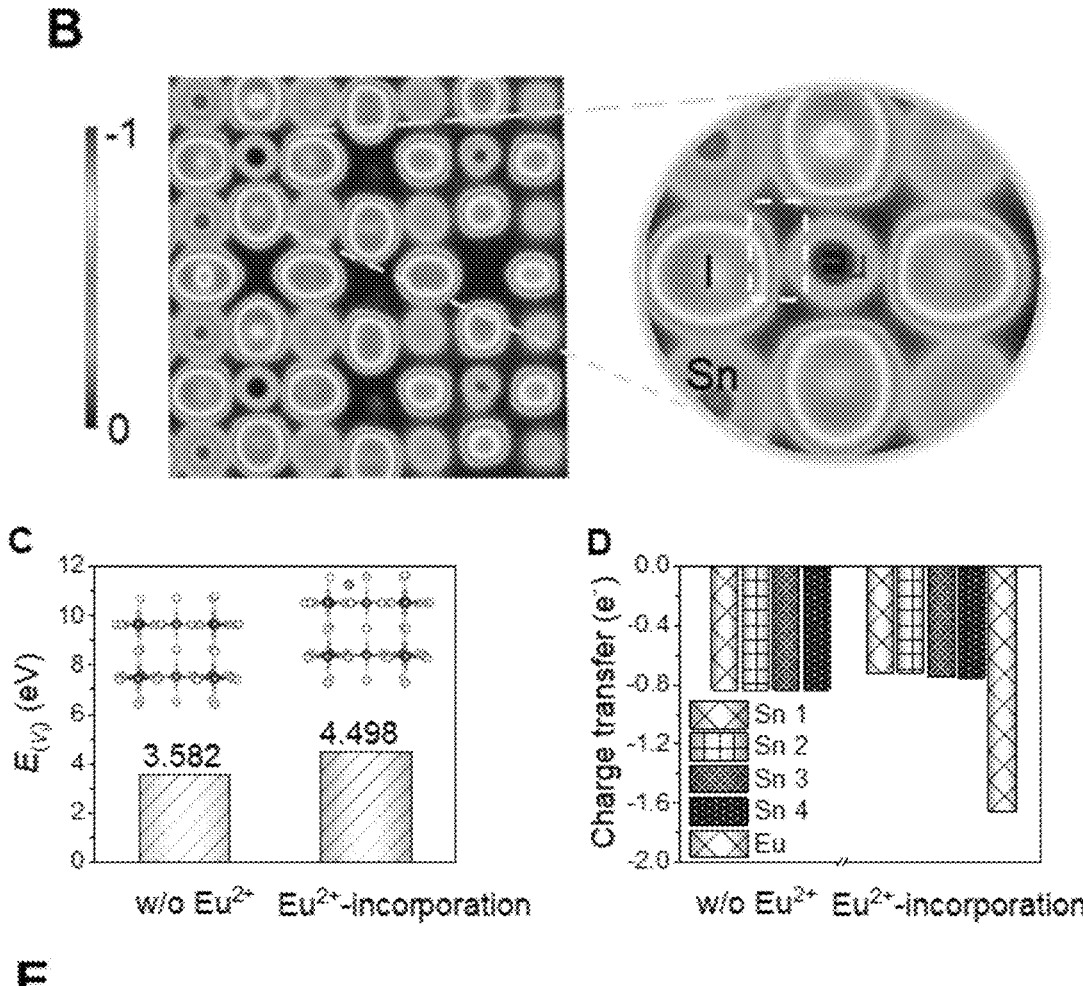
Figure 2:
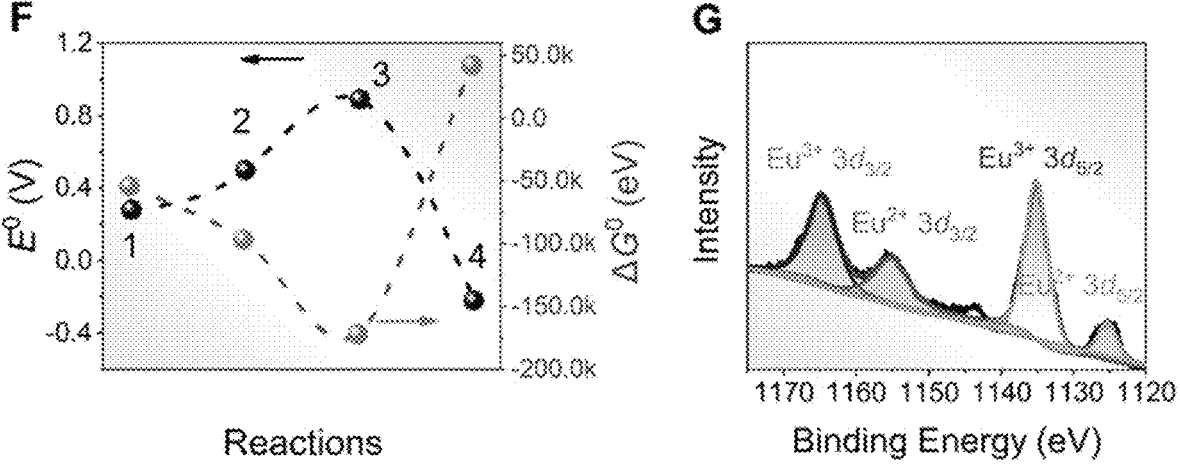

FIG. 2. Characterization and calculations of $Eu^{2+}$-incorporated perovskite films: crystal structure, electron localization, charge transfer, and redox properties (A) Schematic illustration for the typical $FASnI_3$ crystal structure and the calculated formation energies (FE) of $Eu^{2+}$ occupying at FA- (−2.3165 eV), Sn- (−3.2359 eV), and interstitial-site (−6.735 eV) in sequence. (B) Electron localization function (ELF) results of $Eu^{2+}$-incorporated perovskite film. The white dotted box represents a strong interaction between europium and iodide ions. (C) Calculated formation energy of $V_I$ without and with $Eu^{2+}$-incorporation. (D) Charge transfer calculated from Bader. (E) The redox property of various ions evaluated from its standard reduction potential ($E^0$) in the acid medium. (F) The comparison of $E^0$ and $\Delta G^0$ for reactions. ($\Delta G^0 = -nFE^0$, where n is the number of electrons transferred in the reaction and F is the Faraday constant) (G) High-resolution XPS spectra of Eu 3d for the $Sn^0$—$Eu^{2+}$ incorporated perovskite films after air exposure of 5 hours.

Figure 3:
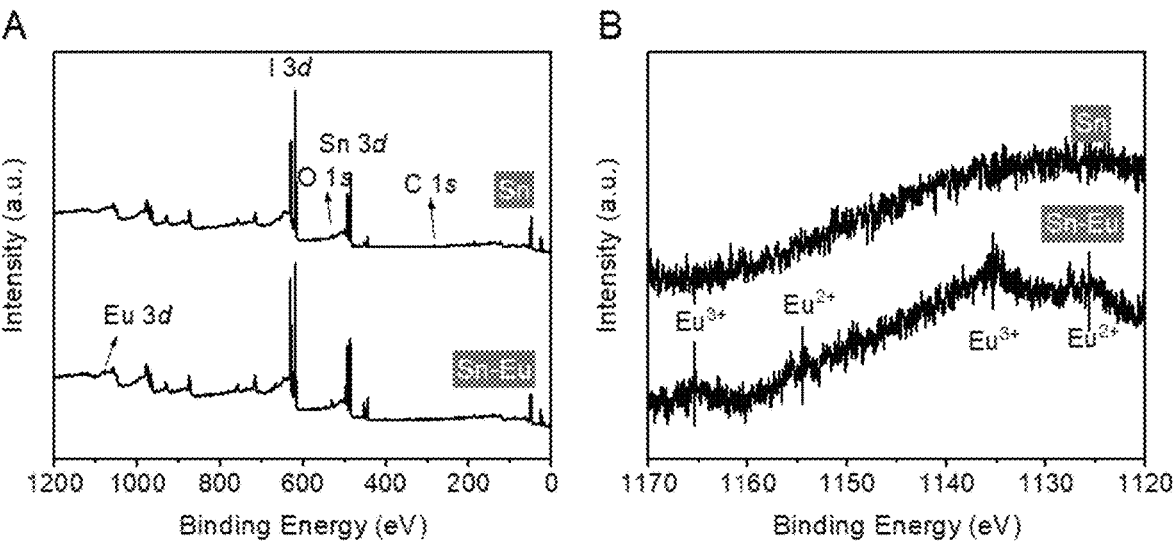
Figure 3:
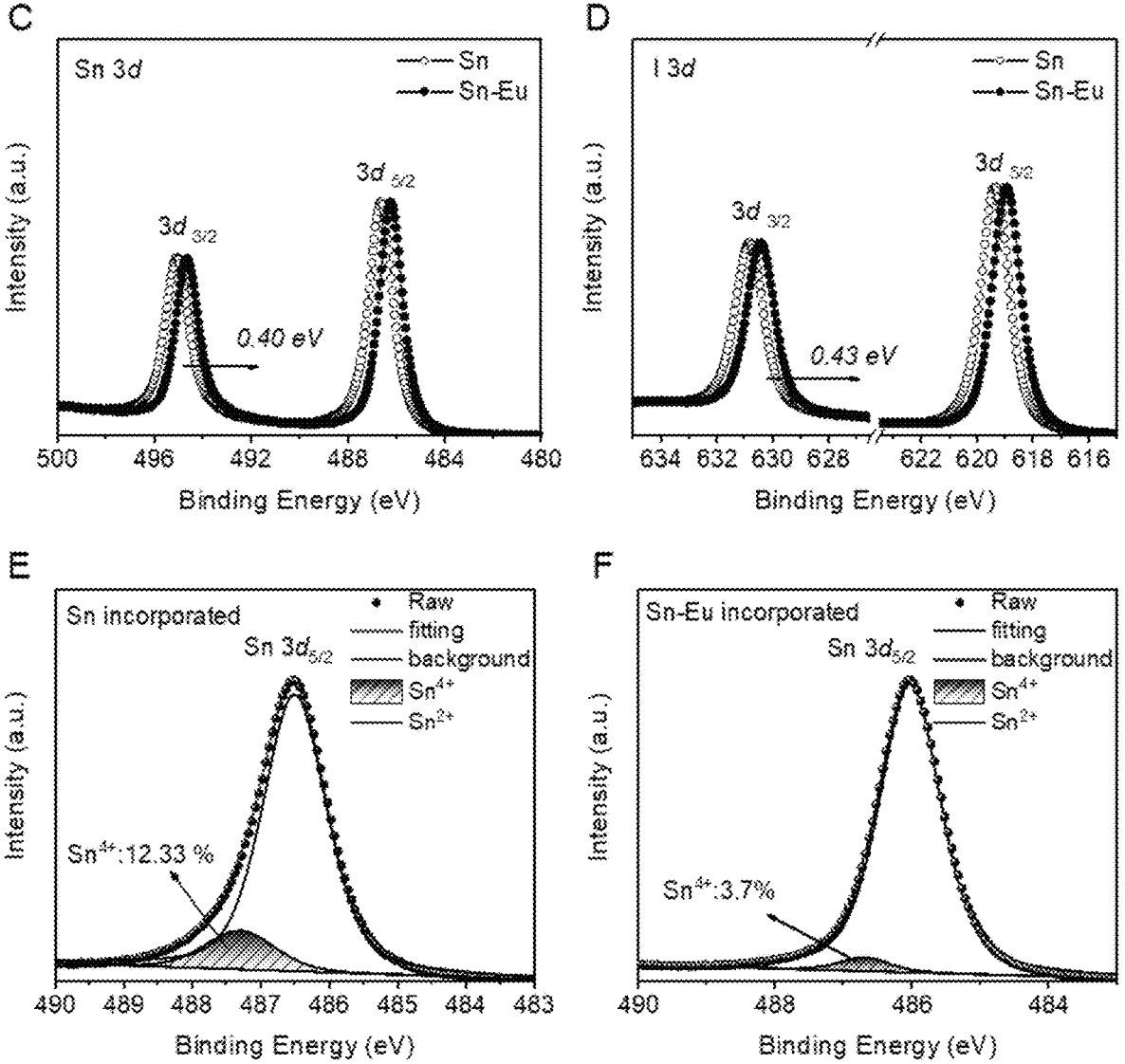
Figure 3:
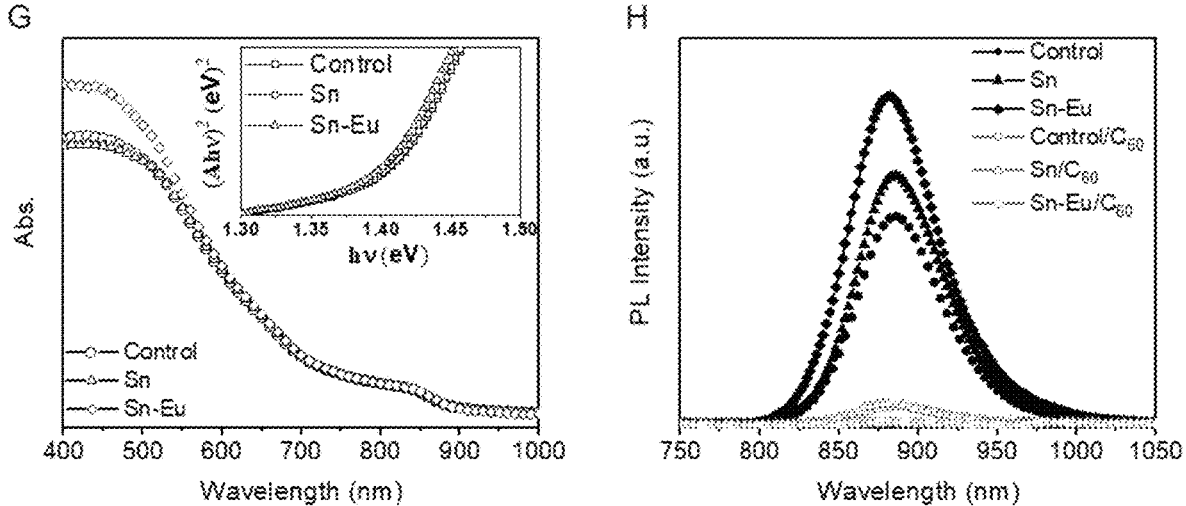

FIG. 3. Characterization of surface properties (A) XPS full spectra. (B, C, and D) High-resolution XPS spectrum: (B) Eu 3d, (C) I 3d and (D) Sn 3d. (E and F) Fitting XPS peaks of Sn 3d: (E) $Sn^0$-incorporated and (F) $Sn^0$—$Eu^{2+}$ incorporated films. (G) Absorption spectra of the control, $Sn^0$-incorporated (blue) and $Sn^0$—$Eu^{2+}$ incorporated (reddish orange) samples. The inset shows the Tauc plots calculated by the absorptance spectra. (H) PL spectra of the control (purple), $Sn^0$-incorporated and $Sn^0$—$Eu^{2+}$ incorporated perovskite films on glass substrates before and after $C_{60}$ deposition on perovskite films. The corresponding colors of the three perovskite films after $C_{60}$ deposition are light purple, light blue, and light orange-red.

Figure 4:
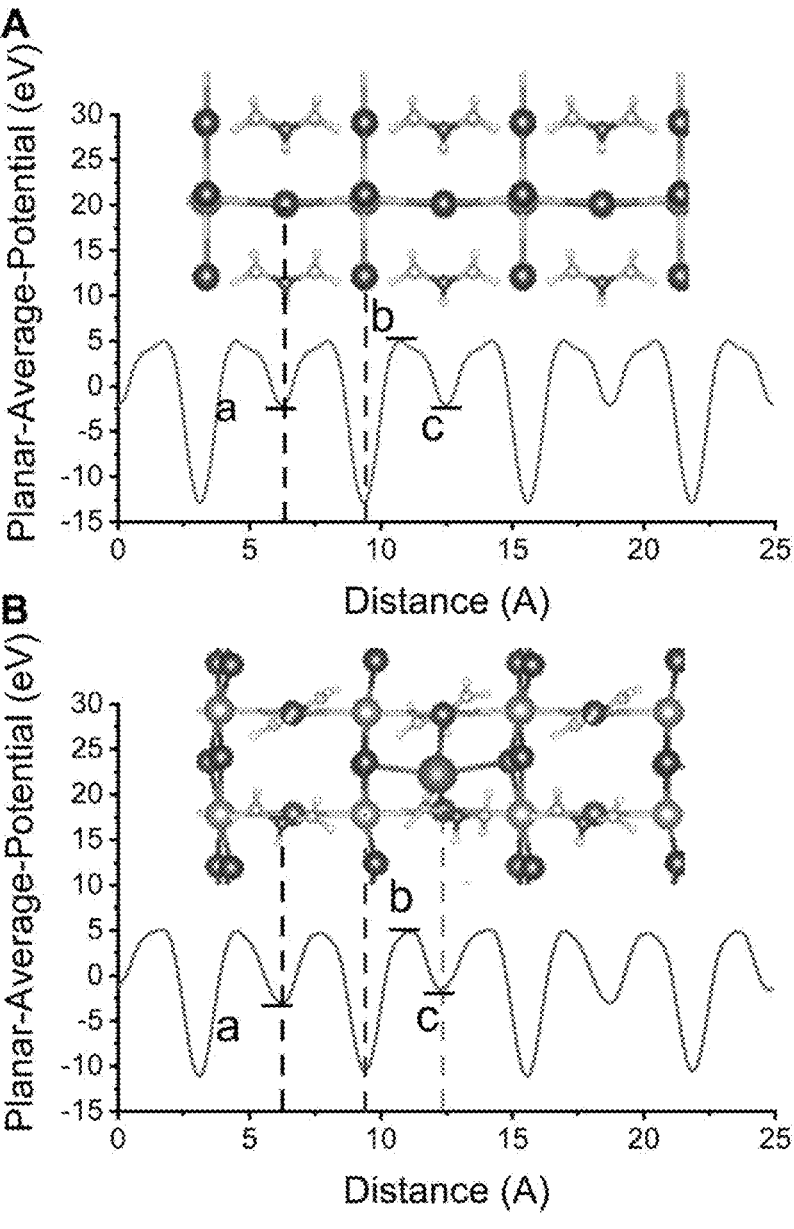
Figure 4:
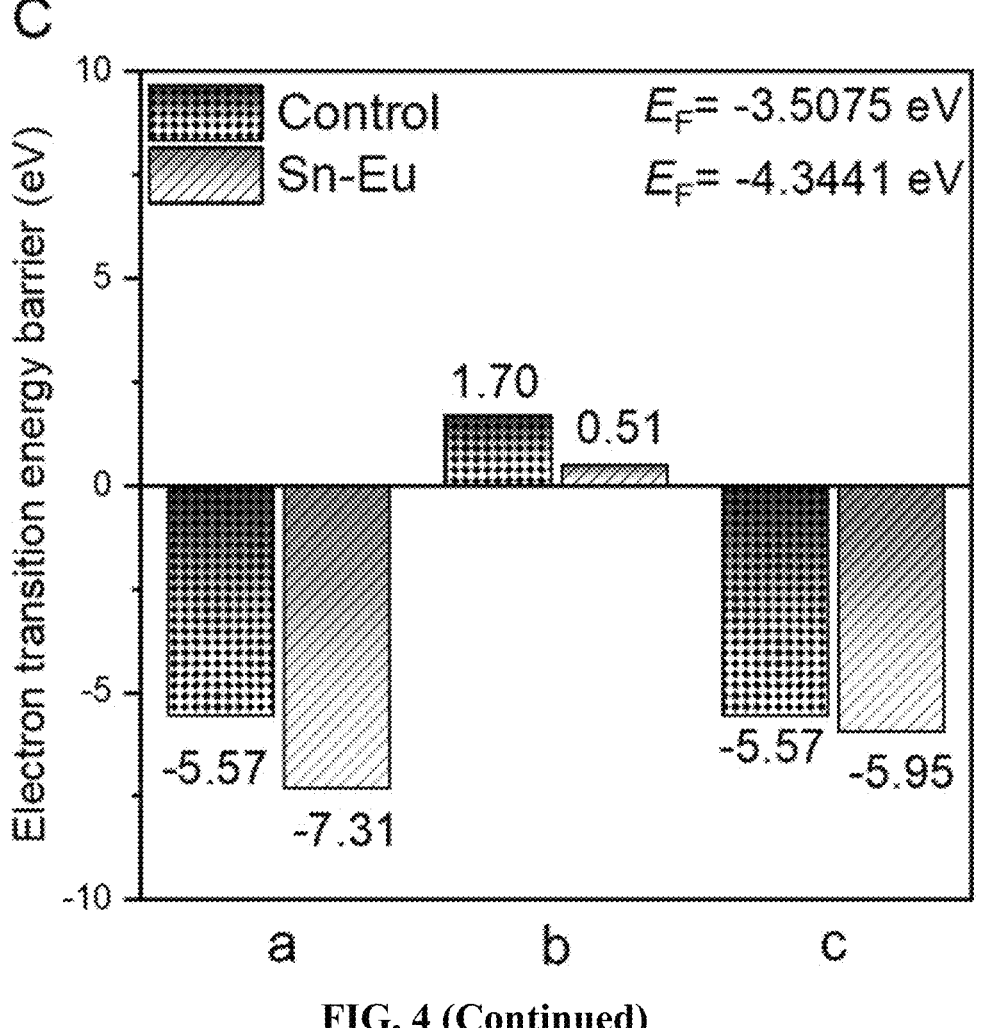

FIG. 4. Calculation of average electrostatic potential at various positions during charge transfer (A) control sample. (B) $Sn^0$—$Eu^{2+}$ incorporated sample. Note that a, b, and c represent the electrostatic potential at different positions. (a) The line represents the electrostatic potential of the electron as it passes through an iodine skeleton with FA present. (b) The line represents the electrostatic potential of the electron as it passes through the inorganic octahedral frame. (c) The rosy dashed line represents the electrostatic potential of the electron as it passes through an $Eu^{2+}$-incorporated iodine skeleton with FA present. (C) The corresponding electron transition energy barrier for two cases. The two $E_F$ values were calculated to be −3.5075 eV (control sample) and −4.3441 eV ($Sn^0$—$Eu^{2+}$ incorporated sample), respectively.

Figure 5:
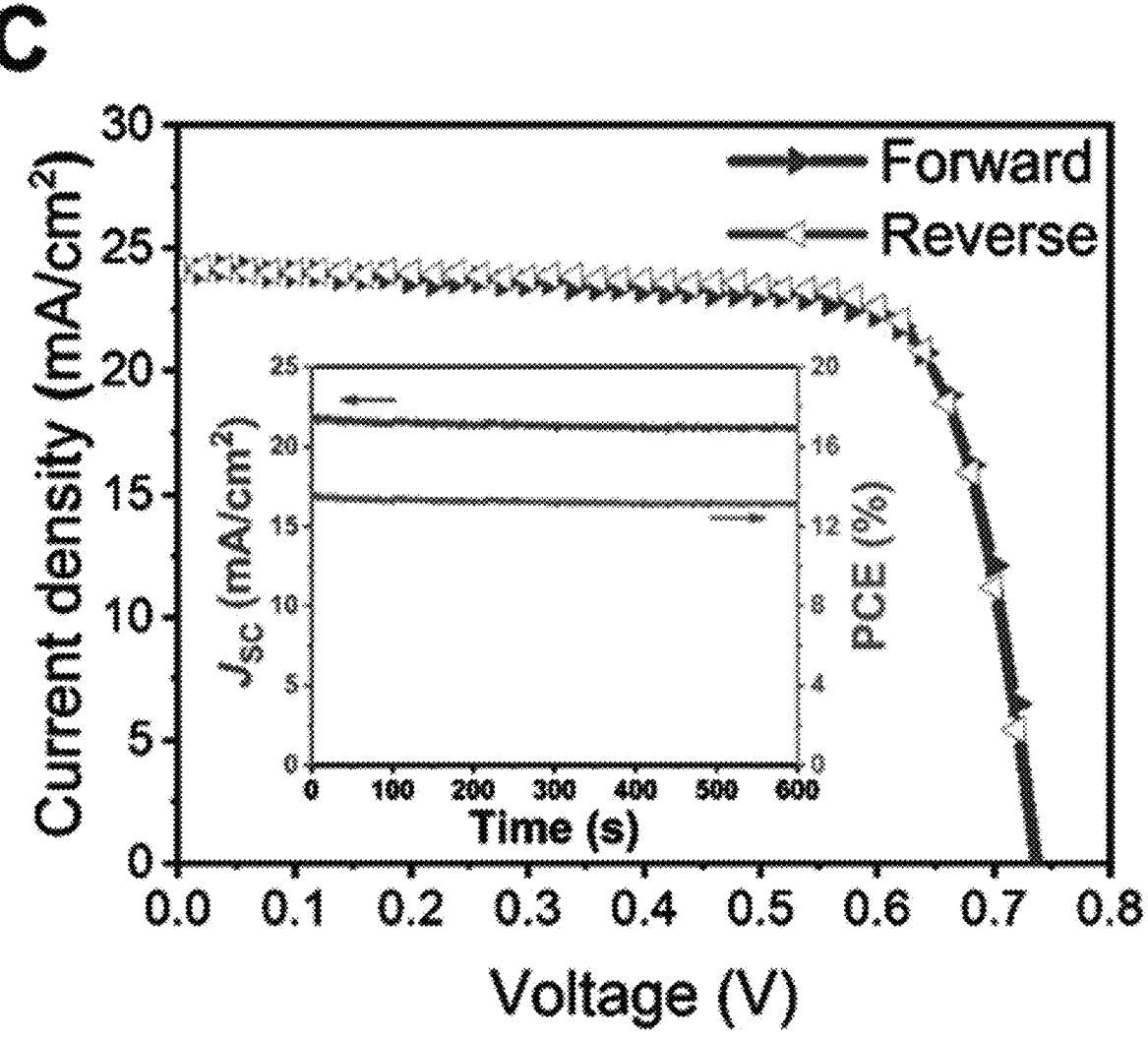
Figure 5:
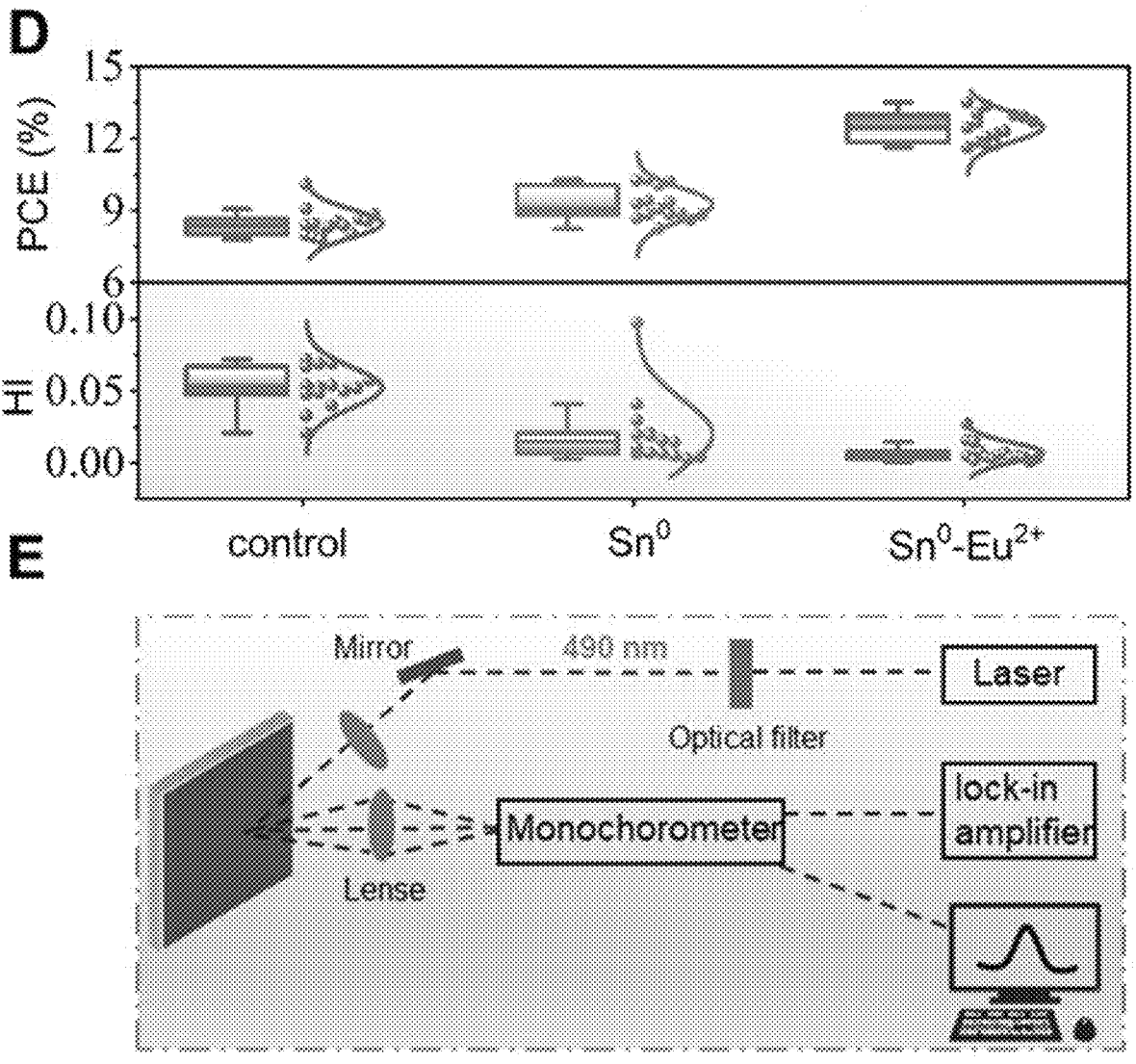
Figure 5:
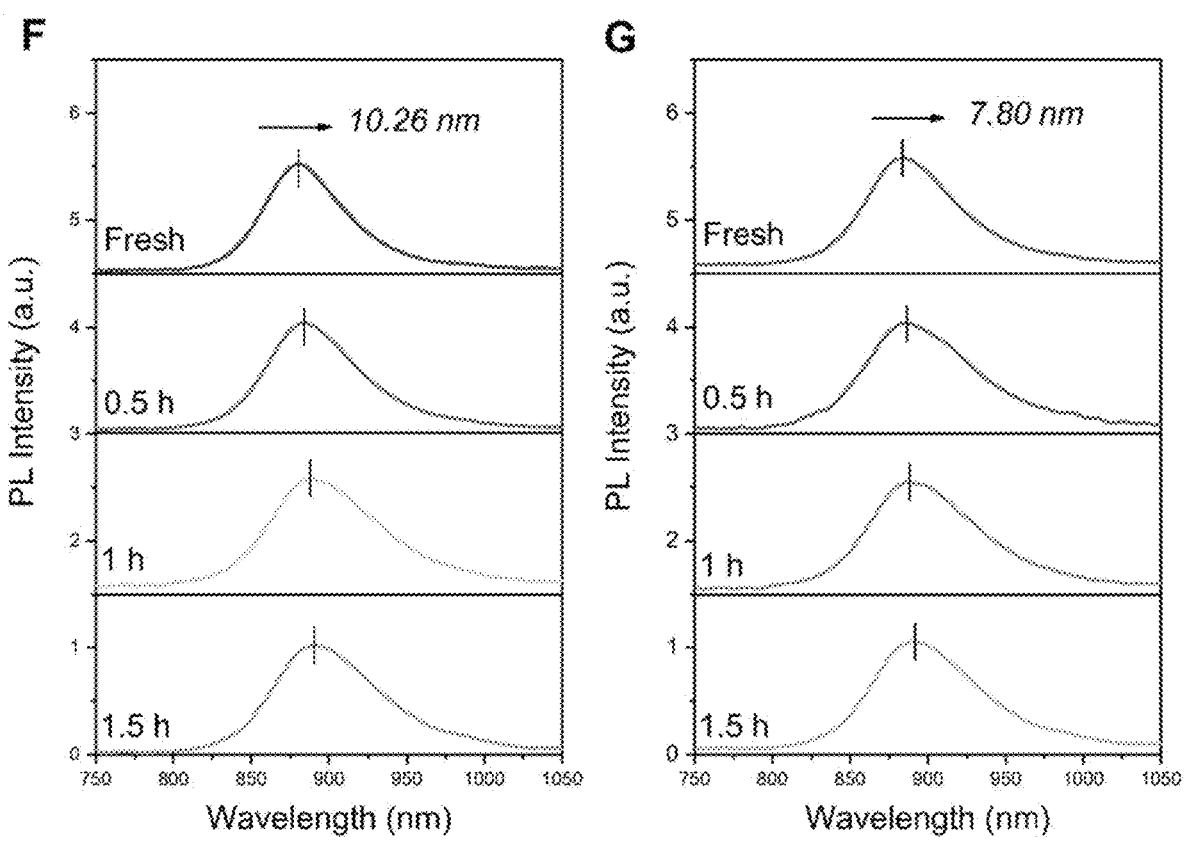

FIG. 5. Photovoltaic performance and stability (A) Schematic diagram of the energy band levels. (B) J-V curves of the control (purple), $Sn^0$-incorporated (blue) and $Sn^0$—$Eu^{2+}$ incorporated (red) PSCs. (C) J-V curves, steady-state $J_{SC}$ and maximum power output (measured at a bias of 0.62 V under 100 mW cm$^{-2}$ AM 1.5G irradiation) of the $Sn^0$—$Eu^{2+}$ incorporated device. (D) Statistical distribution of PCE for control, $Sn^0$-incorporated, and $Sn^0$—$Eu^{2+}$ incorporated PSCs based on 15 devices. (E) The schematic diagram of fluorescence measurement. (F and G) Normalized PL spectra of the $Sn^0$-incorporated and $Sn^0$—$Eu^{2+}$ incorporated perovskite films under different illumination time.

Figure 6:
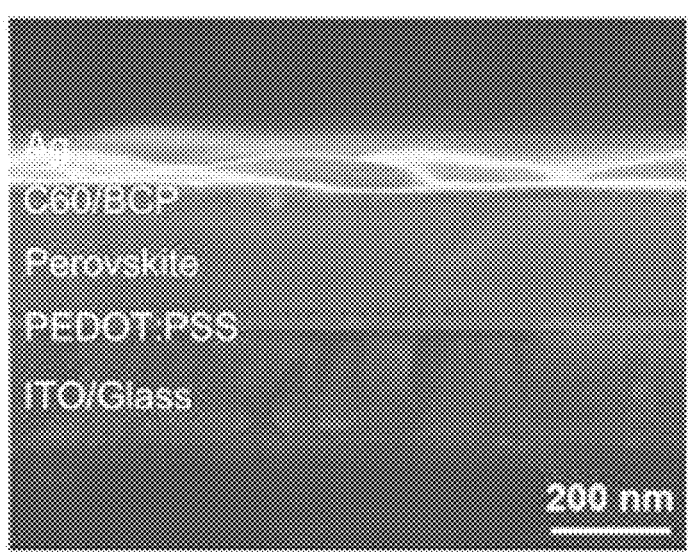
Figure 6:
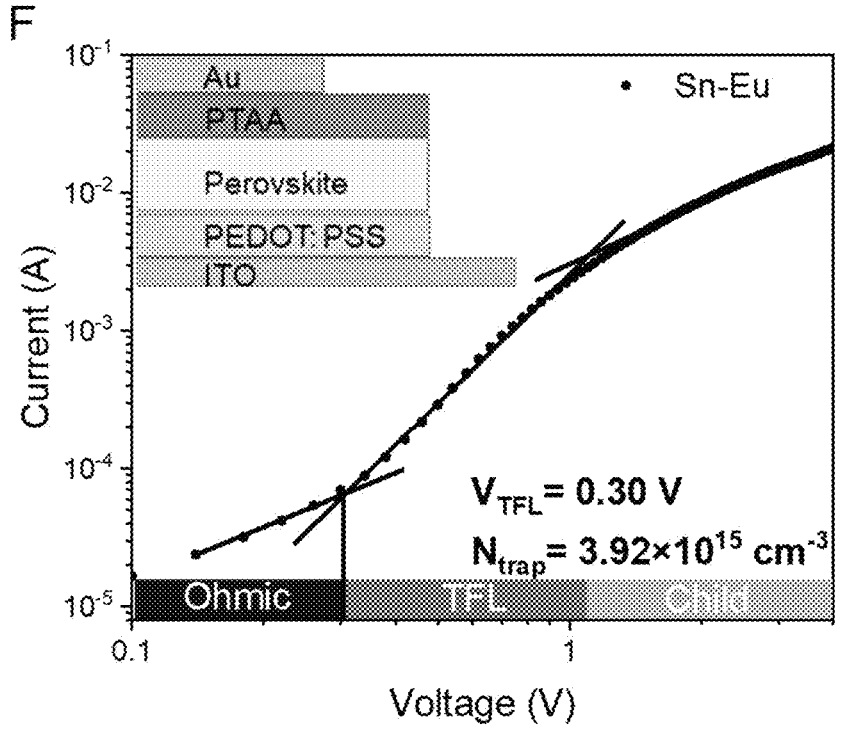

FIG. 6. Recombination mechanism in devices (A) Dark J-V curves of the PSC devices. (B) Nyquist plots of the PSC devices. (C) Cross-section SEM image of $FASnI_3$ device. (D, E and F) J-V with the construction characteristics of hole-only devices of ITO/PEDOT:PSS/Perovskites/PTAA/ Au for space charge limited current measurement.

Figure 7:
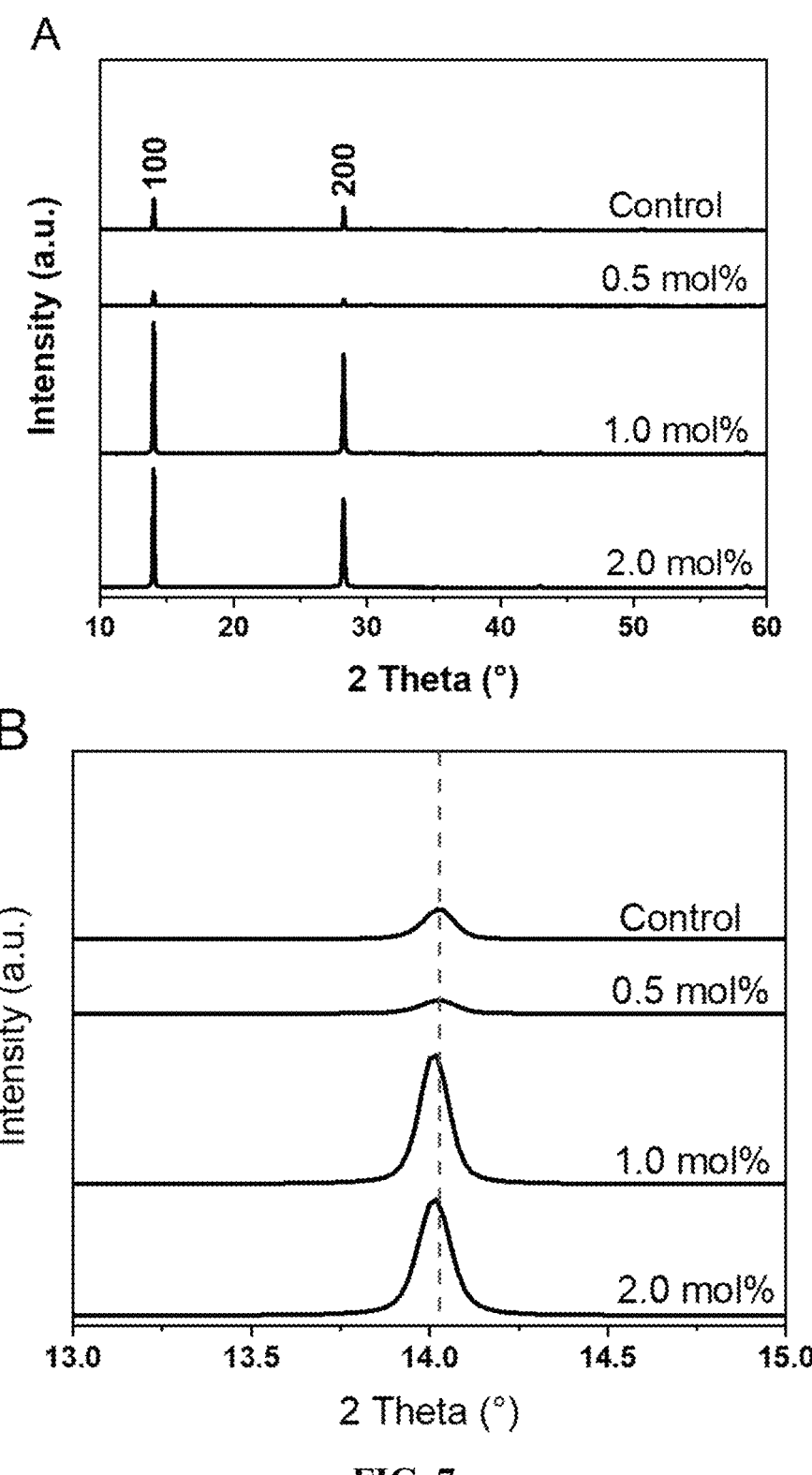
Figure 7:
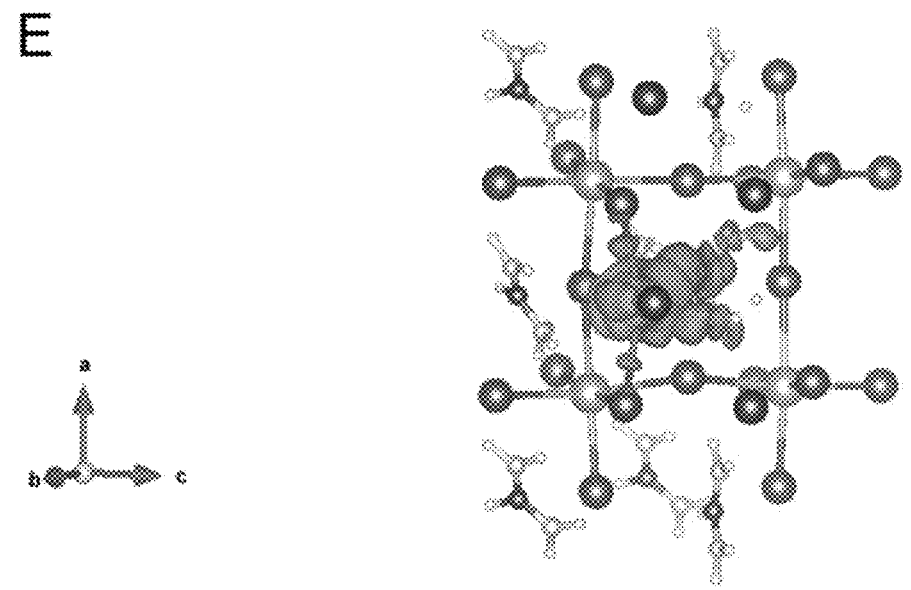

FIG. 7. Optimization of $Eu^{2+}$-incorporated sample concentration (0, 0.5, 1, 2 mol %): (A) XRD patterns of perovskite films w/o and with different amounts of $EuI_2$. (B) Zoomed-in XRD patterns of corresponding patterns in the regions of 13.0-15.0°. (C) Variation of (100) peak position and FWHM with doping concentration. (D) Williamson-Hall plot showing the variation of relative strain (slope of the fitted curve) with different concentration of $EuI_2$ dopants. (E) Difference charge density was calculated using a denser Γ-centered 12×16×16 k-point mesh.

Figure 8:
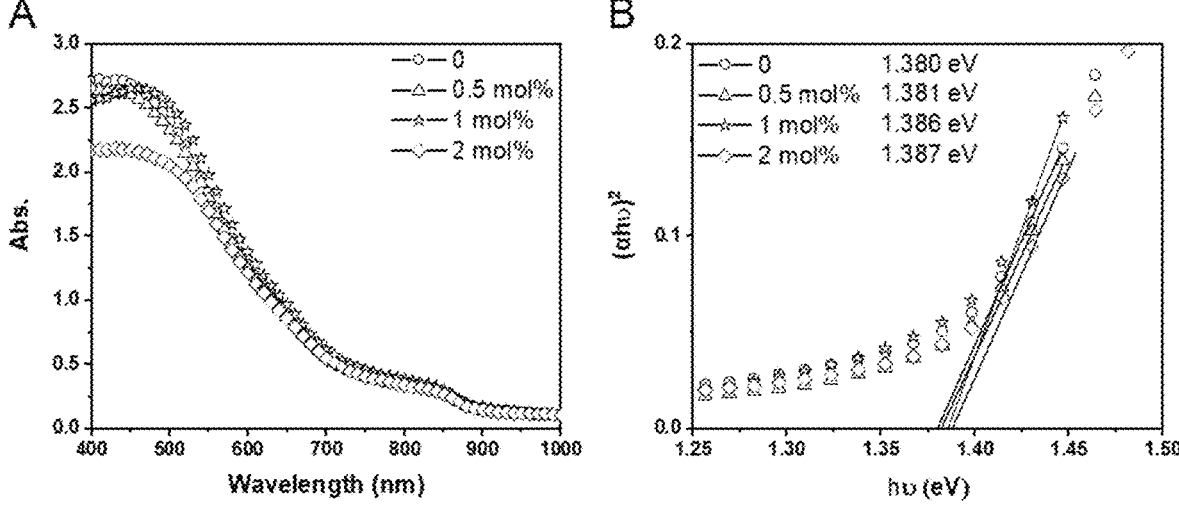
Figure 8:
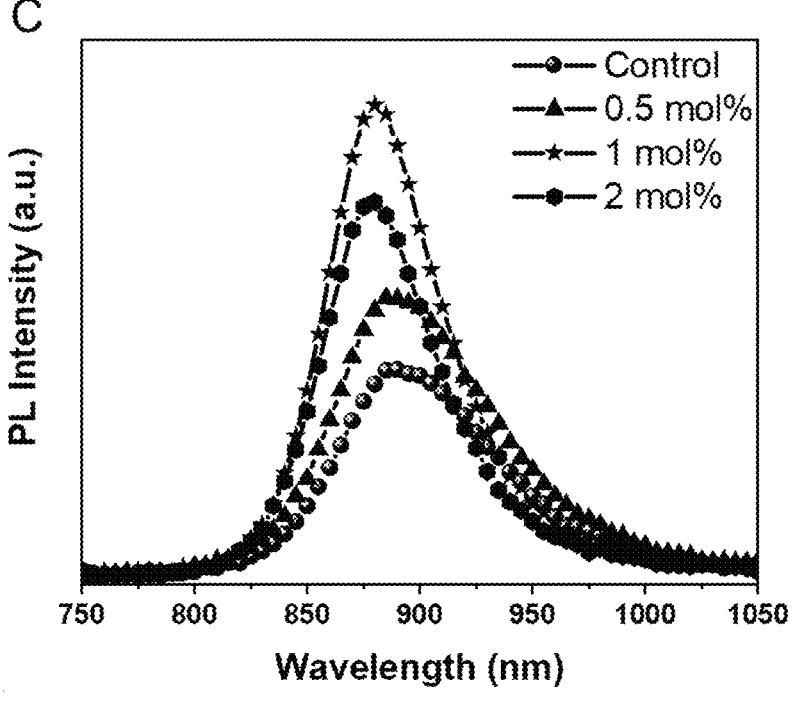

FIG. 8. (A) UV-vis absorption spectra. (B) Tauc plots calculated by the absorption spectra. (C) steady-state PL spectra of perovskite films w/o and with different amounts of $EuI_2$.

Figure 9:
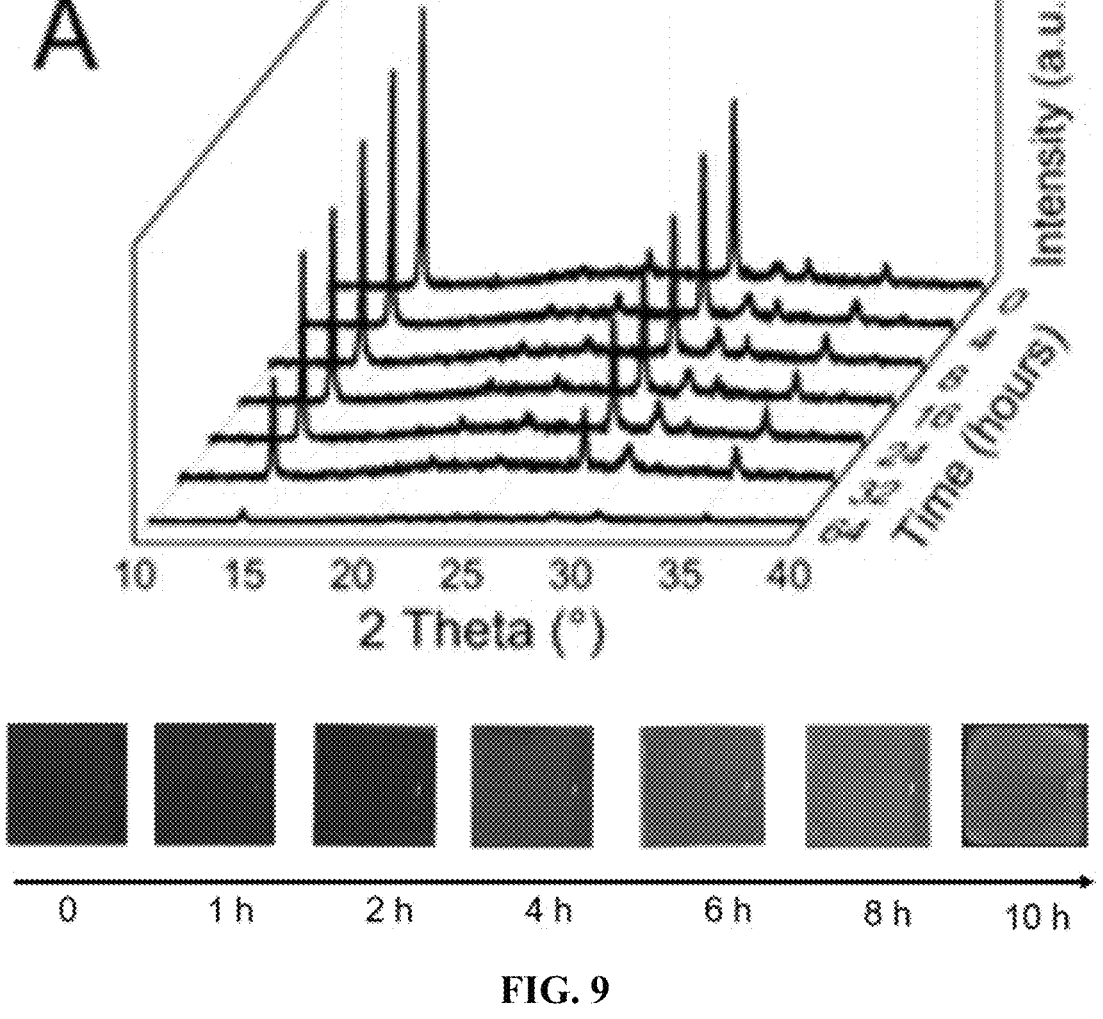
Figure 9:
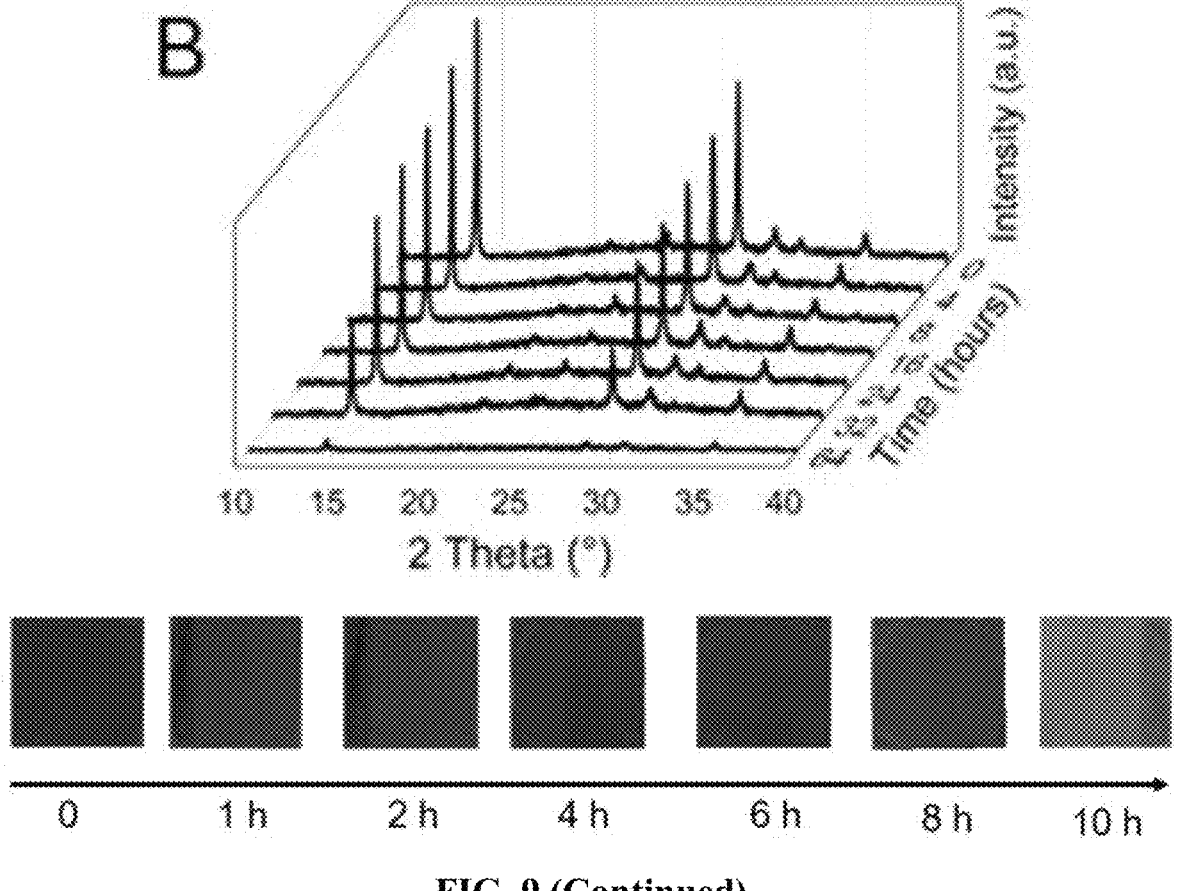
Figure 9:
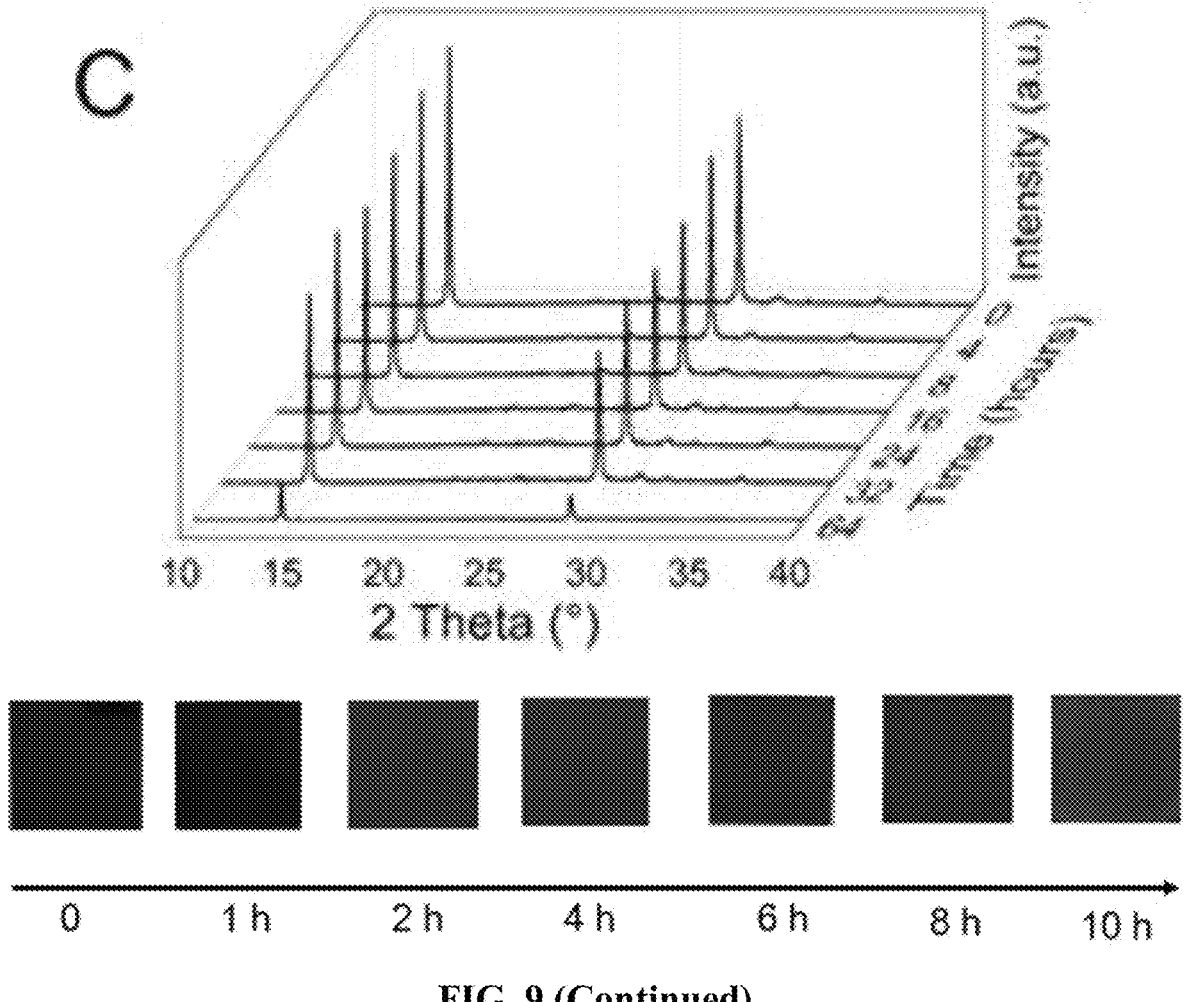

FIG. 9. Air stability measurement of (A) control, (B) $Sn^0$-incorporated and (C) $Sn^0$—$Eu^{2+}$ incorporated thin films: The perovskite films without encapsulation were placed in ambient air for 0, 1, 2, 4, 6, 8 and 10 hours at relative temperature 23±3° C. and relative humid 25=5%. The images on the right showed the aging process. The $Sn^0$—$Eu^{2+}$ incorporated film did not only display the strongest diffraction, but also retained the diffraction intensity and film color for a longtime. In contrast, the control and $Sn^0$-incorporated films performed relatively lower peak intensity and inferior stability. After the storage of 64 hours, the peak intensity rapidly weakened.

FIG. 10. Air stability measurement of precursor solutions (A, C, E correspond to fresh solutions; B, D, F correspond to aged solutions): Three bottles of precursor solution were exposed to ambient air conditions for two months at a relative temperature of 23±3° C. and a relative humidity of 25±5%. Corresponding photographs of the solutions and SEM images are presented in the inset. The films prepared from the fresh solution exhibited relatively strong diffraction intensity and featured uniform grains with clear boundaries. However, after two months, the solution w/o $Sn^0$-w/o $EuI_2$ turned from yellow to red, and the corresponding SEM image displayed a flocculent shape, indicating the appearance of the $SnI_4$, as evidenced by the XRD pattern. In contrast, the samples incorporated with $Sn^0$ and $Sn^0$—$Eu^{2+}$ showed higher $FASnI_3$ diffraction intensity and maintained a pristine perovskite morphology, along with the corresponding solutions retaining their yellow color.

Figure 11:
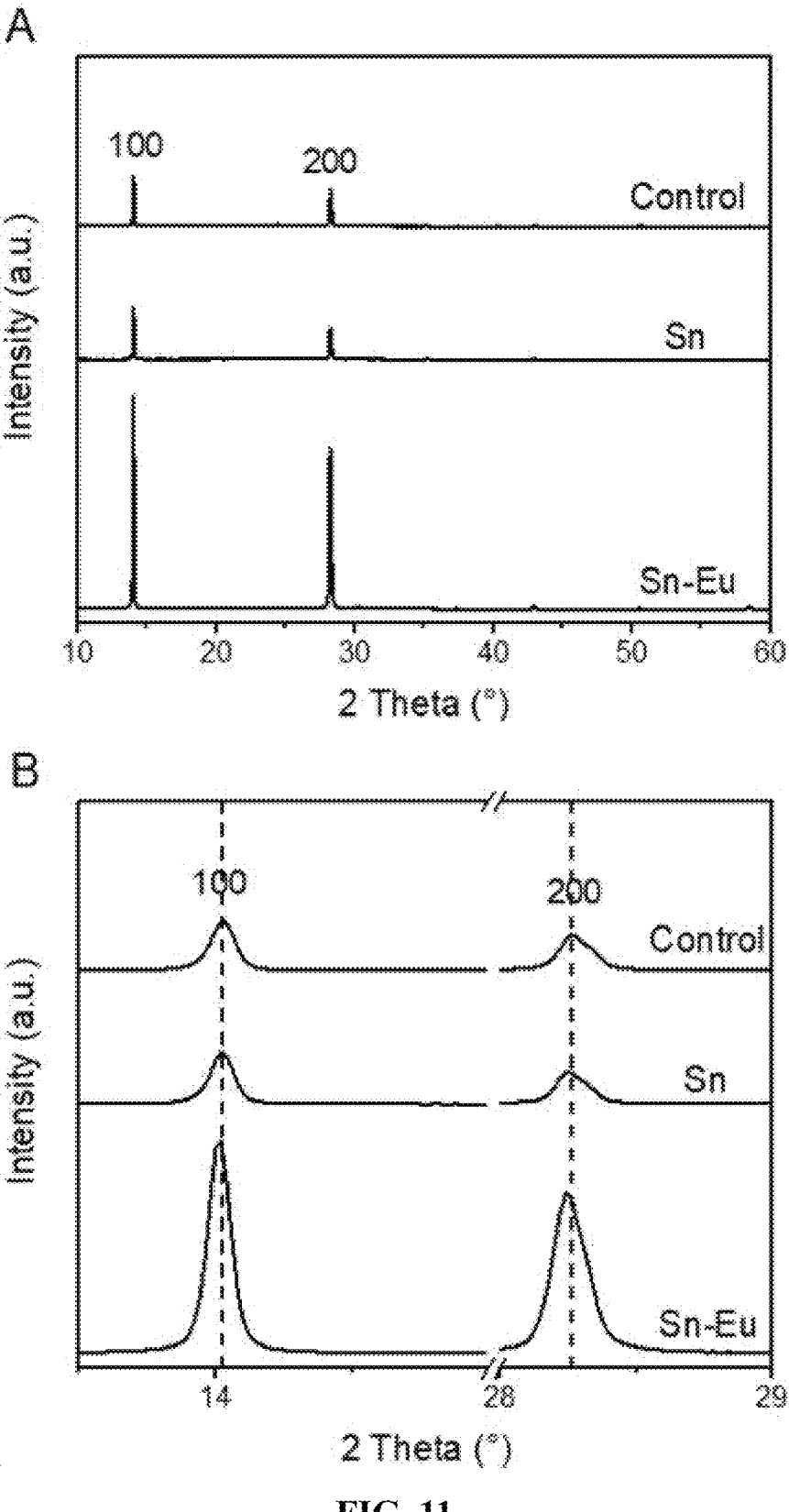

FIG. 11. (A) XRD patterns of perovskite films on PEDOT: PSS-coated substrates. (B) Zoomed-in XRD patterns of corresponding patterns in the regions of 13.5-29.0°.

FIG. 12. Potential of hydrogen (PH) test: We dripped pure DMSO; $Sn^0$-$FASnI_3$; $Sn^0$—$Eu^{2+}$-$FASnI_3$ solutions onto the PH test paper and compared them with the standard color card. Obviously, the PH-value of $FASnI_3$ perovskite precursor is less than 7, indicating that the solution is acidic which is beneficial to stabling $Sn^{2+}$.

Figure 13:
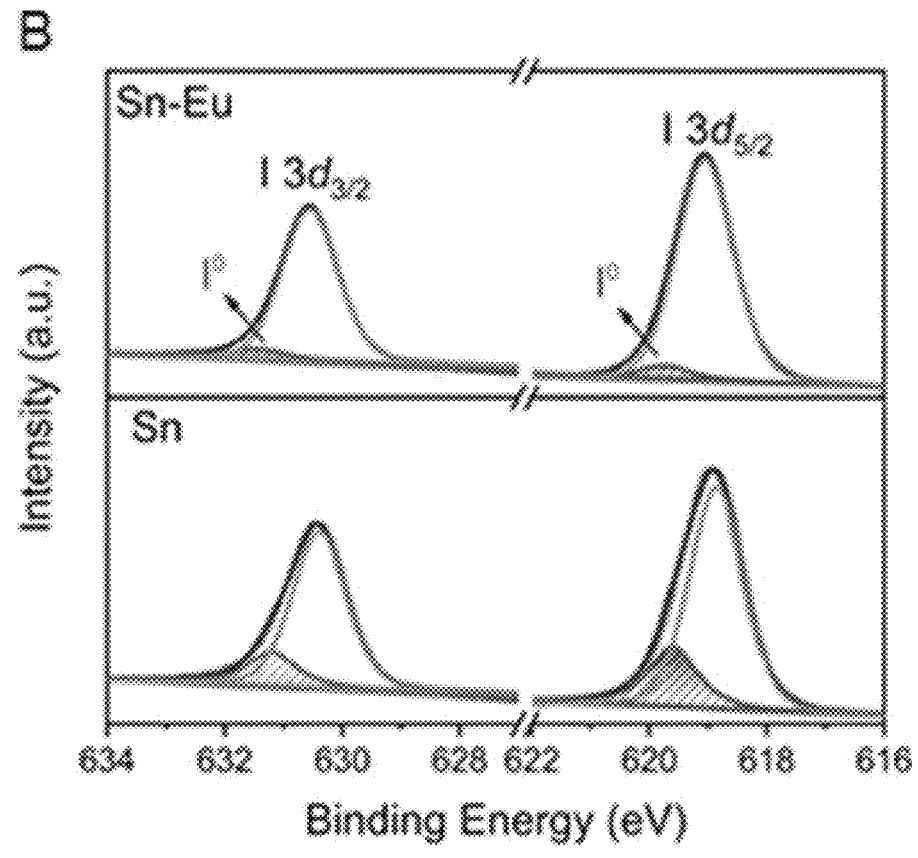

FIG. 13. High-resolution XPS spectra of (A) Sn 3d and (B) I 3d for the $Sn^0$—$Eu^{2+}$ incorporated (upper) and $Sn^0$-incorporated (lower) perovskite films, the films were exposed to the air for 5 hours.

Figure 14:
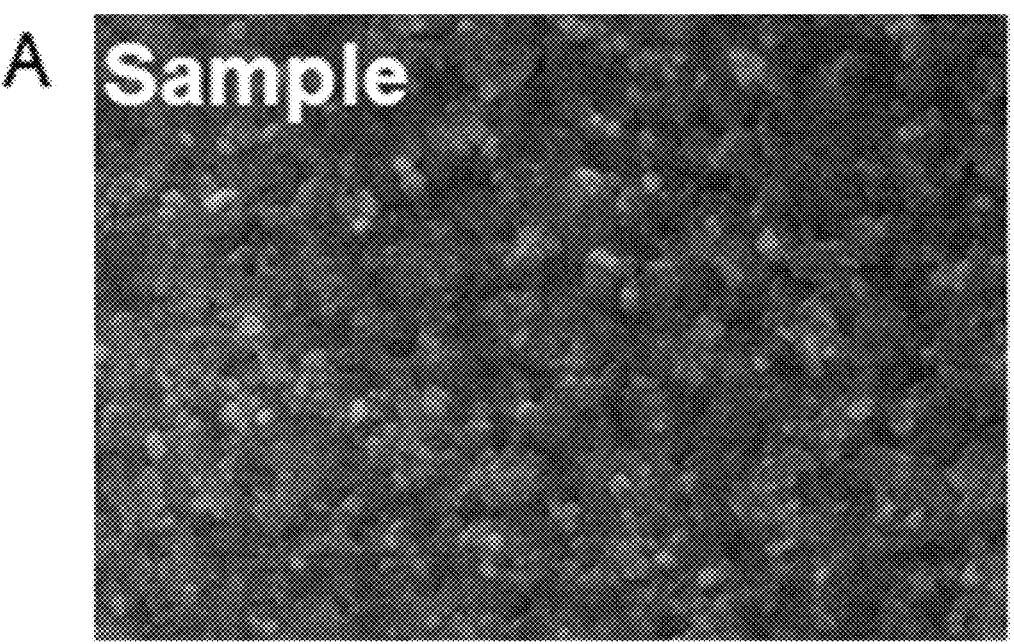
Figure 14:
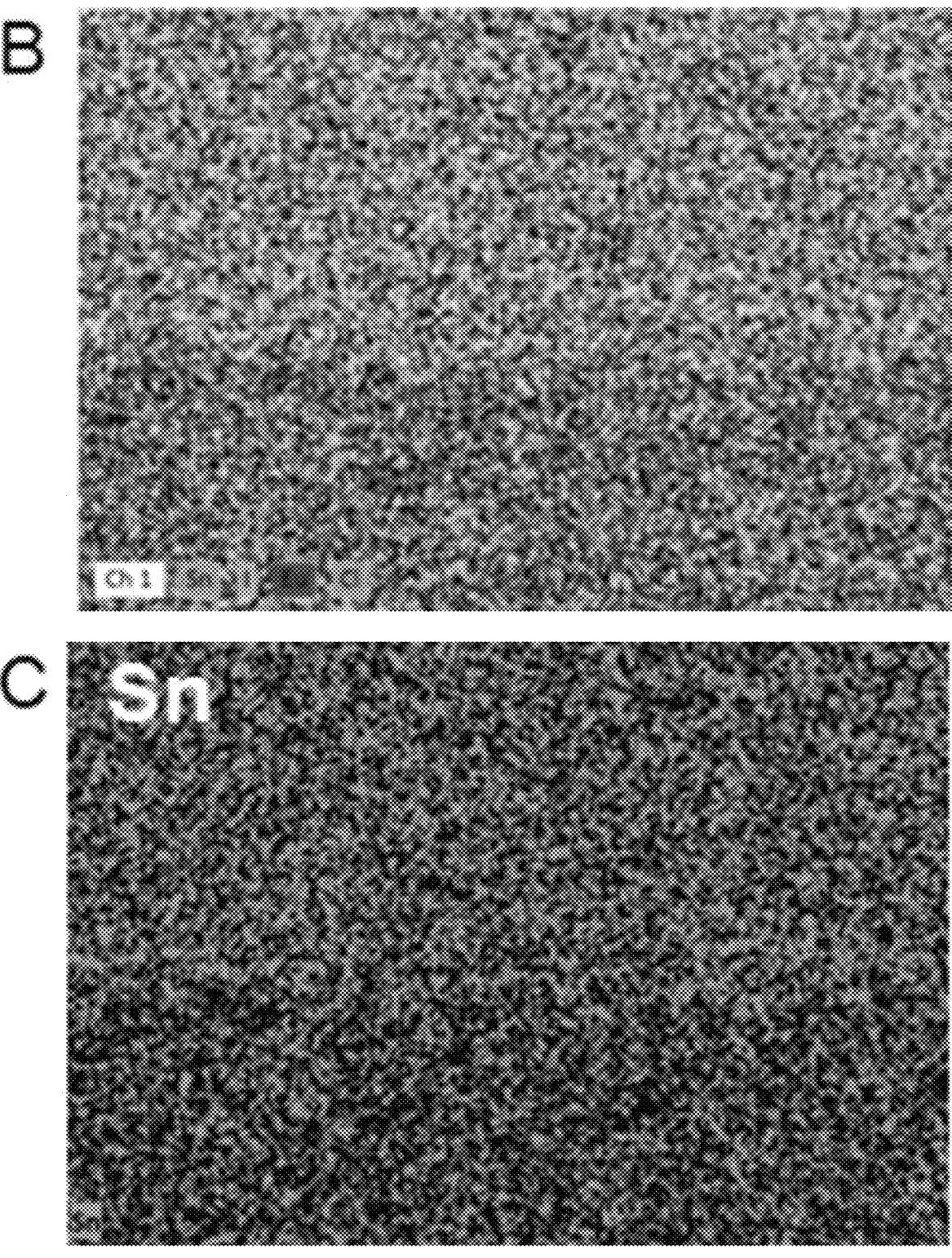
Figure 14:
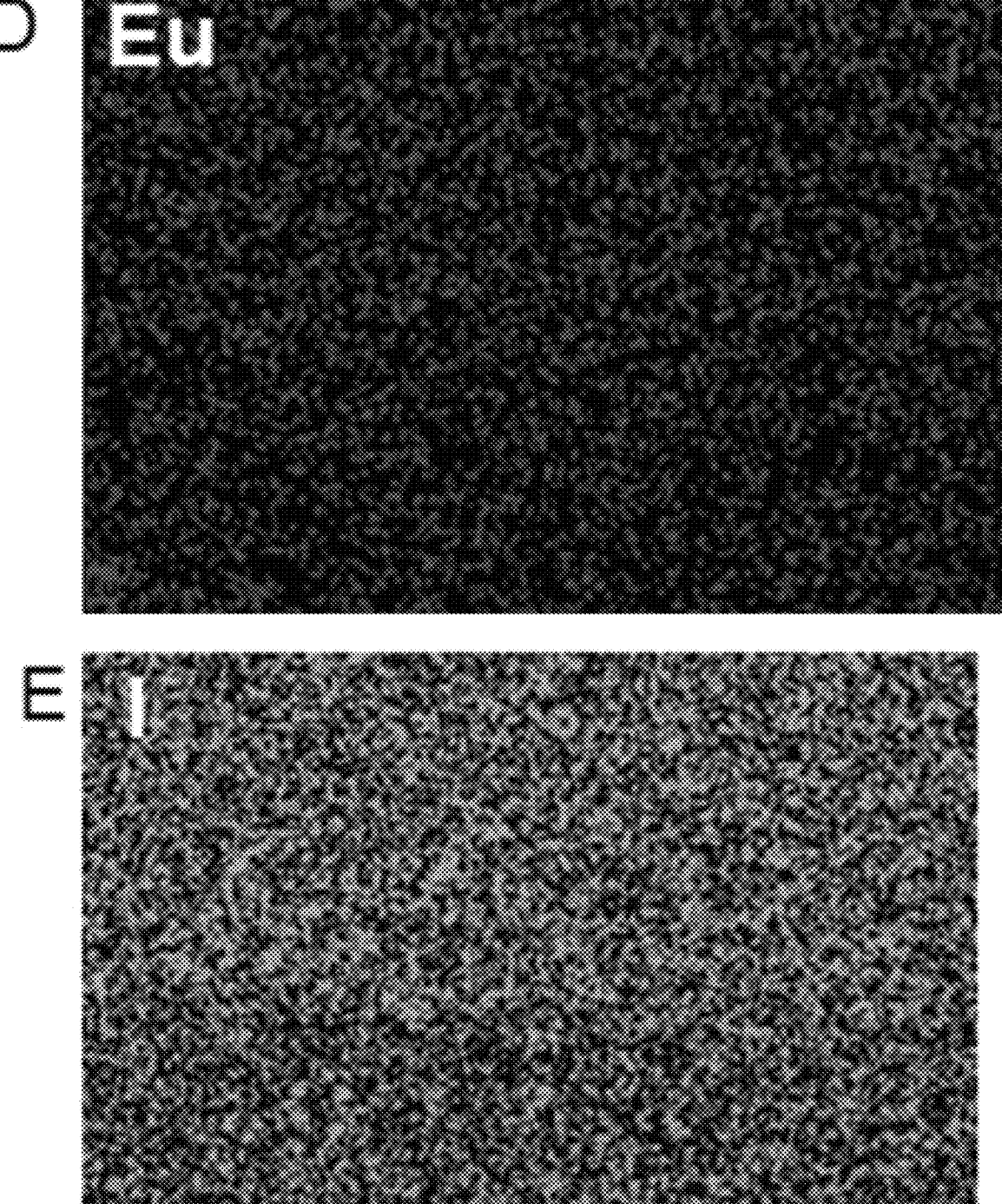
Figure 14:
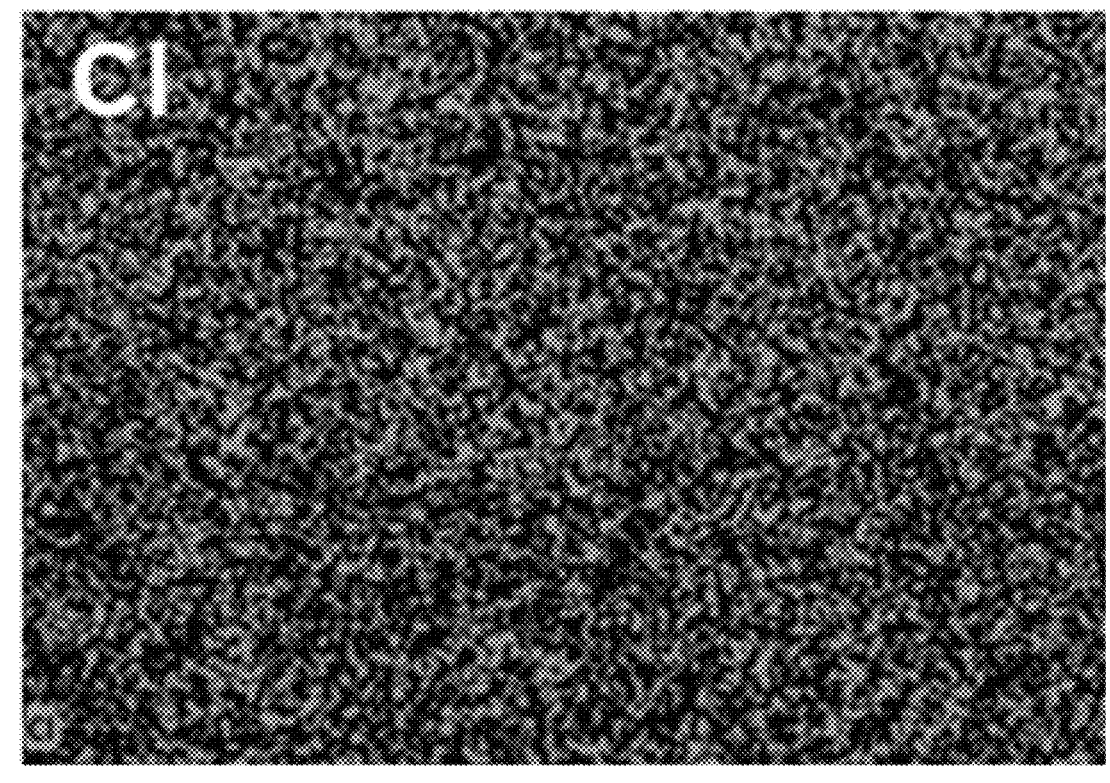

FIG. 14. (A) SEM and (B-F) element distribution mapping of $Sn^0$—$Eu^{2+}$ incorporated $FASnI_3$ perovskite film showed the distribution of (C) Sn, (D) Eu, (E) I, (F) Cl elements; Also, the energy-dispersive X-ray spectroscopy (EDS) of $Sn^0$—$Eu^{2+}$ incorporated $FASnI_3$ perovskite thin film (G) and corresponding summary of elemental compositions (H) proved the aforementioned elements.

Figure 15:
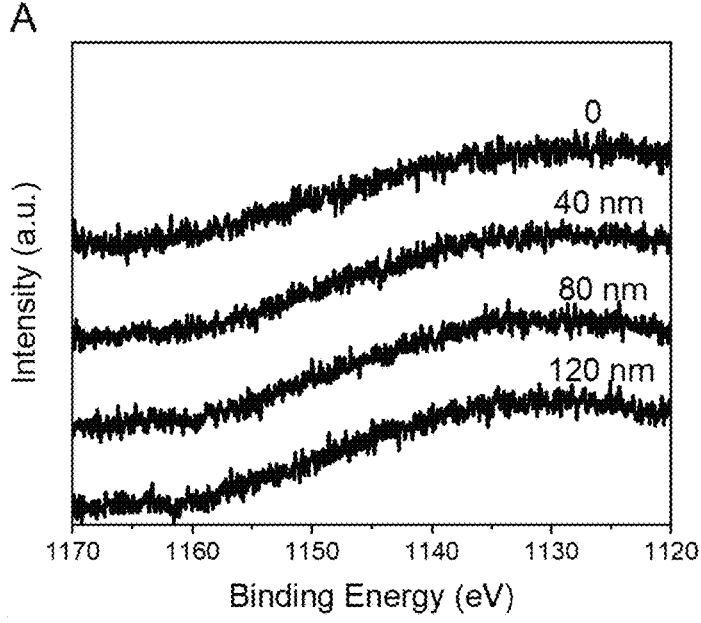
Figure 15:
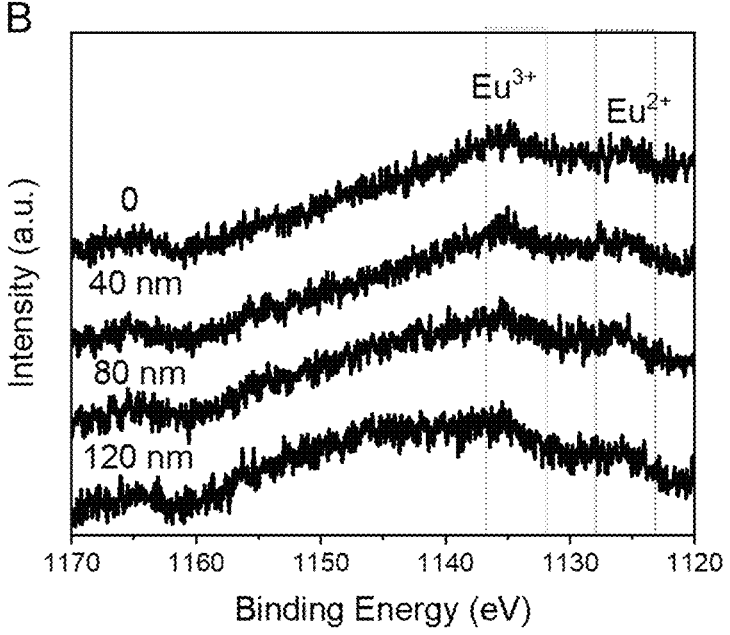

FIG. 15. Depth-dependent XPS spectra for Eu 3d, the films were etched by argon ($Ar^+$) ions at a depth of 0, 40, 80, 120 nm. (A) $Sn^0$-incorporated sample and (B) optimized 1 mol % $Sn^0$—$Eu^{2+}$ incorporated sample.

Figure 16:
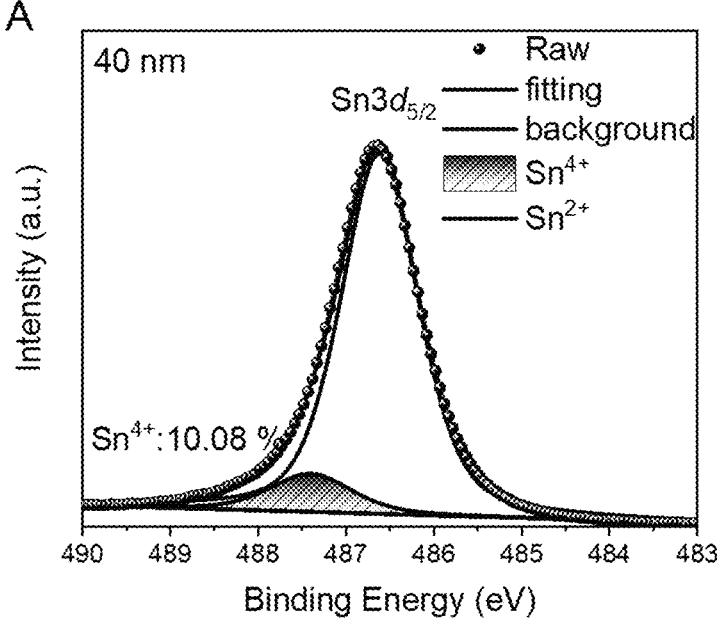
Figure 16:
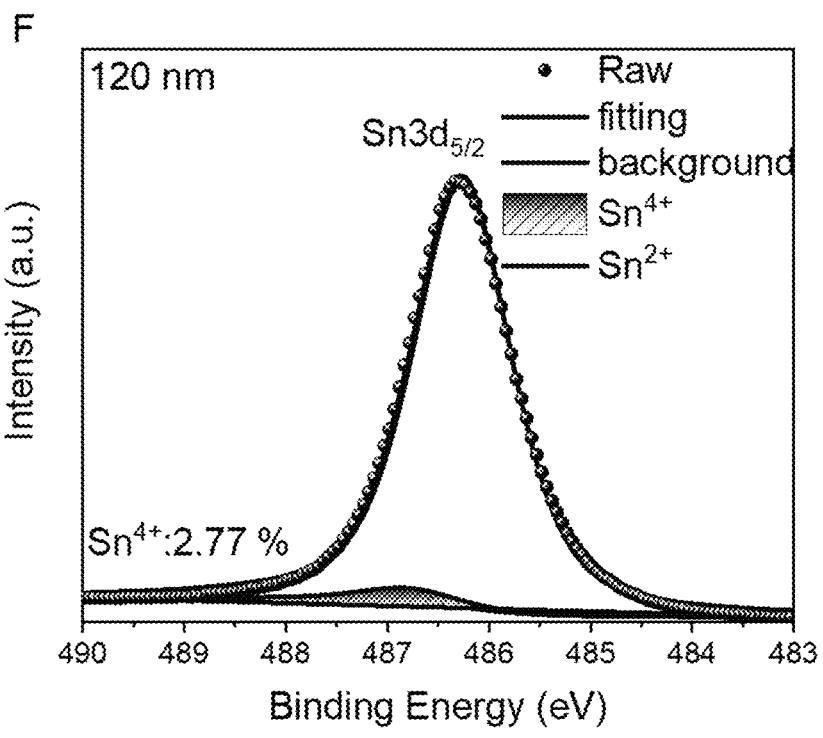

FIG. 16. Depth-profile XPS of (A-C) $Sn^0$-incorporated and (D-F) $Sn^0$—$Eu^{2+}$ incorporated $FASnI_3$ thin film for Sn $3d_{5/2}$.

Figure 17:
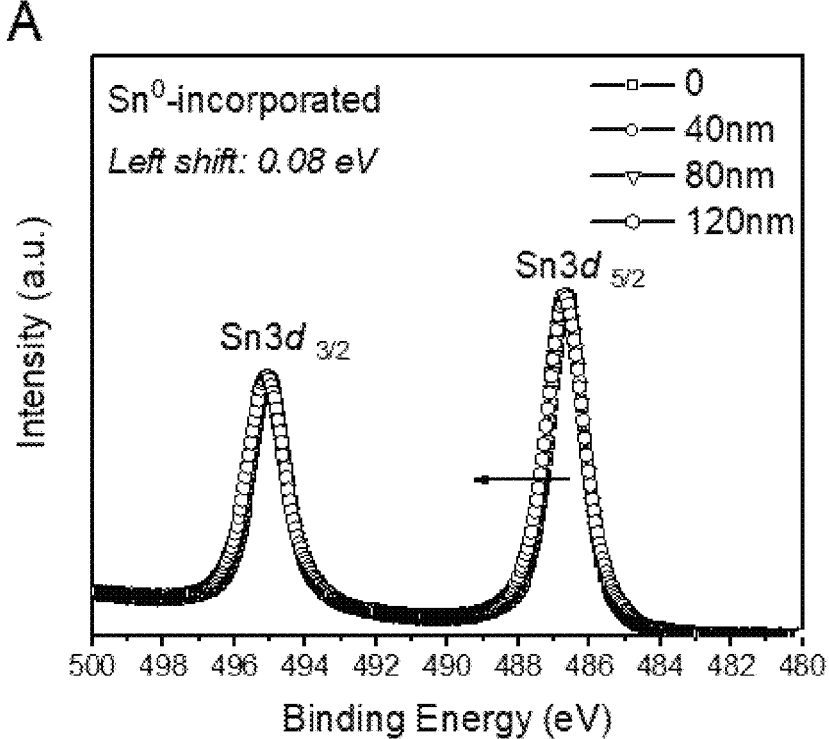
Figure 17:
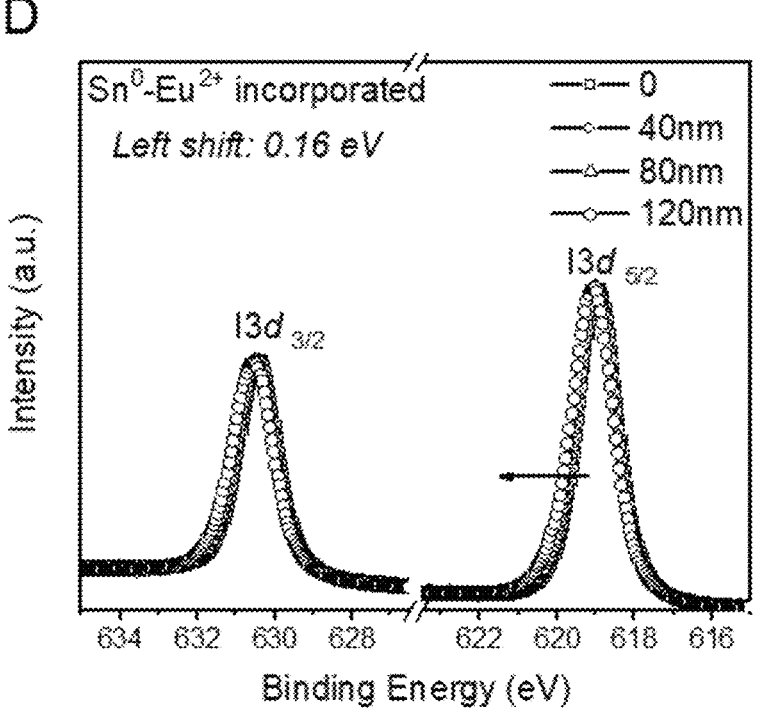

FIG. 17. Depth-profile XPS of (A, C) $Sn^0$-incorporated and (B, D) $Sn^0$—$Eu^{2+}$ incorporated $FASnI_3$ thin film for Sn 3d and I 3d. (etched by argon ions for 0, 40, 80, 120 nm).

FIG. 18. Time-resolved PL spectra of the Sn-perovskite thin films deposited on glass (A) and deposited on PEDOT: PSS (B).

Figure 19:
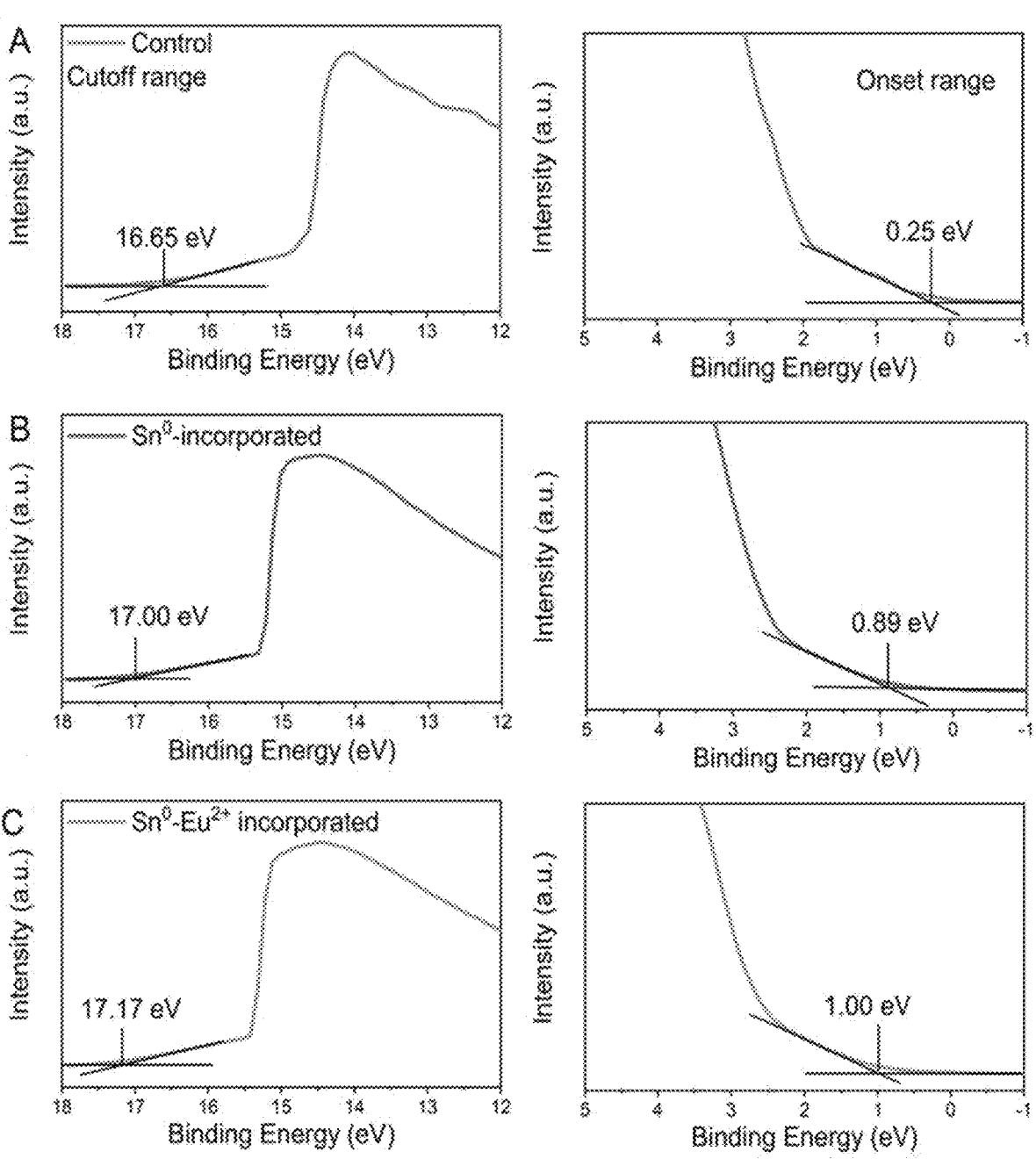

FIG. 19. Ultraviolet photoelectron spectroscopy (UPS) spectra of (A) control, (B) $Sn^0$-incorporated and (C) $Sn^0$—$Eu^{2+}$ incorporated perovskite films.

FIG. 20. Statistical distribution of (A) $V_{OC}$, (B) $J_{SC}$, (C) FF and (D) PCE for control (w/o $Sn^0$-w/o $EuI_2$), Sn ($Sn^0$-incorporated) and Sn—Eu ($Sn^0$—$Eu^{2+}$ incorporated) PSCs based on 15 devices. The top and bottom error bars in the box charts indicate the highest and the lowest values, respectively.

Figure 21:
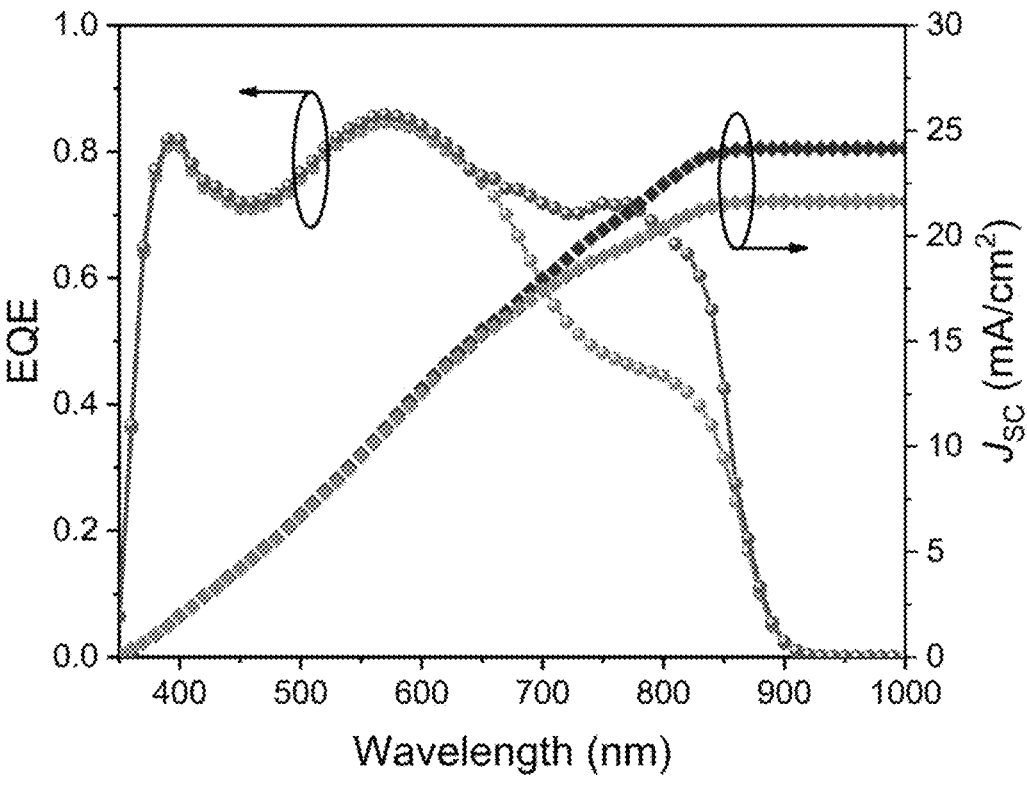

FIG. 21. External quantum efficiency (EQE) of the control and $Sn^0$—$Eu^{2+}$ incorporated $FASnI_3$ devices.

Figure 22:
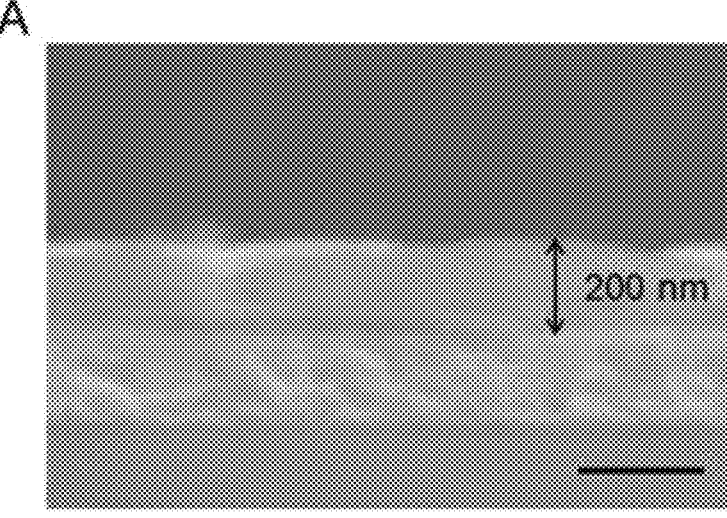
Figure 22:
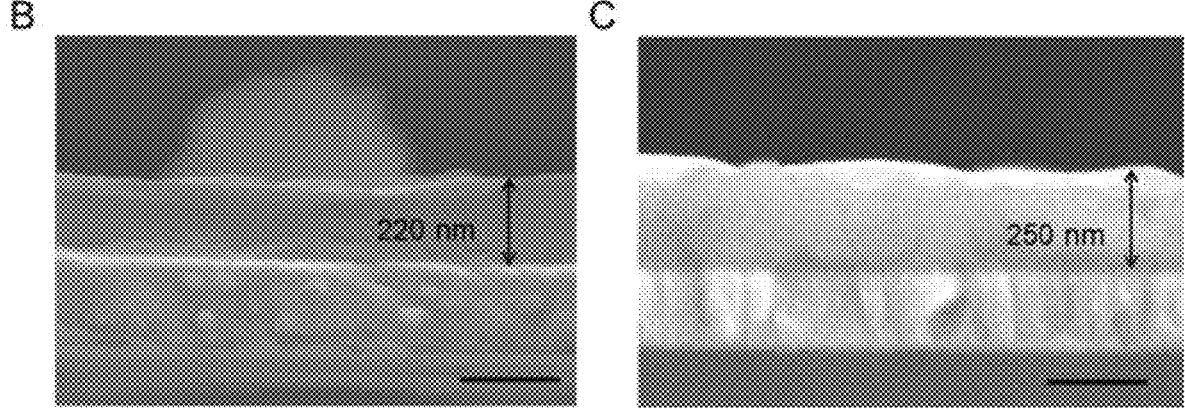

FIG. 22. Cross-section SEM images of (A) control, (B) $Sn^0$-incorporated and (C) $Sn^0$—$Eu^{2+}$ incorporated perovskite films deposited on PEDOT:PSS substrates. The scale bar is 250 nm.

Figure 23:
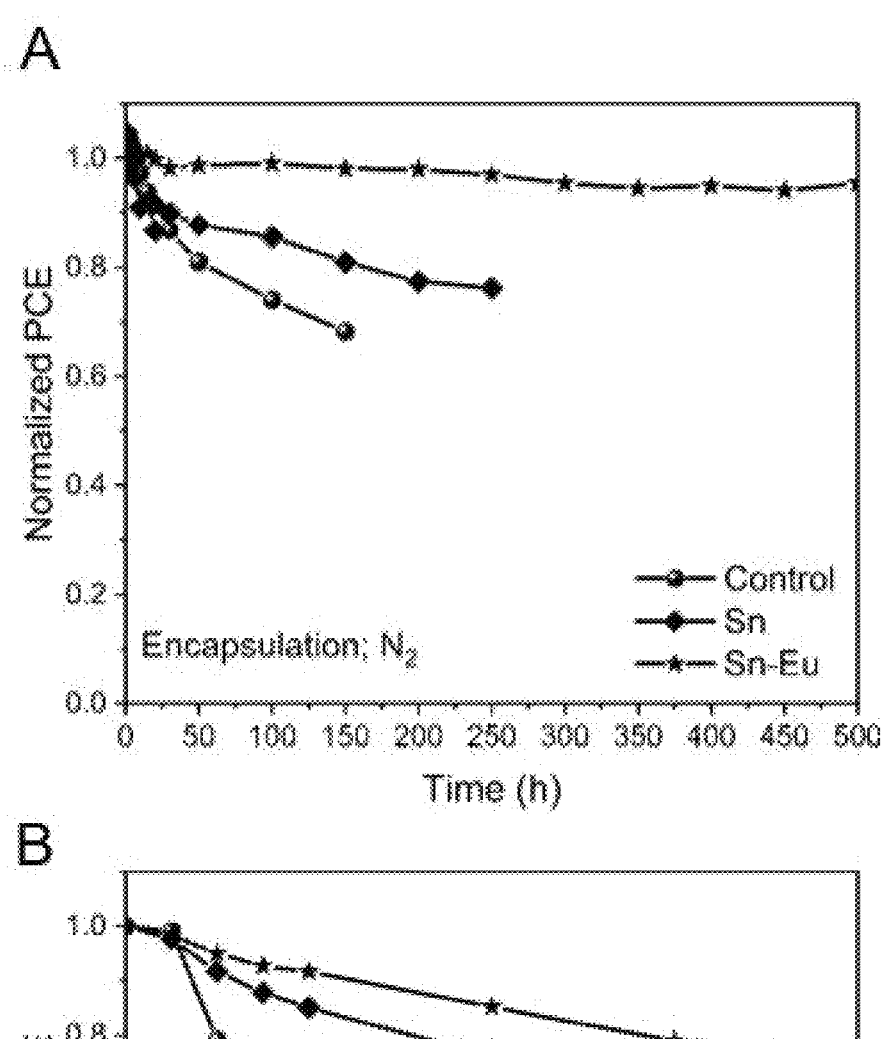

FIG. 23. Stability test: (A) Three samples were stored a nitrogen atmosphere; (B) Three samples were exposed to the air for measurement (25±5% relative humidity and 23±33° C.

Figure 24:
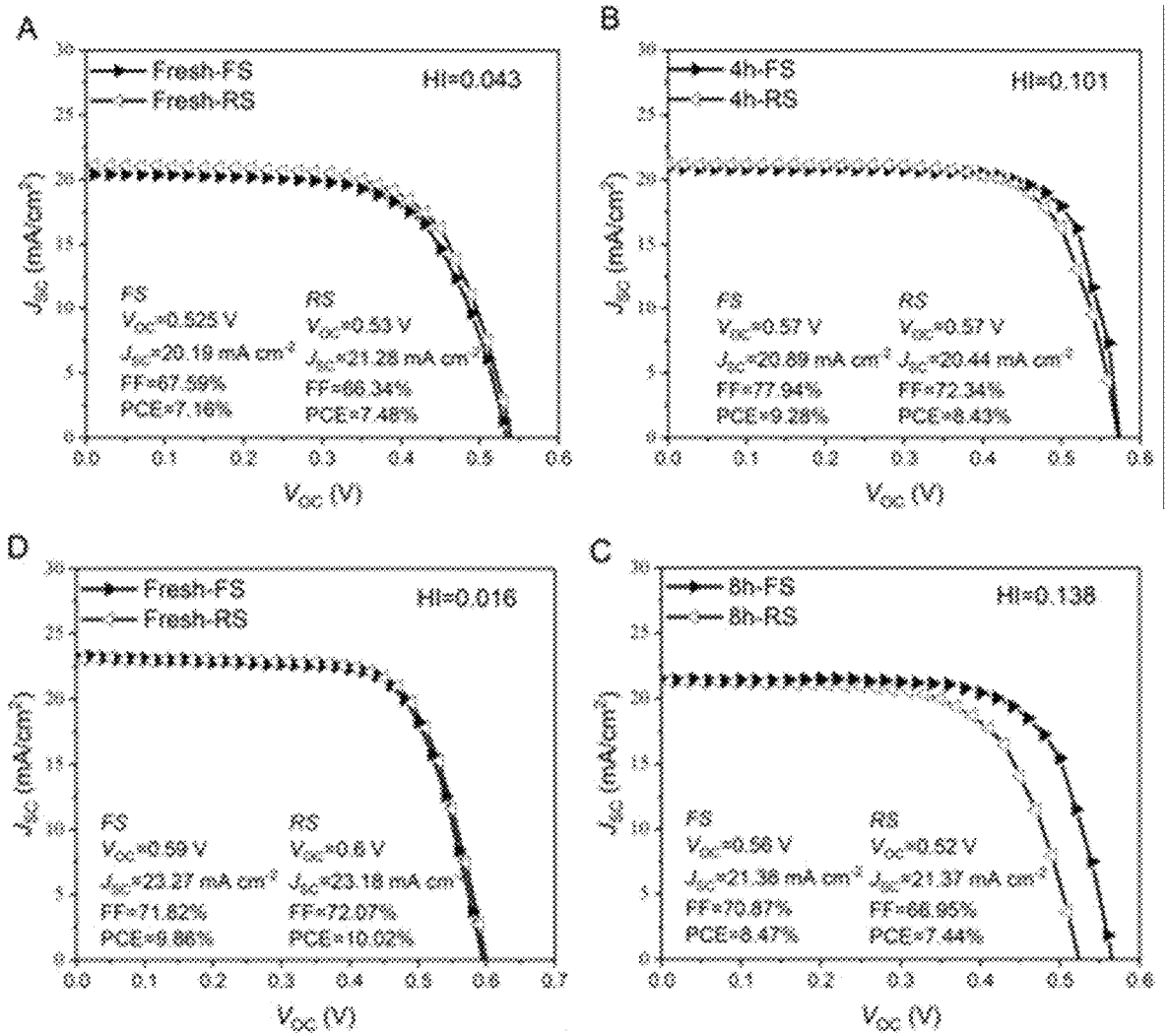
Figure 24:
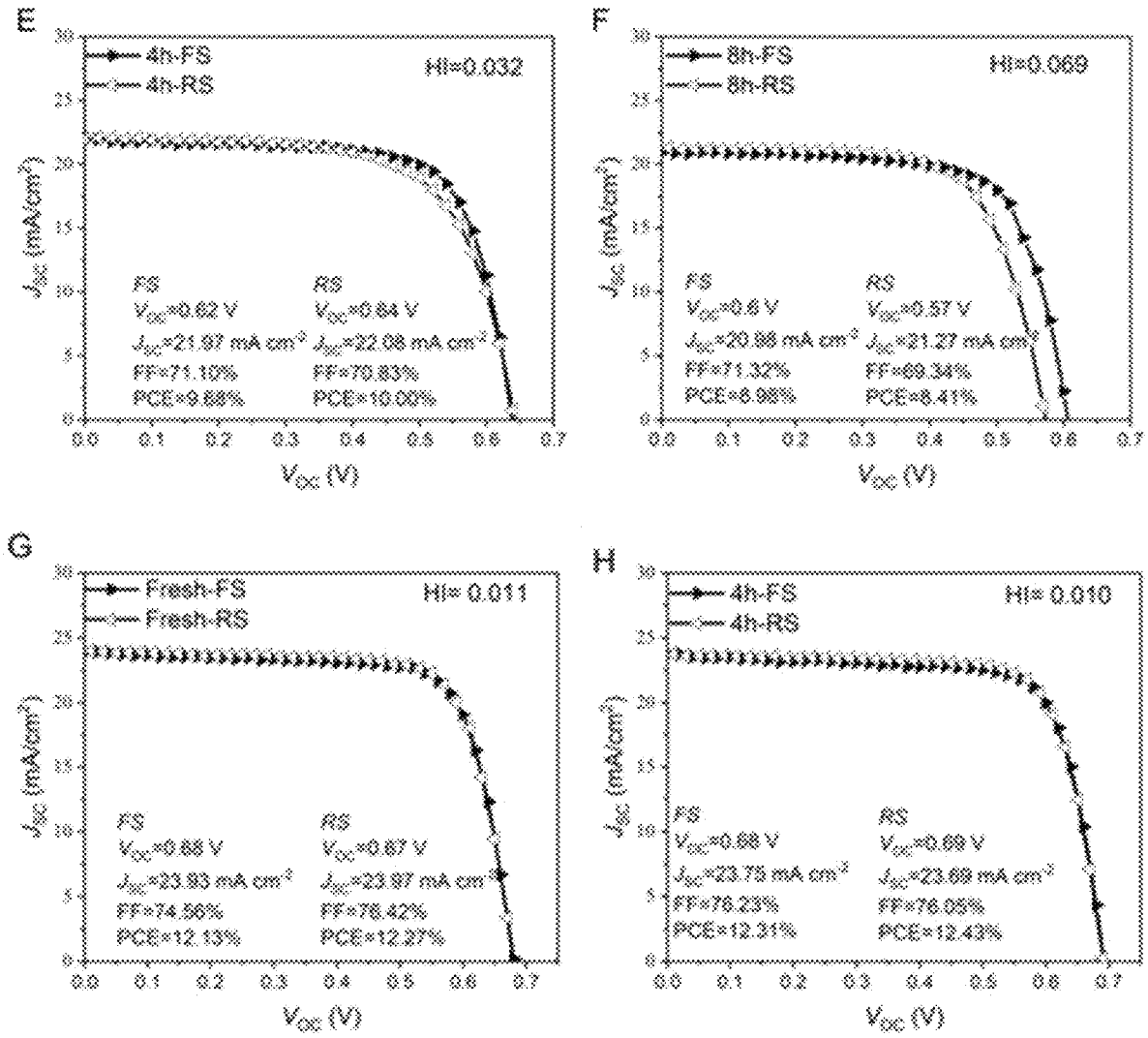

FIG. 24. J-V curves of the (A-C) control, (D-F) $Sn^0$-incorporated and (G-I) $Sn^0$—$Eu^{2+}$ incorporated $FASnI_3$ devices, which were exposed to the AM 1.5G illumination in the glove box for checking ion migration.

Figures 24, 25, 26:
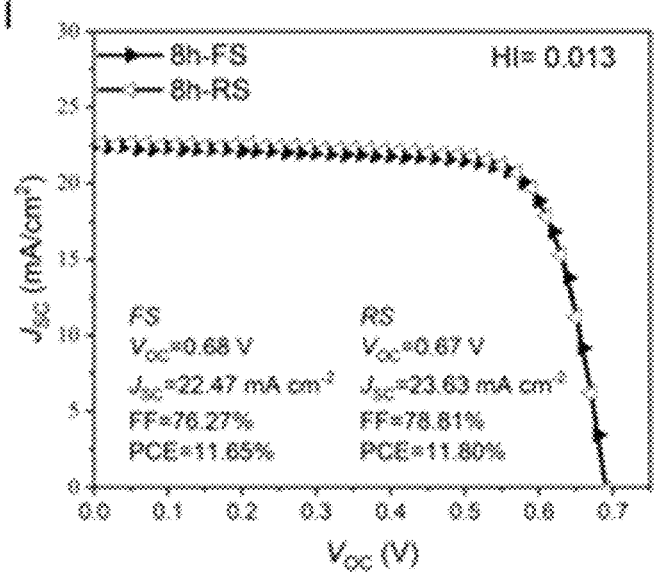

FIG. 25. The calculation of lattice parameters. The increased lattice volume from 916.2642 to 920.8437 $Å^3$ when europium occupied at the interstitial-site demonstrated the lattice expansion.

FIG. 26. Charge transfer calculated from Bader.

FIG. 27. The electron transfer reactions and corresponding standard reduction potential ($E^0$) and Gibbs free energy ($\Delta G^0$) in the acid $FASnI_3$ precursor. ($\Delta G^0$=−$nFE^0$, where n is the number of electrons transferred in the reaction and F is the Faraday constant, the value is 9.6485×10^4 C/mol).

FIG. 28. PL decay lifetimes ($\tau_1$, $\tau_2$ and $\tau$) of perovskite films without and with $Sn^0$—$Eu^{2+}$ doping based on glass substrates. The quoted formula is $\tau=\tau_1\times Rel_1$ (%)+$\tau_2\times Rel_2$ (%).

Figure 29:
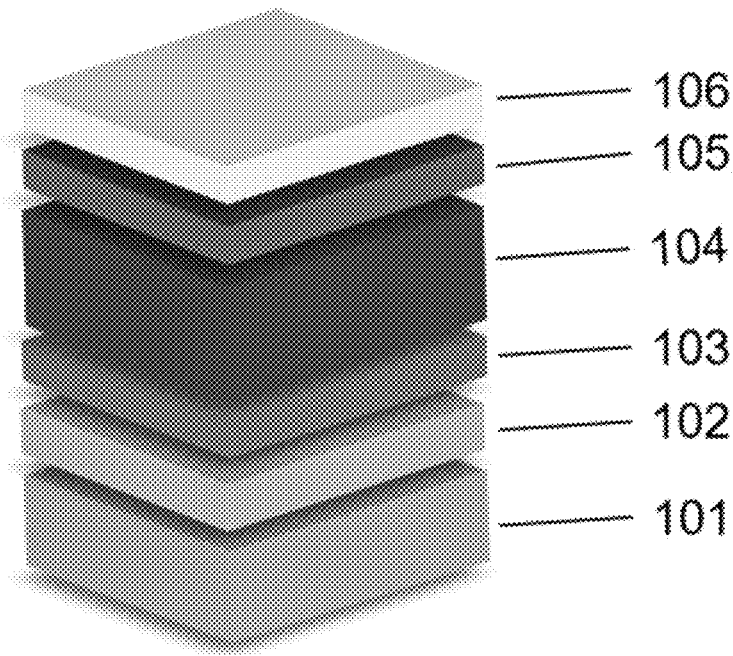

FIG. 29 depicts device the structure of an exemplary optoelectronic device comprising the perovskite described herein in accordance with certain embodiments, wherein the optoelectronic device includes a substrate layer (101); a transparent conductive layer (102); a hole-transport layer (103); a perovskite functional layer (104); an electron-transport layer (105); and a metal electrode (106).

DETAILED DESCRIPTION

Definitions

The following terms shall be used to describe the present invention. In the absence of a specific definition set forth herein, the terms used to describe the present invention shall be given their common meaning as understood by those of ordinary skill in the art.

Throughout the present specification, unless the context requires otherwise, the word "comprise" or variations such as "comprises" or "comprising", will be understood to imply the inclusion of a stated integer or group of integers but not the exclusion of any other integer or group of integers. It is also noted that in this disclosure and particularly in the claims and/or paragraphs, terms such as "comprises", "comprised", "comprising" and the like can have the meaning attributed to it in U.S. Patent law; e.g., they can mean "includes", "included", "including", and the like; and that terms such as "consisting essentially of" and "consists essentially of" have the meaning ascribed to them in U.S. Patent law, e.g., they allow for elements not explicitly recited, but exclude elements that are found in the prior art or that affect a basic or novel characteristic of the present invention.

Furthermore, throughout the present specification and claims, unless the context requires otherwise, the word "include" or variations such as "includes" or "including", will be understood to imply the inclusion of a stated integer or group of integers but not the exclusion of any other integer or group of integers.

The use of the singular herein includes the plural (and vice versa) unless specifically stated otherwise. In addition, where the use of the term "about" is before a quantitative value, the present teachings also include the specific quantitative value itself, unless specifically stated otherwise. As used herein, the term "about" refers to a ±10%, ±7%, ±5%, ±3%, ±1%, or ±0% variation from the nominal value unless otherwise indicated or inferred.

The present disclosure provides a perovskite comprising $Sn^{2+}$ and $Eu^{2+}$.

$Eu^{2+}$ and $Sn^{2+}$ can be present in the perovskite at a molar ratio of 0.01:99.99 to 10:90, 0.01:99.99 to 9:91, 0.01:99.99 to 8:92, 0.01:99.99 to 7:93, 0.01:99.99 to 6:94, 0.01:99.99 to 5:95, 0.01:99.99 to 4.5:95.5, 0.01:99.99 to 4:96, 0.01:99.99 to 3.5:96.5, 0.01:99.99 to 3:97, 0.01:99.99 to 2:98, 0.05:99.95 to 2:98.2, 0.5:99.5 to 2:98, 1:99 to 2:98, 1.5:98.5 to 2:98, 0.5:99.5 to 1.5:98.5, 0.5:99.6 to 1:99, 0.6:99.4 to 1.4:98.6, 0.7:99.3 to 1.3:98.7, 0.8:99.2 to 1.2:98.8, or 0.9:99.1 to 1.1:98.9, respectively. In certain embodiments, $Eu^{2+}$ and $Sn^{2+}$ are present in the perovskite at a molar ratio of about 1 to about 99, respectively.

The perovskite can further comprise one or more cations represented by $A^+$, wherein $A^+$ can be selected from the group consisting of $Cs^+$, $Rb^+$, $CH_3NH_3^+$, $CH_3CH_2NH_3^+$, $NH_2CH=NH_2^+$, and $NH_2C(Me)=NH_2^+$. In certain embodiments, $A^+$ is $NH_2C(Me)=NH_2^+$.

The perovskite described herein must be charge balanced. Accordingly, the perovskite can further comprise one or more counter ions that balance the charge of the cationic species. Such counter ions are not particularly limited and can be any anion. Exemplary anions include, but are not limited to $F^-$, $Cl^-$, $Br^-$, $I^-$, and combinations thereof.

In certain embodiments, the perovskite can be represented by the Formula 1:

$$(A^+)(Sn^{2+})(X^-)_3 \cdot m[(Eu^{2+})(Y^-)_2] \qquad 1$$

wherein m is 0.001-0.1;

$X^-$ for each instance is independently $F^-$, $Cl^-$, $Br^-$, or $I^-$;

$Y^-$ for each instance is independently $F^-$, $Cl^-$, $Br^-$, or $I^-$; and $A^+$ is $Cs^+$, $Rb^+$, $CH_3NH_3^+$, $CH_3CH_2NH_3^+$, $H(C=NH_2)NH_2^+$, $Me(C=NH_2)NH_2^+$, or a mixture thereof.

The variable m represents the amount of europium doping in the perovskite described herein and can range from 0.001-0.1, 0.001-0.09, 0.001-0.08, 0.001-0.07, 0.001-0.06, 0.001-0.05, 0.001-0.04, 0.001-0.03, 0.001-0.02, 0.001-0.02, 0.005025-0.0204, 0.0101-0.0204, 0.0152-0.0204, 0.005025-0.0152, 0.00638-0.0142, 0.00753-0.0132, 0.0087-0.0121, 0.0091-0.011, respectively. In certain embodiments, m is about m is about 0.010101. In certain embodiments, m corresponds to a molar ratio of $Eu^{2+}$ and $Sn^{2+}$ of 0.5:99.6 to 1:99, 0.6:99.4 to 1.4:98.6, 0.7:99.3 to 1.3:98.7, 0.8:99.2 to 1.2:98.8, or 0.9:99.1 to 1.1:98.9, respectively.

In certain embodiments, $A^+$ is $H(C=NH_2)NH_2^+$, $Me(C=NH_2)NH_2^+$, or a mixture thereof. In certain embodiments, $A^+$ is $H(C=NH_2)NH_2^+$.

In certain embodiments, each of $X^-$ and $Y^-$ is I.

In certain embodiments, the perovskite is represented by the Formula 2:

$$(H(C=NH_2)NH_2^+)(Sn^{2+})(I^-)_3 \cdot m[(Eu^{2+})(I^-)_2]$$

wherein m is about 0.010101.

The perovskite described herein can be prepared from a perovskite precursor solution comprising one or more tin salts, $EuY_2$, AZ, optionally tin powder, and a solvent, wherein the one or more tin salts is represented by the formula $SnX_2$, A is $Cs^+$, $Rb^+$, $CH_3NH_3^+$, $CH_3CH_2NH_3^+$, $H(C=NH_2)NH_2^+$, $Me(C=NH_2)NH_2^+$, or a mixture thereof, X for each instance is independently $F^-$, $Cl^-$, $Br^-$, $I^-$, or a mixture thereof, Y for each instance is independently $F^-$, $Cl^-$, $Br^-$, $I^-$, or a mixture thereof, Z is $F^-$, $Cl^-$, $Br^-$, or $I^-$, and the solvent comprises dimethyl formamide (DMF), dimethyl sulfoxide (DMSO), or a mixture thereof.

The one or more tin salts can be present in the perovskite precursor solution at a concentration from 0.5 to 1.5 M, 0.6 to 1.5 M, 0.7 to 1.5 M, 0.8 to 1.5 M, 0.9 to 1.5 M, 1.0 to 1.5 M, 1.1 to 1.5 M, 1.2 to 1.5 M, 1.3 to 1.5 M, 1.4 to 1.5 M, 0.5 to 1.4 M, 0.5 to 1.3 M, 0.5 to 1.2 M, 0.5 to 1.1 M, 0.5 to 1.0 M, 0.5 to 0.9 M, 0.5 to 0.8 M, 0.5 to 0.7 M, 0.5 to 0.6 M, 0.6 to 1.4 M, 0.7 to 1.3 M, 0.8 to 1.2 M, or 0.9 to 1.1 M. $SnI_2$ can be present in the perovskite precursor with a concentration ranging from 0.9 to 1.1 M, while $SnCl_2$ is introduced at concentrations varying from 0.09 M to 0.22 M. In certain embodiments, $SnI_2$ and $SnCl_2$ are present in the perovskite precursor solution at a concentration of about 0.9 M and about 0.093 M, respectively.

Oxidation of $Sn^{2+}$ in the perovskite precursor solution can be suppressed by the addition of one or more of Sn powder and $SnF_2$ to the perovskite precursor solution. Sn powder can be present in the perovskite precursor solution with a concentration ranging from 0.04 to 0.8 M, 0.1 to 0.8 M, 0.2 to 0.8 M, 0.3 to 0.8 M, 0.4 to 0.8 M, 0.5 to 0.8 M, 0.6 to 0.8 M, 0.7 to 0.8 M, 0.04 to 0.7 M, 0.04 to 0.6 M, 0.04 to 0.5 M, 0.04 to 0.4 M, 0.04 to 0.3 M, 0.04 to 0.2 M, 0.04 to 0.1 M, 0.2 to 0.7 M, 0.3 to 0.6 M, or 0.4 to 0.5 M. $SnF_2$ can be present with a concentration ranging from 0.09 to 0.11 M. In certain embodiments, $SnF_2$ is present in the perovskite precursor solution at a concentration of about 0.09 M.

In certain embodiments, the perovskite precursor solution further comprises ethanediamine dihydroiodide (EDADI).

The solvent can be any solvent in which the one or more salts and AZ are least partially soluble. In certain embodiments, the solvent is a polar aprotic solvent. Exemplary solvents include, but are not limited to dimethyl sulfoxide (DMSO), dimethylformamide (DMF), dimethylacetamide (DMAc), N-methyl-2-pyrrolidone (NMP), and mixtures thereof. In certain embodiments, the solvent comprises DMSO.

The perovskite described herein can be prepared by depositing the perovskite precursor solution on a substrate thereby forming an unannealed perovskite thin film and annealing the unannealed perovskite thin film thereby forming the perovskite.

The perovskite precursor solution can be deposited on the substrate using any method known to those of skill in the art including, but not limited to, spin coating, printing, print screening, spraying, painting, doctor-blading, slot-die coating, and dip coating.

The unannealed perovskite thin film can be annealed at 40-150° C., 40-125° C., 40-100° C., 50-90° C., 60-80° C., or 65-75° C. In certain embodiments, the unannealed perovskite thin film is annealed at about 70° C.

The present disclosure also provides electronic devices comprising the perovskite described herein. Referring to FIG. 29, the electronic device can comprise: a substrate layer (101); a transparent conductive layer (102) disposed on a surface of the substrate layer (101), a hole-transport layer (103) disposed on the surface of the substrate layer (102); a perovskite functional layer (104) comprising the perovskite described herein disposed on a surface of the hole-transport layer (103); an electron-transport layer (105) disposed on the surface of the perovskite functional layer (104); and a metal electrode (106) disposed on the surface of the electron-transport layer (105).

The substrate (101) can comprise a flexible or rigid material with light transmittance greater than 80% (at 550 nm). In certain embodiments, the substrate comprises: polymethyl methacrylate (PMMA), polycarbonate (PC), polystyrene, (PS), polyethylene glycol terephthalate, (PET), polyethylene naphthalate (PEN), polydimethylsiloxane (PDMS), styrene-ethylene-butylene-styrene (SEBS), ethylene terephthalateco-1,4-cylclohexylenedimethylene terephthalate (PETG), acrylonitrile butadiene styrene copolymers (ABS), polypropylene (PP), polyamide (PA) acrylonitrile-styrene copolymer (AS), or mixtures thereof.

The transparent conductive layer (102) can comprise aluminum- or indium-doped zinc oxide, magnesium-indium oxide, nickel-tungsten oxide, gallium nitride, zinc selenide, zinc sulfide, zinc oxide (ZnO), tin oxide (SnO$_2$), lithium fluoride (LiF), zinc indium tin oxide (ZITO), indium tin oxide (ITO), aluminum zinc oxide (AZO), fluorine tin oxide (FTO), graphene, poly(3,4-ethylenedioxythiophene) polystyrene sulfonate (PEDOT:PSS), silver nanowire, copper nanowire, or a mixture thereof.

The hole-transport layer (103) can comprise SAMs (self-assembled monolayer), PTAA (poly (triaryl amine), PTAA), PEDOT:PSS, NiO$_x$, Spiro-OMeTAD, or mixtures thereof.

The perovskite functional layer (104) comprises a perovskite described herein.

The electron-transport layer (105) can comprise PC$_{61}$BM, C60, SnO$_2$, or a mixture thereof.

The metal electrode can comprise any metal with resistivity less than $5 \times 10^{-7}$ Ω·m (at 25° C.). Exemplary metal electrode metals include, but are not limited to Ag, Cu, Au, Al, W, Fe, Pt, and mixtures thereof.

In another aspect, the present application provides a method for fabricating the electronic device. In certain embodiments, HTL material is spin-coated on the (102) transparent conductive layer and annealed thereby forming the hole-transport layer (103). Then, the perovskite precursor solution is spin-coated on the (103) hole-transport layer, and the (104) perovskite functional layer is formed after annealing. ETL materials and metal electrode materials are sequentially evaporated on the (104) perovskite functional layer by vacuum thermal evaporation to complete the device preparation.

For the synthesis of perovskite film samples, europium dopants (EuI$_2$) with different concentrations (0, 0.5, 1.0 and 2.0 mol %) were incorporated into FASnI$_3$ (FA=NH$_2$CH=NH$_2$$^+$) precursor solutions, following by 0.1 g/ml Sn metallic powder as a solution-oxidation resistor. FIG. 7A and FIG. 7B showed the X-ray diffraction (XRD) patterns of FASnI$_3$ perovskite films with different amounts of EuI$_2$. The (100) and (200) diffraction peaks gradually shift to lower 2θ angles with the doping concentration, indicating a lattice expansion of the Eu$^{2+}$-doped samples. These results suggested that Eu has entered into the FASnI$_3$ lattice, most likely as interstitials. Furthermore, the full width at half maximum (FWHM) in XRD patterns suggested the optimum crystallinity for the samples with 1 mol % EuI$_2$ due to the lowest FWHM value (FIG. 7C). It is worth noting that lattice structure in tin-based perovskites generally exhibits strain and disorder, owing to the rapid crystallization process as well as the hydrogen bonding induced octahedral tilting and local asymmetry. To investigate the effect of Eu$^{2+}$ on the lattice strain of FASnI$_3$ perovskites, the lattice micro-strain (ε) was calculated by the Williamson-Hall plot from XRD patterns (FIG. 7D). We discovered that the optimum incorporation of Eu$^{2+}$ caused the decrease of ε value and thereby the relief of lattice strain. This is attributed to the interaction between Eu$^{2+}$ and FA$^+$ that can counteract the hydrogen bonding attraction between FA$^+$ and the octahedra, evidenced by the DFT calculations in FIG. 7E.

The ultraviolet-visible (UV-vis) absorption and steady-state photoluminescence (PL) spectra of the perovskite films were further used to check the optimum concentration of Eu$^{2+}$ (FIG. 8). The band gaps (E$_g$) derived from the Tauc plots in FIG. 8B were calculated to be 1.380 eV (control), 1.381 eV (0.5 mol %), 1.386 eV (1.0 mol %) and 1.387 eV (2.0 mol %), respectively, indicating a gradual blue shift of bandgap with the increasing concentration of EuI$_2$ dopants, which is consistent with the results from XRD analysis. Similarly, the steady-state PL peak consistently blue-shifts to a shorter wavelength, with the maximum intensity observed when the Eu$^{2+}$ concentration was 1 mol % (FIG. 8C). Such significant increase in PL intensity is ascribed to the reduced micro-strain and in-gap traps in the EuI$_2$ doped perovskite film, contributing consequently to the reduced nonradiative recombination. Based on all above results, we consider 1 mol % as the optimal doping concentration, which is adopted in the following studies.

As noted above, metallic Sn powders are added in Sn perovskite precursor solutions due to a synergistic effect originated from Sn$^0$ and Eu$^{2+}$. As confirmed in the literature, Sn powders can reduce a high concentration of Sn$^{4+}$ in the Sn perovskite precursor solution. The addition of an optimal amount of EuI$_2$ (1 mol %) is expected to further reduce Sn$^{4+}$ and inhibit the formation of neutral iodine (I$^0$). To confirm this, we focused on the comparison among three samples (control: without the addition of Sn powder or EuI$_2$; Sn$^0$-incorporated: with the addition of Sn powder but not EuI$_2$; Sn$^0$—Eu$^{2+}$ incorporated: with the addition of both Sn powder and EuI$_2$). FIGS. 1A-C showed depth-dependent grazing incidence X-ray diffraction (GIXRD) patterns, which reveal the perovskite structure from the top surface to the bulk regions within the perovskite films. The overall diffraction peak intensity of the control or Sn$^0$-incorporated sample is much lower than that of the Sn$^0$—Eu$^{2+}$ incorporated sample. In addition, there is no notable alteration in the lattice constant of control and Sn$^0$-incorporated samples as the glancing angle increases (See the inset of FIGS. 1A-B). Whereas the diffraction peak assigned to (100) plane gradually shifted to lower angle upon the additional introduction of 1 mol % $EuI_2$, demonstrating the $Eu^{2+}$ into the perovskite lattice (FIG. 1C). More importantly, there is a notable improvement in crystallization observed in the near-surface region of the $Sn^0$—$Eu^{2+}$ incorporated sample. We suggest that, in addition to $Eu^{2+}$ ions incorporated into the lattice, a small fraction of $Eu^{2+}$ are distributed at the grain-boundary of perovskite films, possibly serving as surface passivation with the effect on surface morphology.

The scanning electron microscope (SEM) was employed to depict the surface morphology of different thin films (FIGS. 1D-F). The control film displayed a relatively rough morphology with noticeable pinholes and grain boundaries. The $Sn^0$-incorporated film exhibited relatively dense grain distribution, which may be attributed to the antioxidative properties of Sn powder, suppressing the formation of Sn vacancy defects. In contrast, the $Sn^0$—$Eu^{2+}$ incorporated film exhibited a compact, uniform, and pinhole-free morphology. Based on statistical measurement results in FIG. 1G-I, the average grain sizes for the three samples are 420 nm (control), 410 nm ($Sn^0$ incorporated), and 825 nm ($Sn^0$—$Eu^{2+}$ incorporated), respectively. The significantly improved morphology and increased grain size observed in the $Sn^0$—$Eu^{2+}$ incorporated film can be ascribed to the modification of the surface energy during crystal growth through the introduction of $Eu^{2+}$ ions, thereby promoting a more oriented crystal growth process, resulting in larger grain sizes and enhanced crystalline quality.

The improved morphology of thin films contributes to shielding perovskite materials from degradation caused by humidity in air. We thus exposed the prepared thin film samples to air for 10 hours (FIG. 9). A significantly faster lattice degradation was observed in the control samples. By incorporating $Sn^0$ and $EuI_2$, we could enhance the maintenance of lattice and effectively prevent lattice collapse. It is worth noting that the simultaneous doping of $Sn^0$ and $Eu^{2+}$ can further enhance the anti-degradation ability of the films. Furthermore, three samples of perovskite solutions were subjected to a two-month aging experiment in air to evaluate the influence of $Eu^{2+}$ in the solution (FIG. 10). In comparison with the $Sn^0$ and $Sn^0$—$Eu^{2+}$ incorporated solutions, the control one exhibited a darker color and thereby a fibrous morphology in resulting films, suggesting a high concentration of $Sn^{4+}$ in the solution, evidenced further by the XRD analysis in FIG. 10B. Adding $Sn^0$ powder alone could not effectively suppress the $Sn^{2+}$ oxidation due to the obvious deterioration after two months of solution aging. Whereas high-quality perovskite films with well-preserved crystal structures were successfully obtained with the subsequent addition of $EuI_2$.

Given that $Eu^{2+}$ (109 pm) or $Eu^{3+}$ (95 pm) ions have larger radii than $Sn^{2+}$ (93 pm) but smaller than $FA^+$ (253 pm), it's likely that the lattice expansion resulted from $Eu^{2+}$ ions occupying either the Sn sites or interstitial positions in the $FASnI_3$ lattice (FIG. 11 and FIG. 25). FIG. 2A depicted the $FASnI_3$ perovskite crystal structure and the corresponding formation energies (FE) of $Eu^{2+}$ insertion in the FA-site (with values of −2.3165 eV), Sn-site (−3.2959 eV), and interstitial site (−6.735 eV). The lowest FE was observed when $Eu^{2+}$ was inserted at the interstitial site, indicating its predominant occupancy there. The electron localization function (ELF) analysis in FIG. 2B confirmed the transfer of electrons from Eu to I atoms, potentially impeding the formation of iodide vacancies ($V_I$), which are known as significant defects in Sn-based perovskites. Upon introducing $Eu^{2+}$, the FE of $V_I$ defects increased from 3.582 eV to 4.4983 eV, resulting in an increased energy barrier for $I^-$ ion migration, as depicted in FIG. 2C. The charge density distribution of $Eu^{2+}$ in FIG. 7E revealed that $Eu^{2+}$ could stabilize thermally unstable organic components, enhancing structural robustness and lattice stability when doping $Eu^{2+}$ in interstitial positions. Moreover, we analyzed the charge transfer around europium and tin through Bader charge distributions, and found that europium showed greater electron loss and easier oxidation compared to tin (FIG. 2D, detailed parameters in FIG. 26).

The redox properties of $Sn^0$ and $Eu^{2+}$ can be assessed through solvent-dependent standard reduction potential ($E^0$) in either alkali or acidic environments. When dissolved in the neutral solvent of dimethyl sulfoxide (DMSO), $FASnI_3$ perovskite exhibits acidic behavior (see FIG. 12), which promotes the stabilization of $Sn^{2+}$. In FIG. 2E, we outlined four potential reactions in the acidic precursor and compared their $E^0$ values in FIG. 2F (calculated from FIG. 27). As shown in FIG. 2F, reaction 3 possesses the highest $E^0$ value, signifying that $Eu^{2+}$ primarily serves as a reducing agent for $1^0$. It's worth nothing that $Eu^{2+}$ exhibits a stronger reducing capability than that of Sn powders, demonstrating its effectiveness in reducing $Sn^{4+}$. Gibbs free energy change ($\Delta G^0 = nFE^0$, where n represents the number of electrons transferred in the reaction, and F is the Faraday's constant) serves as a criterion for assessing the thermodynamic favorability of reactions. Due to their negative $\Delta G^0$ values, reactions 1, 2, and 3 occur spontaneously while reaction 4 is determined to be thermodynamically unfavorable. As a result, $Eu^{2+}$, as an electron donor, can create a reducing environment to suppress the formation of $V_{Sn}$ and $V_I$.

To assess the oxidation resistance of $Eu^{2+}$, we prepared perovskite films using aged precursors incorporated with $Sn^0$ and $Sn^0$—$Eu^{2+}$, followed by X-ray photoelectron spectroscopy (XPS) measurements. $Sn^{2+}$ tends to be more stable in $EuI_2$-doped precursors, as evidenced by the lower content of $Sn^{4+}$ in FIG. 13A. Previous reports have indicated that $I^0$ is a byproduct of hydrolysis of hydroiodic acid and a degradation product of $SnI_4$. The $Sn^0$—$Eu^{2+}$ incorporated film showed less $I^0$ than that the $Sn^0$-incorporated sample (FIG. 13B), demonstrating $Eu^{2+}$ could simultaneously act as a reducing agent for $I^0$. In FIG. 2G, $Eu^{3+}$ peaks were observed at 1164.9 eV and 1135.2 eV, respectively, while $Eu^{2+}$ peaks were detected at 1155.1 eV and 1125.3 eV, respectively. The generation of $Eu^{3+}$ is more likely to be attributed to redox reactions between $Eu^{2+}$, $Sn^{4+}$ and $I^0$, as its negative $\Delta G^0$ value.

We conducted energy-dispersive X-ray spectroscopy (EDS) mapping on the $Sn^0$—$Eu^{2+}$ incorporated sample (FIG. 14) to analyze the Eu distribution. The maps showed a uniform surface distribution of Eu, constituting 0.63% of the atomic mass. FIG. 3A displayed the XPS full spectra for two fresh samples, with a magnified view of the Eu peaks in FIG. 3B. Simultaneously emerging small peaks represented $Eu^{2+}$ and $Eu^{3+}$, which could be attributed to continuous redox reactions with $Sn^{4+}$ and $I^0$ defects. This is also supported by the shifts in the $E_B$ peaks for I (0.40 eV) and Sn (0.43 eV) towards lower values after $Eu^{2+}$ doping, as shown in FIGS. 3C and 3D. Such shift can be attributed to the reduction of Sn and I's oxidation state, which is likely a result of electron donation from $Eu^{2+}$ through a reduction process. The depth-dependent XPS measurements were further performed to evaluate the oxidation process inside the perovskite layer by sputtering the samples with argon ions ($Ar^+$) to different depths (0, 40, 80, and 120 nm). $Eu^{2+}$ exhibited gradient doping, with signal intensity decreasing as sputtering depth increased (FIG. 15). FIG. 3E-F reveals that the $Sn^{4+}$ content at the surface of the $Sn^0$—$Eu^{2+}$ incorporated sample was merely 3.7%, significantly lower than 12.33% in the $Sn^0$-incorporated sample. This disparity persisted as the sputtering depth increased, that a lower $Sn^{4+}$ content was observed for $Sn^0$—$Eu^{2+}$ incorporated sample (FIG. 16). Additionally, we noted shifts toward higher values in the $E_B$ peaks of Sn and I in both samples as the sputtering depth increased (FIG. 17). Specifically, the XPS peaks for Sn 3d and I 3d shifted by 0.08 eV and 0.05 eV for the $Sn^0$-incorporated sample, and by 0.15 eV and 0.16 eV for the $Sn^0$—$Eu^{2+}$ incorporated sample, respectively. We speculated the introduction of $Eu^{2+}$ into the perovskite lattice engendered alterations in the chemical environment of the $[SnI_6]^{4-}$ octahedron, resulting in marked shifts in the XPS peaks upon $EuI_2$ doping.

The $Sn^0$—$Eu^{2+}$ incorporated film exhibited higher PL intensity compared to those of other samples (FIG. 3H). This may be due to the fact that $EuI_2$ enhanced the crystallization of perovskites, effectively passivating surface defects. The $Sn^0$—$Eu^{2+}$ incorporated film underwent a blue shift to shorter wavelengths, likely due to $Sn^{4+}$ removal and reduced lattice structural disorder. Besides, the time-resolved PL (TRPL) spectra showed a prolonged PL lifetime of 14.07 ns for the $Sn^0$—$Eu^{2+}$ incorporated film, which is longer than that of $Sn^0$-incorporated film (7.09 ns, FIG. 18A). Upon the deposition of an electron transport layer, a significant PL quenching was observed (FIG. 18A and FIG. 28), indicating that the incorporation of $Eu^{2+}$ ions could facilitate charge transfer at the interface. In general, there are various electrostatic potentials for electrons at different positions along the octahedral framework of perovskites. Due to the insulating properties of organic molecules, electron movement is limited to the octahedral framework. In the presence of ammonium ions, the movement of electrons through an iodine framework will alter their electrostatic potential due to steric hindrance. Theoretical calculations in present work demonstrated that the electrostatic potential of the electron in regions a, b, and c varied to different degrees upon $EuI_2$ doping (FIG. 4A-B). We combined the calculated Fermi levels ($E_F$) of the $Sn^0$—$Eu^{2+}$ incorporated sample ($E_F=$ −4.3441 eV) with the control ($E_F=$−3.5075 eV) to determine the energy barrier of electron transport. The $Sn^0$—$Eu^{2+}$ doping process notably reduced the energy barrier of electrons passing through regions a (−7.31 eV), b (0.51 eV), and c (−5.95 eV) by modifying the spatial arrangement of the Sn—I framework, prolonging carrier lifespan, and facilitating charge collection (FIG. 4C). Furthermore, ultraviolet photoelectron spectroscopy (UPS) spectra (FIG. 19) was used to assess the electronic properties of $FASnI_3$ perovskite films. Combining with the bandgap calculated from the Tauc plots (FIG. 3G), we constructed an energy-level diagram of the devices (FIG. 5A). In comparison to the control sample (−4.82 eV) and $Sn^0$-incorporated sample (−5.11 eV), the valence band minimum (VBM) for $Sn^0$—$Eu^{2+}$ incorporated perovskite was −5.05 eV, which is closer to the VBM for PEDOT:PSS (−5.05 eV) and contributes to reducing the energy loss during the charge transfer. It should be noted that the position of the $E_F$ for $Sn^0$—$Eu^{2+}$ incorporated sample was about 1.00 eV away from VBM, while those of the control and $Sn^0$-incorporated devices were about 0.25 and 0.89 eV away from VBM. The upward moving $E_F$ indicated that the p-type doping resulted from severe oxidation, could be suppressed after $Eu^{2+}$ doping.

We fabricated inverted planar p-i-n PSCs and measured their current density-voltage (J-V) curves (FIG. 5B). The control device achieved the best PCE of 10.09%, along with a $J_{SC}$ of 21.97 mA/cm², $V_{OC}$ of 0.62 V and FF of 74.10%. After the incorporation of $Sn^0$, the PCE increased to 10.69% with the $J_{SC}$ of 22.43 mA/cm², $V_{OC}$ of 0.64 V and FF of 65.98%. In contrast, the $Sn^0$—$Eu^{2+}$ incorporated device achieved the highest efficiency of 13.66%, along with a $J_{SC}$ of 24.21 mA/cm², $V_{OC}$ of 0.72 V and FF of 78.34%. The detailed photovoltaic parameters were shown in Table 1. More importantly, there was minimal J-V hysteresis for the $Sn^0$—$Eu^{2+}$ incorporated device (FIG. 5C). The maximum PCE output of the $Sn^0$—$Eu^{2+}$ incorporated device was measured at a bias of 0.62 V under 100 mW cm⁻² AM 1.5G irradiation, and retained a steady efficiency output of around 13.5% without damping. FIG. 5D and FIG. 20 showed the corresponding box charts for the photovoltaic parameters and hysteresis index (HI). The improvement in PCE was mainly attributed to the faster charge transfer and reduction of defects, leading to increased $J_{SC}$ and $V_{OC}$. The external quantum efficiency (EQE) measurements for the control and $Sn^0$—$Eu^{2+}$ incorporated device yielded integrated $J_{SC}$ values of 21.64 mA cm⁻² and 24.16 mA cm⁻², respectively, which are well matched with the $J_{SC}$ from J-V results. The increased $J_{SC}$ of the $Sn^0$—$Eu^{2+}$ incorporated device could be attributed to the higher absorption at the range of 530-840 nm (FIG. 21) and the increased thickness of perovskite film (FIG. 22). The substantial increase in film thickness is intricately linked to the growth of larger crystalline grains within the $Sn^0$—$Eu^{2+}$-incorporated film. It should be noted that the $Sn^0$—$Eu^{2+}$ incorporated sample displayed less J-V hysteresis compared to the other two samples, potentially resulting from the inhibition of I⁻ migration by $Eu^{2+}$-doping under AM 1.5G illumination. The suppression of hysteresis may be due to multiple factors: 1) $Eu^{2+}$ accumulated at the interstitial sites in the perovskite structure, potentially impeding the I⁻ diffusion; 2) $Eu^{2+}$ can interact with the organic cations to stabilize the perovskite lattice; 3) the distribution of $Eu^{2+}$—$Eu^{3+}$ from surface to the bulk was beneficial to passivate the surface and bulk defects.

Long-term stability is one of the crucial performance indicators for assessing device performance. The $Sn^0$—$Eu^{2+}$ incorporated devices stored in nitrogen atmosphere exhibited favorable stability over 500 h (FIG. 23A). During extended exposure to air and AM 1.5G light soaking (FIG. 23B), the $Sn^0$—$Eu^{2+}$ incorporated device demonstrated an impressive 80% retention of its initial efficiency, possibly attributable to its excellent photostability achieved through effective defect suppression and reduced ion migration pathways. To elucidate the impact of ion migration on the photostability of perovskite films, we conducted PL measurements with varying illumination durations (FIG. 5E). Using 490 nm exciting light, we monitored the fluorescence signal and noted a substantial red-shift in the peak of the $Sn^0$-incorporated perovskite film, shifting from 880.25 nm to 890.51 nm (10.26 nm difference) as the illumination duration (FIG. 5F). In contrast, the $Sn^0$—$Eu^{2+}$ incorporated film exhibited a smaller shift from 883.41 nm to 891.21 nm (7.80 nm offset) (FIG. 5G). We proposed that the reaction between $Eu^{2+}$ and $I^0$, coupled with the relief of lattice strain, suppressing the iodide migration and consequently improving the photovoltaic stability of the devices. Since hysteresis is a known consequence of ion migration under illumination, we monitored the J-V curves of the three samples under varying illumination durations (FIG. 24). The hysteresis for devices without $EuI_2$ was severe (from 4.3% to 13.8% for the control devices and from 1.6% to 6.9% for the $Sn^0$-incorporated devices, respectively) due to significant ion migration. The $Sn^0$—$Eu^{2+}$ incorporated sample exhibited only a slight variation in HI, from 1.1% to 1.3%, indicating the effective suppression of ion migration by the $Eu^{2+}$ incorporation.

In order to assess the recombination of charge carriers in the devices, we plotted dark current to compare the shunt resistance (FIG. 6A). The $Sn^0$—$Eu^{2+}$ incorporated device showed lower dark current ($J_0$) compared to the other samples, indicating the suppressed charge carrier recombination. Furthermore, we performed electrochemical impedance measurements (EIS) to evaluate their charge transfer (FIG. 6B). The Nyquist plots of these devices exhibited a single semicircle, which is related to the resistance values of charge recombination ($R_{rec}$). The device with $Sn^0$—$Eu^{2+}$ incorporation showed the largest $R_{rec}$, indicating suppression of Sn—I trap states. To determine the trap density, we conducted space-charge limited current measurements using a device construction of ITO/PEDOT:PSS/Perovskite/PTAA/Au (FIG. 6D-F). The trap-state density ($N_t$) was calculated using the following relation: $V_{TFL}=qN_tL^2/2\varepsilon\varepsilon_0$, where $\varepsilon$ is the relative dielectric constant, $\varepsilon_0$ is the vacuum permittivity, $V_{TFL}$ is the onset voltage of trap-filled limit region, q is the elementary charge, and L is the thickness of the perovskite films. The cross-section SEM image was shown in FIG. 6C. As shown in FIG. 22, the thickness of the perovskite films under three different conditions is approximately 200, 220, and 250 nm, respectively. The $V_{TFL}$ values of the control, $Sn^0$-incorporated and $Sn^0$—$Eu^{2+}$ incorporated devices were deduced to be 1.85 V, 0.36 V, and 0.3 V. The corresponding $N_t$ are calculated to be $2.42\times10^{16}$ $cm^{-3}$, $4.70\times10^{15}$ $cm^{-3}$ and $3.92\times10^{15}$ $cm^{-3}$, respectively, exhibiting a significant drop of the trap density upon $EuI_2$ doping.

Experimental

Materials

All chemicals were employed directly without further treatment after purchase. FAI (99.999%), $SnI_2$ (99.999%), $SnF_2$ (99%), EDADI (99.9%), $SnCl_2$ (99.999%), $EuI_2$ (99.999%), fullerene-C60 sublimed (99.9%) and bathocuproine (BCP, 99%) were purchased from Sigma Aldrich, Poly(3,4-ethylenedioxythiophene):poly (styrene sulfonate) (PEDOT:PSS, Clevios VP AI 4083) was received from Heraeu. Ultradry dimethyl sulfoxide (DMSO) and ultradry chlorobenzene (CB) were purchased from Sigma Aldrich.

Device Fabrication

The perovskite precursor solution was prepared by dissolving 336.3 mg $SnI_2$, 14.1 mg $SnF_2$, 154.77 mg FAI, 2.75 mg EDADI, 0.1 g/ml Sn powder, 17.64 mg $SnCl_2$, 4.79 mg $EuI_2$ in 1 ml DMSO solution and stirring the solution for 2 h at room temperature. ITO glass substrates were cleaned by detergent, DI water, acetone, and isopropanol for 15 min via sonication treatment, respectively. Then, the substrates were treated with ultraviolet-ozone for 20 min before spin-coating PEDOT:PSS. The precursor solution was filtered through 0.25 μm PTFE filter and spin-coated on the PEDOT:PSS layer at 1000 rpm for 10 s, and 5000 rpm for 50 s in the glove box. 150 μL of chlorobenzene was in-situ dripped onto the perovskite film after 40 s during the second step. Afterward, the perovskite films were annealed at 70° C. for 20 min. Finally, 100 nm $C_{60}$, 15 nm BCP and 200 nm Ag electrode were sequentially evaporated on top of the perovskite under high vacuum.

TABLE 1

| Photovoltaic parameters of control, $Sn^0$— and $Sn^0$—$Eu^{2+}$ incorporated devices under AM 1.5 G one sun irradiation (100 mW $cm^{-2}$) | | | | | | |
| --- | --- | --- | --- | --- | --- | --- |
| | Scan mode | $V_{OC}$ [V] | $J_{SC}$ [mA $cm^{-2}$] | FF [%] | PCE [%] | HI |
| Control | FS | 0.62 | 21.97 | 74.10 | 10.09 | 0.068 |
| | RS | 0.64 | 22.08 | 66.83 | 9.45 | |
| $Sn^0$ | FS | 0.66 | 22.43 | 69.32 | 10.27 | 0.039 |
| | RS | 0.66 | 22.62 | 71.56 | 10.69 | |
| $Sn^0$—$Eu^{2+}$ | FS | 0.72 | 24.20 | 77.54 | 13.51 | 0.011 |
| | RS | 0.72 | 24.21 | 78.34 | 13.66 | |

Note: The PCEs reported in the table are the champion efficiency. FS refers to forward scanning and RS refers to reverse scanning.

CONCLUSION

Through the experimental and DFT coupled investigations, we have demonstrated that the doping of $Eu^{2+}$ ions into the $FASnI_3$ perovskite lattice with an optimal amount can relax the lattice strain, modify the film morphology, suppress non-radiative recombination. More importantly, $Eu^{2+}$ doping largely removes the Sn—I defect pairs resulted from the $Sn^{2+}$ oxidation, which is attributed to the thermodynamically favorable redox reactions between $Eu^{2+}$, $Sn^{4+}$, and $I^0$ in the acidic precursor conditions. As a result, the $Eu^{2+}$-doped Sn PSC device can achieve a high efficiency of 13.66% with increased light and air stabilities. Our work provides a promising approach to mitigate the challenging issues of Sn—I defects for high-performance Sn perovskite photovoltaic devices.

Characterization

XRD results were collected on X-ray diffractometer (Rigaku Smart Lab, Japan) with a Cu Ka radiation (the wavelength 1=1.54050 Å). SEM characterizations and XPS spectra were measured by Hitachi Regulus 8100. The NMR was measured on a Bruker AVANCEIII 600 MHZ. The UV-vis absorption measurement was measured at a SHIMADZU UV-vis-NIR spectrometer (UV-1800). Steady-state and time-resolved photoluminescence spectra were measured using Zolix OminiLuo-900 fluorescence spectrophotometer with an excitation wavelength 490 nm. The J-V curves were measured using a Keithley 2450 source meter under irradiation under 100 $mW/cm^2$ simulated irradiation from a solar simulator (Saifan 7-IV). EQE measurement was carried out using Zolix OminiLuo-900 fluorescence spectrophotometer. EIS plots were measured on a Zahner electrochemical workstation.

Computational Methods

All first-principles calculations on bulk systems were performed using DFT in the plane-wave/pseudopotential approach implemented in the Vienna Ab-initio Simulation Package. Exchange-correlation is described the revised Perdew-Burke-Ernzerhof generalized gradient approximation (PBEsol) including dispersion corrections to the total energies via Grimme's DFT-D3 scheme. Within the density functional theory, the first-principle calculations were performed with the Vienna ab initio simulation package (VASP) utilizing the generalized gradient approximation (GGA) in the Perdew-Burke-Ernzerh designed specifically for solids (PBEsol) exchange-correlation functionals. The crystal structures were optimized plane-wave cutoff energy of 600 eV and a Γ-centered 3×4×4 k-point mesh. All geometry structures were fully relaxed until the residual forces on each atom is less than 0.01 eV $Å^{-1}$. The electronic density of states and difference charge density were calculated using a denser Γ-centered 12×16×16 k-point mesh. Some data post processing in VASP calculations were dealt with the VASP-KIT code. Thus, the Sn vacancy formation energy can be obtained by:

$$E_v = E_{tot}(V) - E_{tot}(\text{ideal}) + \mu \qquad 20$$

where $E_v$ is the I vacancy formation energy, $E_{tot}(V)$ and $E_{tot}(\text{ideal})$ are the total energy of defective and ideal supercell, respectively, and the $\mu$ is the I chemical potential.

What is claimed is:

1. A perovskite comprising $Sn^{2+}$ and $Eu^{2+}$, wherein the perovskite has Formula 1:

$$(A^+)(Sn^{2+})(X^-)_3 \cdot m[(Eu^{2+})(Y^-)_2] \qquad 1$$

wherein m is 0.005-0.05;

$X^-$ for each instance is independently $F^-$, $Cl^-$, $Br^-$, or $I^-$;

$Y^-$ for each instance is independently $F^-$, $Cl^-$, $Br^-$, or $I^-$; and $A^+$ is $Cs^+$, $Rb^+$, $CH_3NH_3^+$, $CH_3CH_2NH_3^+$, $H(C=NH_2)NH_2^+$, $Me(C=NH_2)NH_2^+$, or a mixture thereof.

2. The perovskite of claim 1, wherein $A^+$ is $H(C=NH_2)NH_2^+$.

3. The perovskite of claim 1, wherein m is 0.005-0.02.

4. The perovskite of claim 1, wherein $A^+$ is $H(C=NH_2)NH_2^+$ and m is about 0.01.

5. The perovskite of claim 4, wherein each of $X^-$ and $Y^-$ is $I^-$.

6. The perovskite of claim 1, wherein the perovskite has Formula 2:

$$(H(C=NH_2)NH_{2+})(Sn^{2+})(I^-)_3 \cdot m[(Eu^{2+})(I^-)_2] \qquad 2$$

wherein m is about 0.010101.

7. An electronic device comprising:

a substrate layer;

a transparent conductive layer disposed on a surface of the substrate layer, a hole-transport layer disposed on the surface of the transparent conductive layer;

a perovskite layer comprising the perovskite of claim 1 disposed on a surface of the hole-transport layer;

an electron-transport layer disposed on the surface of the perovskite functional layer; and a metal electrode disposed on the surface of the electron-transport layer.

8. The electronic device of claim 7, wherein the electronic device has a power conversion efficiency (PCE) of 12-13.66%.

9. The electronic device of claim 7, wherein the perovskite has Formula 2:

$$(H(C=NH_2)NH_2^+)(Sn^{2+})(I^-)_3 \cdot m[(Eu^{2+})_2] \qquad 2$$

wherein m is about 0.010101 and the electronic device is more stable than an electronic device comprising a perovskite of Formula 3:

$$(H(C=NH_2)NH_2^+)(Sn^{2+})(I^-)_3 \qquad 3.$$

10. A perovskite precursor solution for preparing a perovskite of Formula 1:

$$(A^+)(Sn^{2+})(X^-)_3 \cdot m[(Eu^{2+})(Y^-)_2] \qquad 1$$

comprising one or more tin salts, $EuY_2$, AZ, optionally tin powder, and a solvent, wherein the one or more tin salts is represented by the formula $SnX_2$, A is $Cs^+$, $Rb^+$, $CH_3NH_3^+$, $CH_3CH_2NH_3^+$, $H(C=NH_2)NH_2^+$, Me (C=NH2) NH2", or a mixture thereof, X for each instance is independently $F^-$, $Cl-^-$, $Br^-$, $I^-$, or a mixture thereof, Y for each instance is independently $F^-$, $Cl^-$, $Br^-$, $I^-$, or a mixture thereof, Z is $F^-$, $Cl^-$, $Br^-$, or $I^-$, and the solvent comprises dimethyl formamide (DMF), dimethyl sulfoxide (DMSO), or a mixture thereof, wherein m is 0.005-0.05.

11. The perovskite precursor solution of claim 10, wherein the one or more tin salts comprises $SnF_2$, $SnCl_2$, and $SnI_2$.

12. The perovskite precursor solution of claim 10, wherein AZ is $H(C=NH_2)NH_2I$.

13. The perovskite precursor solution of claim 10, wherein Y is $I^-$.

14. The perovskite precursor solution of claim 10 further comprising ethanediamine dihydroiodide.

15. The perovskite precursor solution of claim 10, wherein the perovskite precursor solution comprises tin powder, $SnF_2$, $SnCl_2$, $SnI_2$, $EuI_2$, $H(C=NH_2)NH_2I$, and DMSO.

* * * * *